(12) United States Patent
Takahashi et al.

(10) Patent No.: US 6,693,310 B1
(45) Date of Patent: Feb. 17, 2004

(54) SEMICONDUCTOR DEVICE AND MANUFACTURING METHOD THEREOF

(75) Inventors: Tetsuo Takahashi, Hyogo (JP); Katsumi Nakamura, Hyogo (JP); Tadaharu Minato, Hyogo (JP); Masana Harada, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/862,620

(22) Filed: May 23, 2001

Related U.S. Application Data

(62) Division of application No. 09/222,795, filed on Dec. 30, 1998, now Pat. No. 6,265,753, which is a division of application No. 08/683,279, filed on Jul. 18, 1996, now Pat. No. 5,977,570.

(30) Foreign Application Priority Data

| Jul. 19, 1995 | (JP) | 7-183102 |
| Sep. 14, 1995 | (JP) | 7-237002 |
| Oct. 27, 1995 | (JP) | 7-280961 |

(51) Int. Cl.$^7$ .............................................. H01L 29/76
(52) U.S. Cl. .................. 257/136; 257/138; 257/135; 257/139
(58) Field of Search ................... 257/136, 138, 257/135, 139

(56) References Cited

U.S. PATENT DOCUMENTS

| 4,994,883 A | 2/1991 | Chang et al. |
| 5,360,746 A | 11/1994 | Terashima |
| 5,689,121 A | 11/1997 | Kitagawa et al. |
| 5,747,856 A | 5/1998 | Chen et al. |
| 5,866,931 A | 2/1999 | Buluccea et al. |

FOREIGN PATENT DOCUMENTS

| DE | 41 30889 A1 | 9/1991 |
| EP | 0 050 988 A2 | 10/1981 |
| EP | 0 527 600 A | 2/1993 |
| EP | 0 565 349 A2 | 4/1993 |
| EP | 0565349 A2 | 10/1993 |
| JP | 3-196570 | 8/1991 |
| JP | 5-13769 | 1/1993 |
| JP | 05013769 | 1/1993 |
| JP | 5-243561 | 9/1993 |
| JP | 6-12559 | 1/1994 |
| JP | 6-13621 | 1/1994 |
| JP | 7-1347 | 1/1995 |

OTHER PUBLICATIONS

"MOS Controlled Diodes—A New Power Diode", Huang et al., Solid State Electronics, .Elsevier Science Publishers, Barking, GB, vol. 38, No. 5, May 1, 1995, pp. 977–980, XP000500477.

(List continued on next page.)

Primary Examiner—Stephen D. Meier
(74) Attorney, Agent, or Firm—McDermott, Will & Emery

(57) ABSTRACT

A pin diode is formed by a $p^+$ collector region, an n type buffer region, an $n^-$ region and an $n^+$ cathode region. A trench is formed from the surface of $n^+$ cathode region through $n^+$ cathode region to reach $n^-$ region. An insulating film is formed along an inner wall surface of trench. A gate electrode layer is formed to oppose to the sidewall of $n^+$ cathode region with insulating film interposed. A cathode electrode is formed to be electrically connected to $n^+$ cathode region. An anode electrode is formed to be electrically connected to $p^+$ collector region. The $n^+$ cathode region is formed entirely over the surface between trenches extending parallel to each other. Thus, a power semiconductor device in which gate control circuit is simplified and which has good on property can be obtained.

4 Claims, 83 Drawing Sheets

OTHER PUBLICATIONS

"4500 V IEGTs Having Switching Characteristics Superior to GTO", by Kitagawa, et al., Proceedings of 1995 International Symposium of Power Devices & ICs, May 23–25, 1995, pp. 486–491.

Jun–ichi Nishizawa et al. "The MOS SIT and its Integration", Denshi Tokyo No. 27 (1988), pp. 83–87.

Patent Abstracts of Japan, vol. 17, No. 276 (E–1372), May 27, 1993.

Mitsuhiko Kitagawa et al. A 4500 V Injection Enhanced Insulated Gate Bipolar Transistor (IEGT) Operating in a Mode Similar to a Thyristor, IEDM 93, pp. 679–682.

M. Harada et al. "600 V Trench IGBT in Comparison with Planar IGBT", Proc. of the 6th International Symposium on Power Semiconductor Devices & IC's Davos. Switzerland, May 31–Jun. 2, 1994, pp, 411–416.

SEMICONDUCTOR DEVICE AND MANUFACTURING METHOD THEREOF

This application is a divisional of application Ser. No. 09/222,795, now U.S. Pat. No. 6,265,753 filed Dec. 30, 1998, which is a Divisional Application of Ser. No. 08/683,279, filed Jul. 18, 1996, (now U.S. Pat. No. 5,977,570, issued Nov. 2, 1999).

BACKGROUND OF THE INVENTION

1. Field of the Invention

The present invention relates to a vertical power semiconductor device having self turn-off function and to a manufacturing method thereof.

2. Description of the Background Art

First, a conventional semiconductor device will be described.

FIG. 96 is a cross sectional view schematically showing a structure of a semiconductor device in accordance with a first prior art example. Referring to FIG. 96, the first prior art example has an SITh (Static Induction Thyristor). The SITh includes a pin diode porion, a p type gate region 307, a gate electrode layer 309, a cathode electrode 311 and an anode electrode 313.

A pin diode portion has a stacked structure including a p+, anode region 301, an n− region 303 and a cathode region (n+ emitter region) 305. The p type gate region 307 is formed in n− region 303. Gate electrode 309 is electrically connected to p type gate region 307. Cathode electrode 311 is electrically connected to cathode region 305, and anode electrode 313 is electrically connected to p+ anode region 301, respectively.

The SITh can realize on-state by setting gate voltage applied to gate electrode 309 positive. At this time, current flows through pin diode from p+ anode region 301 to the side of cathode region 305.

FIG. 97 is a cross sectional view schematically showing a structure of a semiconductor device in accordance with a second prior art example. Referring to FIG. 97, the second prior art example shows a GTO (Gate Turn-Off) thyristor. The GTO thyristor has a p+ anode region 351, an n− region 353, a p base region 355, a cathode region 357, a gate electrode 359, a cathode electrode 361 and an anode electrode 363.

The p+ anode region 351, n− region 353, p base region 355 and cathode region 357 are stacked successively. The p type base region 355 is electrically connected to gate electrode 359. Cathode electrode 361 is electrically connected to cathode region 357, and anode electrode 363 is electrically connected to p+ anode region 351, respectively.

In this GTO thyristor also, on-state can be realized by setting the gate voltage positive. By setting gate voltage positive, current flows through a pnpn diode from p+ corrector region 351 to the side of cathode region 357.

Both in the first and second prior art examples, off-state can be realized by applying a negative voltage to the gate electrode. When a negative voltage is applied to gate electrode 309 or 359, minority carriers (holes) remaining in the device are extracted from gate electrode 309 or 359. Thus, the main current is cut off.

FIG. 98 is a cross sectional view schematically showing a structure of a semiconductor device in accordance with a third prior art example. Referring to FIG. 98, the third prior art example shows an example of a trench IGBT (Insulated Gate Bipolar Transistor). The trench IGBT includes a p+ collector region 101, n+ buffer region 103, n− region 105, p type base region 107, n+ emitter region 109, a p+ contact region 111, a gate oxide film 115, a gate electrode layer 117, a cathode electrode (emitter) 121 and an anode electrode (collector) 123. On p+ collector region 101, n− region 105 is formed with n+ buffer region 103 interposed. On n− region 105, n+ emitter region 109 and p+ contact region 111 are formed adjacent to each other with p type base region 107 interposed. On the surface where n+ emitter region 109 is formed, there is provided a trench 413.

Trench 413 passes through n+ emitter region 109 and p type base region 107 and reaches n− region 105. The depth $T_p$ of trench 413 from the surface is 3 to 5 $\mu$m.

Along inner wall surface of trench 413, gate oxide film 115 is formed. Gate electrode layer 117 is formed to fill the trench 413 and with its upper end projecting from trench 413. Gate electrode layer 117 opposes to n+ emitter region 109, p type base region 107 and n− region 105 with gate oxide film 115 interposed.

Interlayer insulating layer 119 is formed to cover an upper end of gate electrode layer 117. In interlayer insulating layer, there is provided an opening which disposes the surfaces of n+ emitter region 109 and p+ contact region 111. Cathode electrode (emitter) 121 is formed so as to electrically connect n+ emitter region 109 and p+ contact region 111 through the opening. Anode electrode (collector) 123 is formed to be electrically connected to p+ collector region 101.

Hereinafter, the surface of the semiconductor substrate on which cathode electrode 121 is formed will be referred to as a cathode surface or a first main surface, and the surface where anode electrode 123 is formed will be referred to as an anode surface or the second main surface.

A trench MOS gate structure in which gate electrode layer 117 is formed in trench 413 with gate oxide film 115 interposed is manufactured through the following steps.

First, in a semiconductor substrate, a relatively deep trench 413 of about 3 to about 5 $\mu$m is formed by common anisotropic dry etching. Sacrificial oxidation or cleaning is performed on the inner wall of trench 413. Thereafter, a silicon thermal oxide film (hereinafter referred to as a gate oxide film) 115 is formed at a temperature from 900° C. to 1000° C. in, for example, vapor ambient ($H_2O$). A polysilicon film doped with an n type impurity such as phosphorous or a polycrystalline silicon film doped with a p type impurity such as boron fills the trench 413. The doped polysilicon film is patterned so that trench 413 is filled and doped polysilicon film is drawn out at least from a porion of trench 413 to the surface of the cathode side. The patterned doped polysilicon film is electrically connected to a gate surface interconnection formed of a metal such as aluminum, provided entirely over the semiconductor device, while insulated from cathode electrode 121.

The method of controlling on-state and off-state in the third prior art example will be described.

On-state is realized by applying a positive (+) voltage to gate electrode 117 while a forward bias is applied between cathode electrode 121-anode electrode 123, that is, while a positive (+) voltage is applied to anode electrode 123 and a negative (−) voltage is applied to cathode electrode 121.

A turn-on process in which the device transits from off-state to the on-state will be described in the following.

When a positive (+) voltage is applied to gate electrode layer 117, an n channel (inverted n region) which is inverted to n type and having very high electron density is generated at p base region 107 near gate oxide film 115. Electrons, which are one of the current carriers (hereinafter referred to as carriers) are injected from n$^+$ emitter region 109 through the n channel to n$^-$ region 105, and flow to p$^+$ collector region 101 to which the positive (+) voltage is applied. When the electrons reach p$^+$ collector region 101, holes, which are other current carrier are injected from p$^+$ collector region 101 to n$^-$ region 105 and flow to n$^+$ emitter region 109 to which the negative (−) voltage is applied. Thus, the flow reaches the position where the aforementioned n channel is in contact with n$^-$ region 105. This process is referred to as storage process, and the time necessary for this process is referred to as storage time ($t_{storage}$) or turn-off delay time ($td_{(off)}$). Power loss during the storage time is so small that it can be neglected, as compared with steady loss, which will be described layer.

Thereafter, from anode electrode 123 and cathode electrode 121, sufficient current carriers are stored in n$^-$ region 105 to such an amount that is larger by two or three orders of magnitude than the concentration of semiconductor substrate (1×10$^{12}$ to 1×10$^{15}$ cm$^{-3}$), in accordance with the difference between potentials applied to both electrodes. Accordingly, a low resistance state referred to as conductivity modulation is caused by the hole-electron pairs, thus turn-on is completed. This process is referred to as a rise process, and the time necessary for this process is referred to as rise time ($t_{rise}$). Power loss during this time is approximately the same or larger than the steady loss, which will be described layer later, and constitutes roughly one fourth of the entire loss.

The steady state after the completion of turn-on is referred to as on-state, and the power loss represented by a product of on-state voltage caused by on resistance (effectively, potential difference between both electrodes) and the conduction current is referred to as on-loss or steady loss.

When a positive voltage is applied to gate electrode layer 117, an n$^+$ accumulation region 425a having high electron density is formed along the sidewalls of trench 113, as shown in FIG. 99.

Off-state is realized by applying a negative (−) voltage to gate electrode layer 117, even when forward bias is being applied to anode electrode 123-cathode electrode 121.

A turn off process in which the device transits from on state to off state will be described in the following.

When a negative (−) voltage is applied to gate electrode layer 117, n channel (inverted n region) formed on the side surface of gate electrode layer 117 is eliminated, and supply of electrodes from n$^+$ emitter region 109 to n$^-$ region 105 is stopped. The process up to here is referred to as storage process, and the time necessary for this process is referred to as storage time (ts) or turn off delay time ($td_{(off)}$). The power loss during this time is very small as compared with the turn on loss and the steady loss, and it can be neglected.

As the electron density reduces, the density of electrons which has been introduced to n$^-$ region 105 gradually reduces from the vicinity of n$^+$ emitter region 109. In order to maintain charge neutralize condition, holes which have been introduced to n$^-$ region 105 also reduce, and p base region 107 and n$^-$ region 105 are reversely biased. Consequently, depletion layer begins to extend at the interface between p base region 107 and n$^-$ region 105, and tends to have a thickness which corresponds to the applied voltage in the off state between both electrodes. The process up to here is referred to as a fall process, and the time necessary for this process is referred to as fall time (tf). The power loss during this time is approximately the same or larger than the aforementioned turn off loss and steady loss, and it constitutes roughly one fourth of the entire loss.

Further, holes in an electrically neutral region where both carriers remain outside the aforementioned depletion region (p$^+$ collector region 101) pass through the depletion region and extracted through p$^+$ contact region 111 to emitter electrode 121, thus carriers are all eliminated and turn off is completed. This process is referred to tail process, and the time necessary for this process is referred to as tail time ($t_{tail}$). The power loss during the tail time is referred to as tail loss, which is approximately the same or larger than the turn on loss, loss during the fall time and steady loss, and it constitutes roughly one fourth of the entire loss.

The steady state after the completion of turn off is referred to as off state and power loss caused by the product of leak current in this state and the voltage between both electrodes is referred to as off loss. However, generally it is smaller than other power losses and it can be neglected.

The above described first and second prior art examples relate to current control type devices in which minority carriers are extracted from gate electrodes 309 and 359 to set off-state. Therefore, at the time of turn off, it is necessary to extract a considerable amount of the main current from the gate electrode. When a relatively large current is to be extracted, there will be a large surge current caused by inductance of interconnections or the like, and heat radiation caused by current must also be taken into consideration. Therefore, it becomes necessary to provide a protecting circuit against surge voltage and excessive current, in the circuit for controlling the gate voltage. This makes the gate control circuit complicated. Further, it is possible that the control circuit is thermally destroyed or suffers from thermal runaway because of heat, and hence a cooling mechanism must be provided. This makes the device larger.

A semiconductor device which solves these problems is disclosed in Japanese Patent Laying-Open No. 5-243561. The semiconductor device disclosed in this application will be described as a fourth prior art example.

FIG. 100 is a plan view schematically showing the structure of the semiconductor device in accordance with the fourth prior art example, and FIGS. 101 and 102 are cross sectional views taken along the lines P–P' and Q–Q' of FIG. 100, respectively.

Referring to FIGS. 100 to 102, the fourth prior art example shows an electrostatic induction thyristor. On one surface of a high resistance n type base layer 501, a p type emitter layer 503 is formed with an n type buffer layer 502 interposed. On the other surface of n type base layer 501, a plurality of trenches 505 are formed spaced by a small distance from each other. In these trenches 505, gate electrodes 507 are formed embedded, with gate oxide film 506 interposed. At every other region between the trenches 505, n type turn off channel layer 508 is formed. On the surface of turn off channel layer 508, a p type drain layer 509 is formed. At a surface portion sandwiched between p type drain layers 509, an n type source layer 510 is formed.

A cathode electrode 511 is formed to be electrically connected to p type drain layer 509 and n type source layer 510. An anode electrode 512 is formed to be electrically connected to p type emitter layer 503.

In the fourth prior art example, when the positive voltage is applied to gate electrode 507 to raise the potential of n type base layer 501 sandwiched between the trenches 505, electrons are introduced from n type source layer 510, so that the device turns on. Meanwhile, when a negative voltage is applied to a gate electrode layer 507, a p type channel is formed on a side surface of the trench of n type turn off channel layer 508, carriers of n base layer 501 are discharged through p drain layer 509 to cathode electrode 511, and therefore the device turns off.

In the fourth prior art example, the gate electrode 507 has an insulated gate structure. Therefore, in the fourth prior art example, the gate electrode 507b is not of the current control type in which current is directly drawn out from the substrate, but it is of a voltage controlled type in which control is realized by the voltage (gate voltage) applied to the gate electrode.

Since the fourth prior art example is of the voltage controlled type, it is not necessary to extract a large current from gate electrode layer 507 at the time of turn off. Accordingly, it is not necessary to provide a protecting circuit or a cooling mechanism in consideration of surge current and heat caused when large current is extracted. Therefore, the fourth prior art example is advantageous in that the gate control circuit can be simplified.

However, in the fourth prior art example, at the surface region sandwiched between trenches 507 extending parallel to each other as shown in FIG. 100, there are p type drain layer 509 and n type source layer 510 adjacent to each other. Since p type drain layer 509 has a potential barrier with respect to the electrons, the electron current entering the cathode electrode 511 flows only through the portion of n type source layer 510. Therefore, there is inhibiting factor such as partial increase in current density, which results in degraded on characteristics.

In the third prior art example shown in FIG. 98, it is not possible to improve on-state voltage Vf, and hence power consumption of the semiconductor device is considerably large. This will be described in greater detail.

As a method of improving ON voltage (on-state voltage Vf of a diode) which is a basic characteristic of IGBT, there is a method of improving injection efficiency of electrons on the side of the cathode. In order to improve injection efficiency of electrons, it is necessary to increase impurity concentration on the side of the cathode or to increase the effective cathode area. The effective cathode area means the area of a portion (denoted by the solid line in the figure) where $n^+$ region (effective cathode region) including $n^+$ emitter region 109 and storage region 425a is in contact with p type base region 107 and $n^-$ region 105.

In the third prior art example, the depth of the trench 413 is 3–5 µm, as already described. Therefore, when a positive voltage is applied to gate electrode layer, extension of the storage layer generated around the trench 113 is limited. Accordingly, it is not possible to ensure the large effective cathode area. This hinders improvement in injection efficiency of electrons on the side of the cathode, and hence ON voltage of IGBT cannot be reduced.

SUMMARY OF THE INVENTION

An object of the present invention is to provide a power semiconductor device which allows simplification of gate control circuit, provides good on characteristic and reduces steady loss.

Another object of the present invention is to provide a power semiconductor device which allows simplification of gate control circuit, has low on-state voltage Vf and low steady loss.

The semiconductor device in accordance with an aspect of the present invention including a diode structure in which main current flows between both main surfaces sandwiching an intrinsic or a first conductivity type semiconductor substrate includes a first impurity region of a first conductivity type, a second impurity region of a second conductivity type, a control electrode layer, a first electrode layer and a second electrode layer. The first impurity region of the first conductivity type is formed on a first main surface of the semiconductor substrate and has impurity concentration higher than that of the semiconductor substrate. The second impurity region of the second conductivity type is formed on a second main surface of the semiconductor substrate, and sandwiches with the first impurity region, a low impurity concentration region of the semiconductor substrate. The semiconductor substrate has a plurality of trenches extending parallel to each other on the first main surface, and each trench is formed to reach the low impurity concentration region of the semiconductor substrate through the first impurity region from the first surface. The first impurity region is formed entirely at the first main surface of the semiconductor substrate sandwiched by the trenches extending parallel to each other. The control electrode layer is formed to oppose to the first impurity region and the low impurity concentration region of the semiconductor substrate in the trench-with an insulating film interposed. The first electrode layer is formed on the first main surface of the semiconductor substrate and electrically connected to the first impurity region. The second electrode layer is formed on the second main surface of the semiconductor substrate and electrically connected to the second impurity region.

In the semiconductor device in accordance with one aspect of the present invention, the control electrode layer opposes to the first impurity region and the low impurity concentration region of the semiconductor substrate with an insulating film interposed. In other words, the gate control is of voltage control type. Therefore, it is not necessary to extract a large current from the control electrode at the time of turn off. Therefore, it is not necessary to provide a protecting circuit for a cooling mechanism in the gate control circuit in consideration of surge voltage and heat caused when a large current flows. Therefore, as compared with the first and second prior art examples, gate control circuit can be simplified.

Further, the device is a bipolar device. In the bipolar device, the holes and electrons contribute to the operation. Therefore, even when the substrate thickness is improved to meet the demand of higher breakdown voltage and current path in the on state becomes longer, resistance can be maintained low, since there is generated conductivity modulation by the holes and electrons. Therefore, power loss can be reduced and amount of heat radiation can be reduced.

Further, the control electrode layer opposes to the first impurity region and a low impurity concentration region of the semiconductor substrate. Therefore, by applying a voltage to the control electrode layer, the low impurity concentration region of the semiconductor substrate near the trench which is filled with the control electrode layer can be turned to a channel having high electron density approximately the same as the density of first impurity region. Consequently, the channel region near the trench can be regarded as a first impurity region, and hence a state as if the first impurity region is enlarged can be realized. When the first impurity region is enlarged, the contact area between the low impurity concentration region of the semiconductor substrate and the enlarged first impurity region, that is, the effective cathode area is increased. Thus, efficiency in injecting electrons on the side of the cathode is improved, and on-state voltage Vf of the diode can be reduced.

Further, only the first impurity region is formed on the first main surface of the semiconductor substrate sandwiched between the trenches. Therefore, as compared with an example in which impurity regions of different conductivity types exist on the first main surface, the electron current entering from the cathode flows uniformly through the first main surface of the semiconductor substrate between the trenches. Accordingly, inhibiting factor such as partial increase in current density can be eliminated, and good on characteristic is obtained.

In the above described aspect, preferably the plurality of trenches include first, second and third trenches extending parallel to each other. The first impurity region is formed entirely at the first main surface of the semiconductor substrate between the first and second trenches. A third impurity region of the second conductivity type is formed at the first main surface of the semiconductor substrate between the second and third trenches. Therefore, the third impurity region is formed shallower than the trench, and is electrically connected to the first electrode layer.

At the first main surface of the semiconductor substrate, the third impurity region is provided adjacent to the first impurity region with a trench interposed. The third impurity region has a conductivity type different from that of the first impurity region. Therefore, at the time of turn off of the device, holes are extracted from the third impurity region. Thus, the speed of turn off of the device can be improved and the turn off loss can be reduced.

The third impurity region is provided adjacent to the first impurity region at the first main surface of the semiconductor substrate with a trench interposed. Therefore, by adjusting the ratio of existence of the third and first impurity regions, desired turn off speed and on-state voltage Vf can be selected.

According to another aspect of the present invention, the semiconductor device includes a pnpn structure in which main current flows between both main surfaces with an intrinsic or first conductivity type semiconductor substrate sandwiched therebetween, which includes a first impurity region of a first conductivity type, a second impurity region of a second conductivity type, a third impurity region of the second conductivity type, a control electrode layer, a first electrode layer and a second electrode layer. The first impurity region of the first conductivity type is formed at the first main surface of the semiconductor substrate. The second impurity region of the second conductivity type is formed at the second surface of the semiconductor substrate. The third impurity region of the second conductivity type is formed below the first impurity region to sandwich a region of the semiconductor substrate with itself and the second impurity region. The semiconductor substrate has a plurality of trenches extending parallel to each other at the first main surface, and each trench is formed to reach a region of the semiconductor substrate through first and third impurity regions from the first main surface. The first impurity region is formed entirely at the first main surface of the semiconductor substrate sandwiched between the trenches extending parallel to each other. The control electrode layer is formed to oppose to the first and third impurity regions and the semiconductor substrate region with an insulating film interposed, in the trench. The first electrode layer is formed on the first main surface of the semiconductor substrate and electrically connected to the first impurity region. The second electrode layer is formed on the second main surface of the semiconductor substrate and electrically connected to the second impurity region.

In the semiconductor device in accordance with aforementioned another aspect of the present invention, the control electrode layer opposes to the first and third impurity regions and the semiconductor substrate region with an insulating film interposed. In other words, the gate control is of voltage controlled type. Therefore, it is not necessary to extract a large current from the control electrode layer at the time of turn off. Accordingly, it is not necessary to provide a protecting circuit or a cooling mechanism in the gate control circuit in consideration of surge voltage or heat generated when a large current flows. Therefore, compared with the first and second prior art examples, the gate control circuit can be simplified.

Further, the device is a bipolar device. In the bipolar device, both holes and electrons contribute to the operation. Therefore, even when the substrate thickness is increased to meet the demand of higher breakdown voltage and the current path in the on state becomes longer, there will be a conductivity modulation generated by the holes and electrons. Therefore, the on resistance can be maintained low. Therefore, increase in steady loss can be suppressed and the amount of heat radiation can be reduced.

Further, only the first impurity region is formed at the main surface of the semiconductor substrate between the trenches. Therefore, as compared with the examples in which impurity regions of different conductivity types exist at the first main surface, electron current entering from the cathode side flows uniformly through the first main surface of the semiconductor substrate between the trenches. Therefore, inhibiting factor such as partial increase in current density can be eliminated, and good on characteristic is obtained.

In the above described aspect, preferably, the plurality of trenches include first, second and third trenches extending parallel to each other. The first impurity region is formed entirely at the first main surface of the semiconductor substrate between the first and second trenches. A fourth impurity region of the second conductivity type is formed at the first main surface of the semiconductor substrate between the second and third trenches. The fourth impurity region is made shallower than the trench, and is electrically connected to the first electrode layer.

The fourth impurity region is provided at the first main surface of the semiconductor substrate to be adjacent to the first impurity region with the trench interposed. Further, the fourth impurity region has a conductivity type different from that of the first impurity region. Accordingly, holes are extracted from the fourth impurity region at the time of turn off of the device. Therefore, turn off speed of the device can be improved and turn off loss can be reduced.

The fourth impurity region is provided adjacent to the first impurity region with the trench interposed, at the first main surface of the semiconductor substrate. Therefore, by adjusting the ratio of existence of the fourth and first impurity regions, a desired turn off speed and on-state voltage can be selected.

In accordance with still further aspect of the present invention, the semiconductor device includes a diode structure in which main current flows between both main surfaces with an intrinsic or first conductivity type semiconductor substrate sandwiched therebetween, which device includes a first impurity region of a first conductivity type, a second impurity region of a second conductivity type, a third impurity region of the second conductivity type, a fourth impurity region of the first conductivity type, a control electrode layer, a first electrode layer and a second electrode layer. The first impurity region of the first conductivity type is formed as the first main surface of the semiconductor substrate, and has an impurity concentration higher than that of the semiconductor substrate. The second impurity region of the second conductivity type is formed on the second main surface of the semiconductor substrate. The semiconductor substrate has trenches extending parallel to each other and sandwiching the first impurity region. The third impurity region of the second conductivity type is a sidewall of the trench and formed at the first main surface. The fourth impurity region of the first conductivity type is provided immediately below the third impurity region to be in contact with the sidewall of the trench and the semiconductor substrate region, and has lower concentration than the first impurity region.

The control electrode layer is formed to oppose to the third and fourth impurity regions and semiconductor substrate region with an insulating film interposed, in the trench. The first electrode layer is formed on the first main surface of the semiconductor substrate and is electrically connected to the first and third impurity regions. The second electrode layer is formed at the second main surface of the semiconductor substrate and electrically connected to the second impurity region.

In the semiconductor device in accordance with aforementioned still further aspect of the present invention, the control electrode layer opposes to the third and fourth impurity regions and the semiconductor substrate region with the insulating film interposed. In other words, the gate control is of voltage control type. Therefore, it is not necessary to extract a large current from the control electrode layer at the time of turn off. Therefore, it is not necessary to provide a protecting circuit or a cooling mechanism in the gate control circuit in consideration of surface voltage or heat radiation generated when a large current flows. Therefore, as compared with the first and second prior art examples, the gate control circuit can be simplified.

Further, the device is a bipolar device. In the bipolar device, both the holes and the electrons contribute to the operation. Therefore, even if the substrate thickness is increased to meet the demand of higher breakdown voltage and current path in the on state becomes longer, there will be conductivity modulation by the holes and electrons. Therefore, the resistance can be maintained low. Accordingly, the amount of heat radiation is small and increase in steady loss can be suppressed.

Further, the control electrode layer opposes to the third and fourth impurity regions and the semiconductor substrate region. Therefore, by applying a positive voltage to the control electrode layer, regions near the trenches in which control electrode layers are filled can have such high electron density that is approximately the same as in the first impurity region. Therefore, all the regions near the trench can be regarded as the first impurity region, and a state as if the first impurity region is enlarged can be realized. When the first impurity region is enlarged, the contact area between the enlarged first impurity region and the semiconductor substrate region, that is, the effective cathode area is increased. Thus, the efficiency in injecting electrons on the side of the cathode is improved, and on-state voltage Vf of the diode can be reduced.

By applying a voltage to the control electrode layer, the region of the opposite conductivity type near the trench can have approximately the same high electron density as that of the first impurity region. Therefore, the region of the opposite conductivity type such as the third impurity region as well as the fourth impurity region can be regarded as the first impurity region. Since the third impurity region is also regarded as a first impurity region in addition to the fourth impurity region, the effective cathode area can further be increased. Thus, the efficiency in injecting electrons on the cathode side can further be improved, and the on-state voltage Vf on the diode can further be reduced.

Preferably, in the above described aspect, an isolating impurity region is further provided, formed at the first main surface of the semiconductor substrate. On one side of the outermost of the plurality of trenches extending parallel to each other, another trench is positioned, while on the other side, the isolating impurity region is formed in contact with the outermost trench and deeper than the trench.

Since isolating impurity region is provided to surround the region in which a diode structure or a thyristor structure is formed, the effect of electrical isolation from other elements can be enhanced, and breakdown voltage of the device is improved and stabilized.

Preferably, in the above described aspect, the depth of the trench from the first main surface is at least 5 $\mu$m and at most 15 $\mu$m.

As the depth of the trench is at least 5 $\mu$m, the storage region having high electron density can be generated widely along the sidewall of the trench at on-state. Therefore, as compared with the third prior art example, wider effective cathode area is ensured. Therefore, the efficiency in injecting electrons on the cathode side can further be improved, and the on-state voltage Vf can be reduced. Further, since it is difficult to form a trench deeper than 15 $\mu$m with a minute width (of at most 0.6 $\mu$m), the depth of the trench is at most 15 $\mu$m.

In the semiconductor device according to a still further aspect of the present invention, main current flows between both main surfaces of an intrinsic or a first conductivity type semiconductor substrate, and the device includes a first impurity region of a second conductivity type, a second impurity region of a second conductivity type, a third impurity region of the first conductivity type, a control electrode layer, and first and second electrode layers.

The first impurity region is formed on the side of the first main surface of the semiconductor substrate. The second impurity region is formed at the second main surface of the semiconductor substrate, and with the first impurity region, sandwiches a low concentration region of the semiconductor substrate. The semiconductor substrate has a trench reaching the semiconductor substrate region from the first main surface through the first impurity region. The third impurity region is formed on the first impurity region to be in contact with the sidewall of the trench of the first main surface of the semiconductor substrate. The control electrode layer is formed to oppose to the first and third impurity regions and the semiconductor substrate region in the trench with an insulating film interposed, and controls current flowing between the first and second main surfaces in accordance with an applied control voltage. The first electrode layer is formed on the first main surface of the semiconductor substrate and electrically connected to the first and third impurity regions. The second electrode layer is formed on the second main surface of the semiconductor substrate and electrically connected to the second impurity region. When the first and second main surfaces of the semiconductor substrate is in a conducted state, an accumulation region of the first conductivity type is formed around the trench, to be in contact with the third impurity region. In the conduction state, the ratio Rn=(n/n+p) of the contact area n between the effective cathode region including the third impurity region and accumulation region with the first impurity region and the semiconductor substrate region with respect to the area p on the side of the first main surface of the first impurity region in at least 0.4 and at most 1.0.

Since the ratio Rn is at least 0.4 and at most 1.0, which is higher than the third prior art example, efficiency in injecting electrons on the side of the cathode is improved as compared with a prior art example, and hence on-state voltage Vf can be reduced.

Preferably, in the above described aspects, the depth of the trench from the first main surface is at least 5 µm and at most 15 µm. Since the depth of the trench is at least 5 µm, the storage region having high electron density can be generated wider along the sidewall of the trench at on-state. Therefore, wider effective cathode area than the third prior art example can be ensured. Therefore, the efficiency in injecting electrons on the cathode side can further be enhanced, and on-state voltage Vf can be reduced. In the present device, it is difficult to form a trench deeper than 15 µM with a minute width (of at most 0.6 µm), and hence the depth of the trench is at most 15 µm.

In the above described aspect, preferably, the trench includes a plurality of trenches, having first, second and third trenches. At the semiconductor substrate between the first and second trenches, the first and third impurity regions are formed. At the first main surface of the semiconductor substrate between the second and third trenches, only the semiconductor substrate region is positioned. On the semiconductor substrate between the second and third trenches, a conductive layer is formed with a second insulating layer interposed. The conductive layer is electrically connected to each of the control electrode layers filling the second and third trenches.

Since the conductive layer is electrically connected to the control electrode layer, when a positive voltage, for example, is applied to the control electrode layer at on-state, the positive voltage is also applied to the conductive layer. The conductive layer opposes to the semiconductor substrate region between the second and third trenches with the second insulating layer interposed. Therefore, when the positive voltage is applied to the conductive layer, the surface region between the second and third trenches can have approximately the same high electron density as that of a third impurity region. Therefore, the third impurity region is enlarged by the surface region of the substrate sandwiched between the second and third trenches. Accordingly, the effective cathode area is increase, efficiency in injecting electrons on the cathode side can further be enhanced, and the on-state voltage Vf of the diode can further be reduced.

In the above described aspect, preferably, there are a plurality of trenches, including first, second and third trenches. At the semiconductor substrate between the first and second trenches, first and third impurity regions are formed. At the first main surface of the semiconductor substrate between the second and third trenches, the fourth impurity region of the second conductivity type having lower concentration than the second impurity region is formed. On the semiconductor substrate between the second and third trenches, a conductive layer is formed with a second insulating layer interposed. The conductive layer is electrically connected to each of the control electrode layers filling the second and third trenches.

Since the conductive layer is electrically connected to the control electrode layer, when a positive voltage, for example, is applied to the control electrode layer at on-state, the positive voltage is also applied to the conductive layer. The conductive layer opposes to the fourth impurity region between the second and third trenches with the second insulating layer interposed. Since the fourth impurity region has lower concentration than the second impurity region, when the positive voltage is applied to the conductive layer, the surface region between the second and third trenches comes to have approximately the same high electron density as that of the third impurity region. Therefore, the third impurity region is enlarged by the surface area of the substrate sandwiched between the second and third trenches. Thus, the effective cathode area is increased, efficiency in injecting electrons on the cathode side is further enhanced, and the on-state voltage Vf diode can further be reduced.

Since the fourth impurity region is set to have lower concentration than the second impurity region, thyristor operation occurs when the device operates. As a result, the ON voltage lowers advantageously when rated current is conducted.

When the device is turned off, a negative voltage, for example, is applied to the control electrode layer. At this time, since the negative voltage is also applied to the conductive layer, a region having higher hole density than the fourth impurity region is generated at the surface of the fourth impurity region below the conductive layer. Since the region having a high hole density is formed, extraction of holes at the time of turn off is facilitated, thus turn off speed of the device is improved and the turn off loss can be reduced.

In the above described aspect, preferably, the fourth impurity region of the second conductivity type having lower concentration than the first impurity region is further provided to be in contact with the sidewall of the trench at a lower portion of the first impurity region and to sandwich with the second impurity region, the semiconductor substrate region.

Since the fourth impurity region has lower concentration than the first impurity region, when a negative voltage is applied to the control electrode layer at off-state, there is generated a region having higher hole density than the concentration of the first impurity region, along the sidewall of the trench, in the fourth impurity region. Since the region having high hole density is formed, extraction of holes, which are carriers, can be facilitated and smoothly performed at the time of turn off of the device, so that switching characteristic can be improved.

In the semiconductor device in accordance with a still further aspect of the present invention, current flows between both main surfaces of an intrinsic or a first conductivity type semiconductor substrate, and the device includes a first impurity region of a second conductivity type, a second impurity region of a second conductivity type, a third impurity region of the first conductivity type, a fourth impurity region of the second conductivity type, a control electrode layer, and first and second electrode layers. The first impurity region is formed on the side of the first main surface of the semiconductor substrate. The second impurity region is formed at the second main surface of the semiconductor substrate and, sandwiches, with a first impurity region, a low concentration region of the semiconductor substrate. The semiconductor substrate has a trench reaching the semiconductor substrate region from the first main surface through the first impurity region. The third impurity region is formed on the first impurity region to be in contact with a sidewall of the trench at the first main surface of the semiconductor substrate. The fourth impurity region is formed to be adjacent to the third impurity region at the main surface of the semiconductor substrate on the first impurity region, and it has higher concentration than the first impurity region.

The control electrode layer is formed to oppose to the first and third impurity regions and the low concentration region of the semiconductor substrate with an insulating film interposed in the trench, and controls current flowing between the first and second main surfaces in accordance with an applied control voltage. The first electrode layer is formed at the first main surface of the semiconductor substrate and electrically connected to the third and fourth impurity regions. The second electrode layer is formed on the second main surface of the semiconductor substrate and electrically connected to the second impurity region. Here, the following relation holds where Dt represents the depth of the trench from the first main surface, Wt represents the width of said trench, De represents the depth of the third impurity region from the first main surface, We represents the width of the third impurity region from one trench to another trench, and Pt represents pitch between adjacent trenches:

$$\frac{2(We + Dt - De) + Wt}{2(We + Dt - De) + Pt} \geq 0.4$$

The ratio Rn=(n/n+p) can be approximated as shown by the above expression, in accordance with dimensions of various portions. Since dimensions of various portions are set so that the ratio Rn is at least 0.4, efficiency in injecting electrons on the side of the cathode can be improved and the on-state voltage Vf can be reduced, as compared with the third prior art example.

The method of manufacturing the semiconductor device in accordance with a present invention is for manufacturing a semiconductor device in which main current flows between both main surfaces of an intrinsic or a first conductivity type semiconductor substrate, including the following steps.

First, by selective ion implantation to the first main surface of the semiconductor substrate, a first impurity region of a second conductivity type is formed. Then, the second impurity region of the second conductivity type is formed at the second main surface of the semiconductor substrate. By selective ion implantation, a third impurity region of the first conductivity type is formed at the first main surface in the first impurity region. By performing anisotropic etching on the first main surface, a plurality of trenches including first, second and third trenches are formed at the semiconductor substrate. Thus, first and third impurity regions are formed along the sidewalls of the trench at the first main surface between the first and second trenches, and only a low concentration region of the semiconductor substrate is positioned at the first main surface between the second and third trenches.

A control layer is formed in the trench to oppose to the low concentration region of the semiconductor substrate and the first and third impurity regions between the first and second impurity regions with an insulating film interposed. By selective ion implantation, a forth impurity region of a second conductivity type having higher impurity concentration than the first impurity region is formed at the first main surface in the first impurity region, to be adjacent to the third impurity region. A first electrode layer is formed on the first main surface to be electrically connected to the third and fourth impurity regions. A second electrode layer is formed on the second main surface to be electrically connected to the second impurity region.

In accordance with a method of manufacturing a semiconductor device in accordance with a present invention, only the low concentration region of the semiconductor substrate is positioned at the first main surface sandwiched between the second and third trenches. Therefore, the first impurity region is not positioned at the first main surface between the second and third trenches. Therefore, the object to improve device characteristics by increasing the ratio Rn can be attained, and main breakdown voltage can be maintained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

In the following, for convenience, the cathode region, which is an n$^+$ high concentration impurity region will be sometimes referred to as n$^+$ emitter region, and the anode region which is p$^+$ high concentration impurity region will be sometimes referred to as p$^+$ collector region.

Embodiment 1

Figure 1:
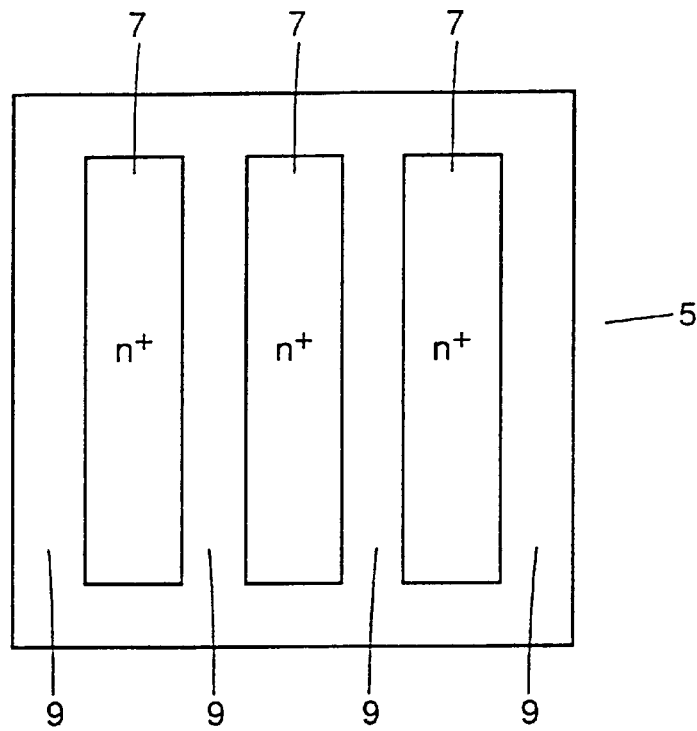
FIG. 1 is a schematic plan view showing a structure of a semiconductor device in accordance with Embodiment 1 of the present invention.
Figure 2:
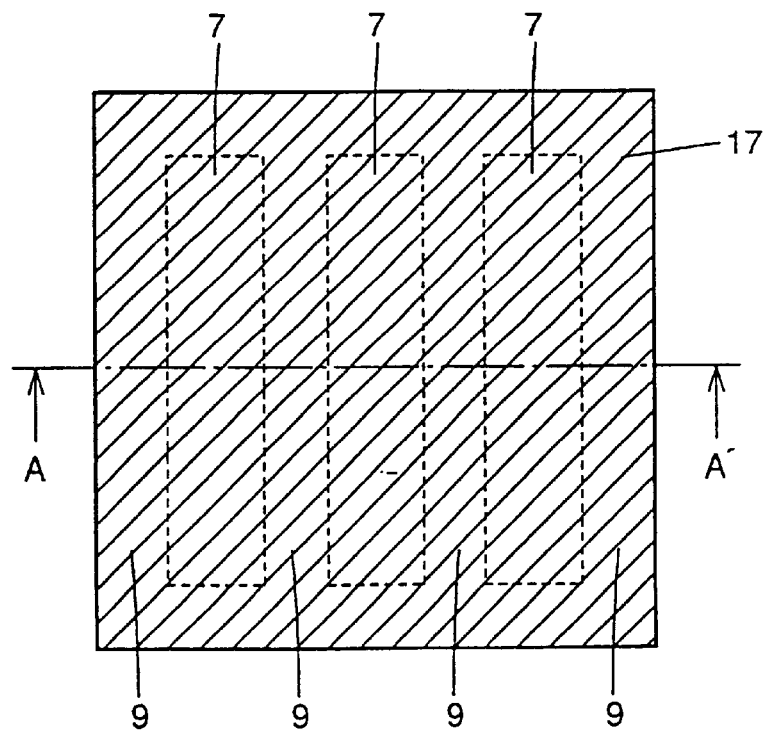
FIG. 2 is a schematic plan view showing the device of FIG. 1 with cathode electrode provided.
Figure 3:
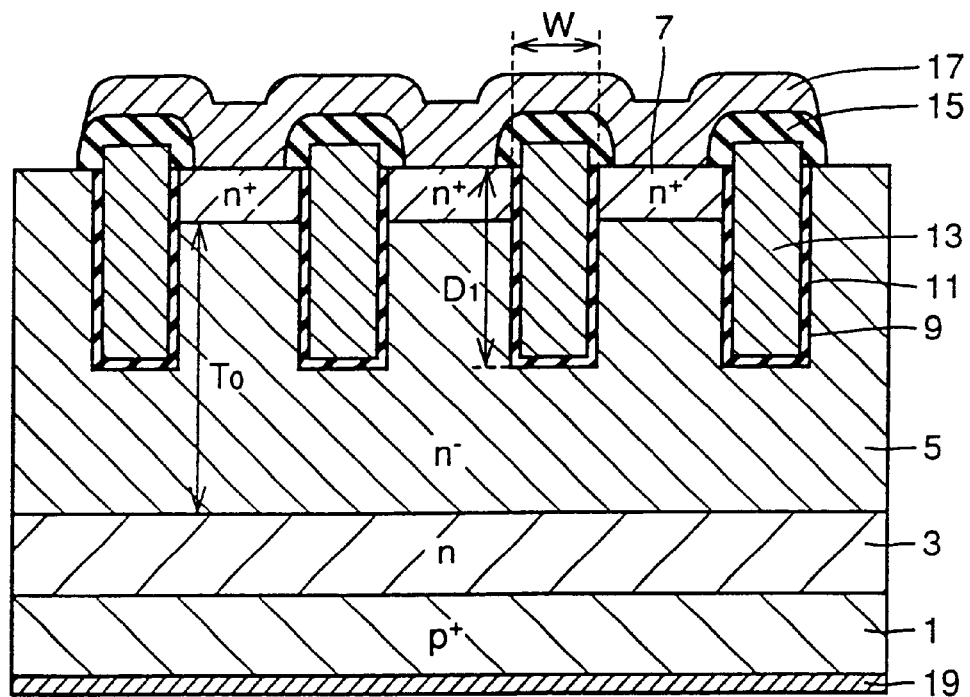
FIG. 3 is a schematic cross sectional view taken along the line A–A' of FIG. 2.

Referring to FIGS. 1 to 3, the present embodiment shows an example which includes a pin diode. The pin diode includes a p$^+$ anode (collector) region 1 of a second conductivity type formed at a second main surface, an n type buffer region 3, an n$^-$ region 5 which is the semiconductor substrate of a first conductivity type of low impurity concentration. An n$^+$ cathode region (n$^+$ emitter region) 7 of the first conductivity type formed at the first main surface, insulating films 11 and 15, a gate electrode layer 13 which is the control electrode layer, a cathode electrode 17 which is a first electrode layer, and an anode electrode 19 which is a second electrode layer.

At the first main surface where the cathode region 7 is provided, there is formed a trench 9, which reaches the n$^-$ region 5 of the substrate through n$^+$ cathode region 7.

As shown in FIG. 1, the trench 9 has such planer shape that approximately surrounds a rectangle, and has portions extending parallel to each other within the rectangle.

The n$^+$ cathode region 7 is formed entirely at the first main surface of the semiconductor substrate sandwiched between trenches 9 extending in parallel.

The width W of trench 9 is, for example, at least 0.8 $\mu$m and at most 1.2 $\mu$m. The depth $D_1$ is, practically, from 5.0 $\mu$m to 15.0 $\mu$m.

Along the inner wall surface of trench 9, a gate insulating film 11 (for example, a silicon thermal oxide film) is provided. Gate electrode layer 13 is formed of phosphorus doped polycrystalline silicon film to fill the trench 9, with its upper end projecting from first main surface.

Gate electrode layer 13 opposes to the side surface of n$^+$ cathode region 7 and to the side surface and bottom surface of n$^-$ region 5, with gate insulating film 11 interposed.

Gate electrode layer 13 may be pulled up to a portion where insulating film is provided on the first main surface, from the trench (not shown).

An insulating film 15 of, for example, a silicon thermal oxide film and BPSG (Boro Phospho-Silicate Glass) is formed to cover the upper end of the gate electrode layer 13.

There is provided an opening at a portion of the BPSG insulating film 15, and metal interconnection is connected to the gate electrode through the opening (not shown).

The cathode electrode 17, which is the first electrode layer, is electrically connected to cathode region 7. Cathode region 7 is formed on a region surrounded by trenches 9. The planer region where the cathode electrode 17 is formed is referred to as a diode forming region here.

Anode electrode 19, which is the second electrode layer, is electrically connected to p$^+$ collector region 1 formed at the second main surface.

As to the impurity concentrations of respective portions, the surface concentration of p$^+$ collector region 1 is from $1\times10^{16}$ cm$^{-3}$ to $5\times10^{21}$ cm$^{-3}$, the peak concentration of n type buffer region 3, $1\times10^{13}$ cm$^{-3}$ to $1\times10^{19}$ cm$^{-3}$, of n$^-$ region 5, $1\times10^{12}$ cm$^{-3}$ to $1\times10^{17}$ cm$^{-3}$, and of cathode region 7, the surface concentration must be at least $1\times10^{17}$ cm$^{-3}$. The surface impurity concentration of p$^+$ collector region is higher than the peak impurity concentration of n type buffer region 3, the peak impurity concentration of n type buffer region 3 is higher than peak impurity concentration of n$^-$ region 5, and the surface impurity concentration of n$^+$ cathode region 7 is higher than the peak concentration of n$^-$ region 5.

The impurity concentration of n type buffer region 3 has only to be lower than the impurity concentration of p$^+$ collector region 1 and higher than that of n$^-$ region 5.

The method of manufacturing the semiconductor device in accordance with the present embodiment will be described.

Figure 4:
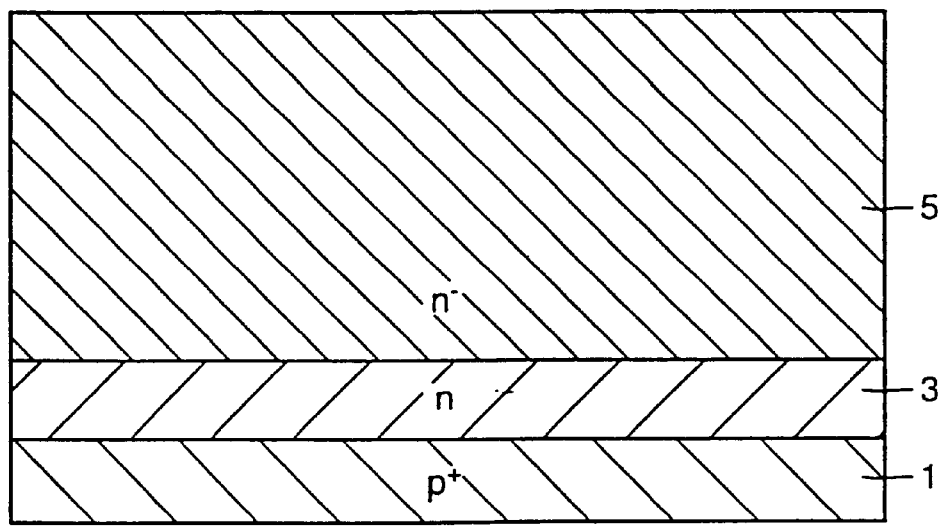
FIGS. 4 to 9 are schematic cross sectional views showing, in order, the steps of manufacturing the semiconductor device in accordance with Embodiment 1 of the present invention.

First, referring to FIG. 4, p$^+$ collector region 1, n type buffer region 3 and n$^-$ region 5 are formed stacked in this order.

Figure 5:
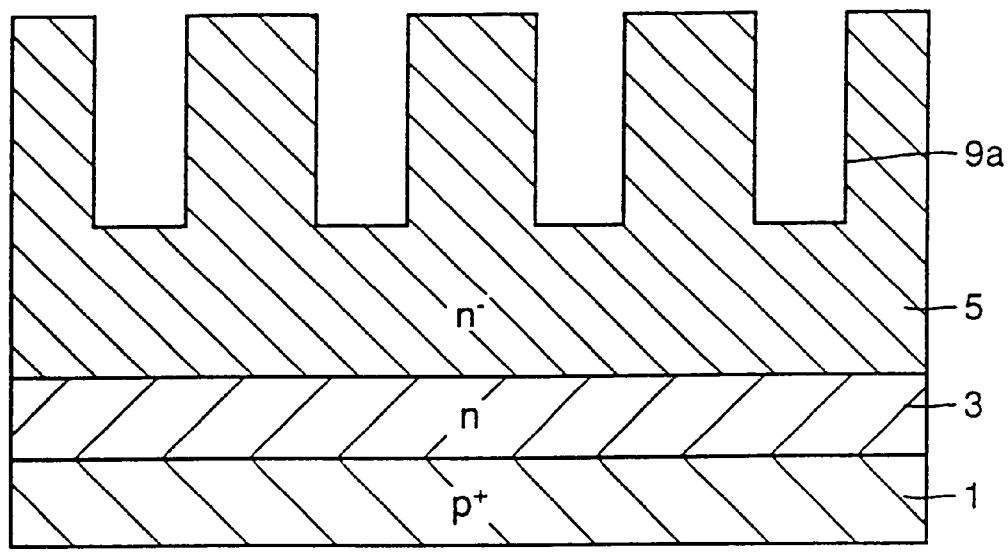

Referring to FIG. 5, trenches 9a are selectively formed, for example, by photolithography and anisotropic plasma etching used in a common semiconductor process, to extend from the surface of n$^-$ region 5 to the inside.

Figure 6:
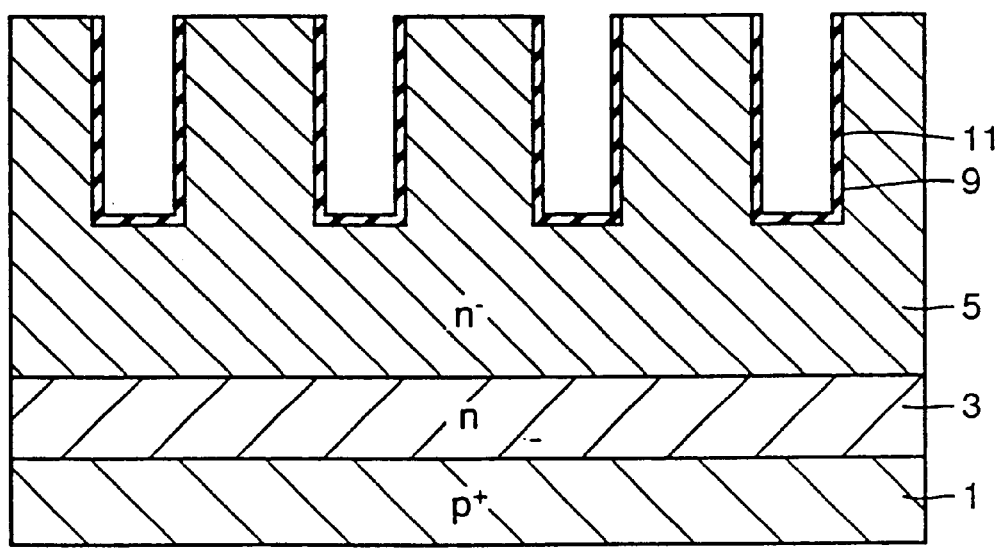

Referring to FIG. 6, an insulating film 11 of, for example, silicon oxide film, which will be the gate insulating film, is formed along the inner wall surface of trench 9 by, for example, thermal oxidation.

Before formation of gate oxide film 11, sacrificial oxidation and isotropic plasma etching (CDE) may be performed to improve MOS characteristic.

Figure 7:
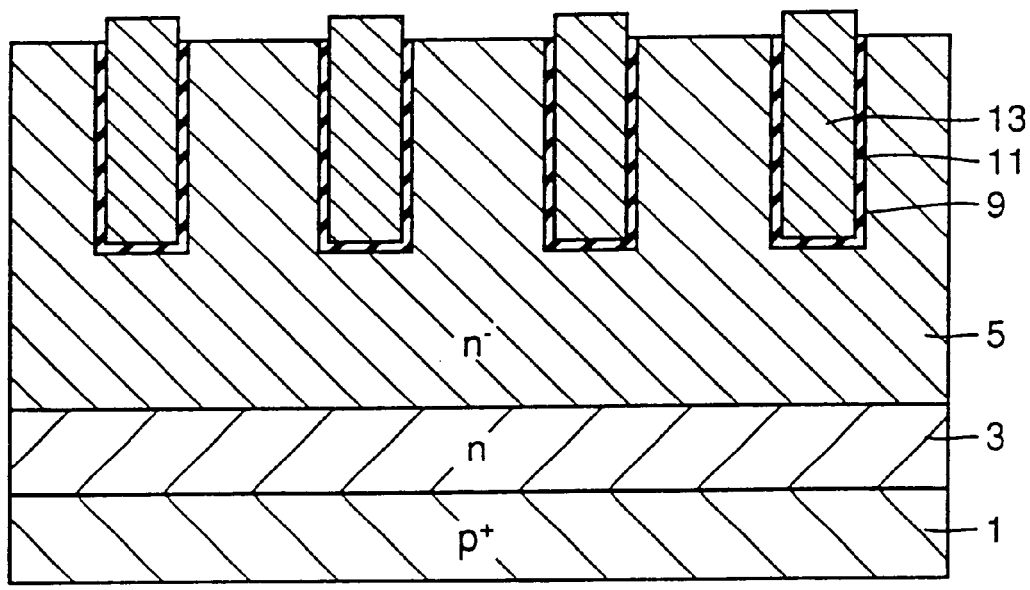

Referring to FIG. 7, gate electrode layer 13 is formed to fill the trench 9 with its upper end protruding from trench 9 by common photolithography and etching technique. Gate electrode layer 13 is formed of a imaterial such as polycrystalline silicon doped with an n type impurity such as phosphorus (hereinafter referred to as doped polysilicon).

Figure 8:
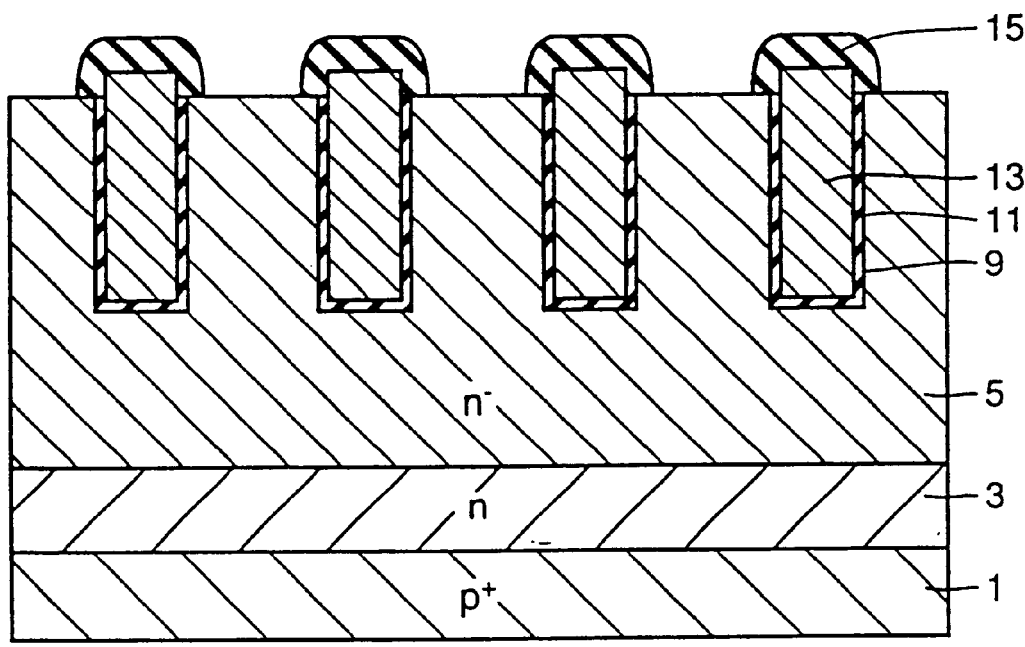

Referring to FIG. 8, an insulating film 15 formed of a silicon thermal oxide film and a CVD oxide film such as BPSG is formed to cover the upper end of gate electrode layer 13 protruding from trench 9.

Figure 9:
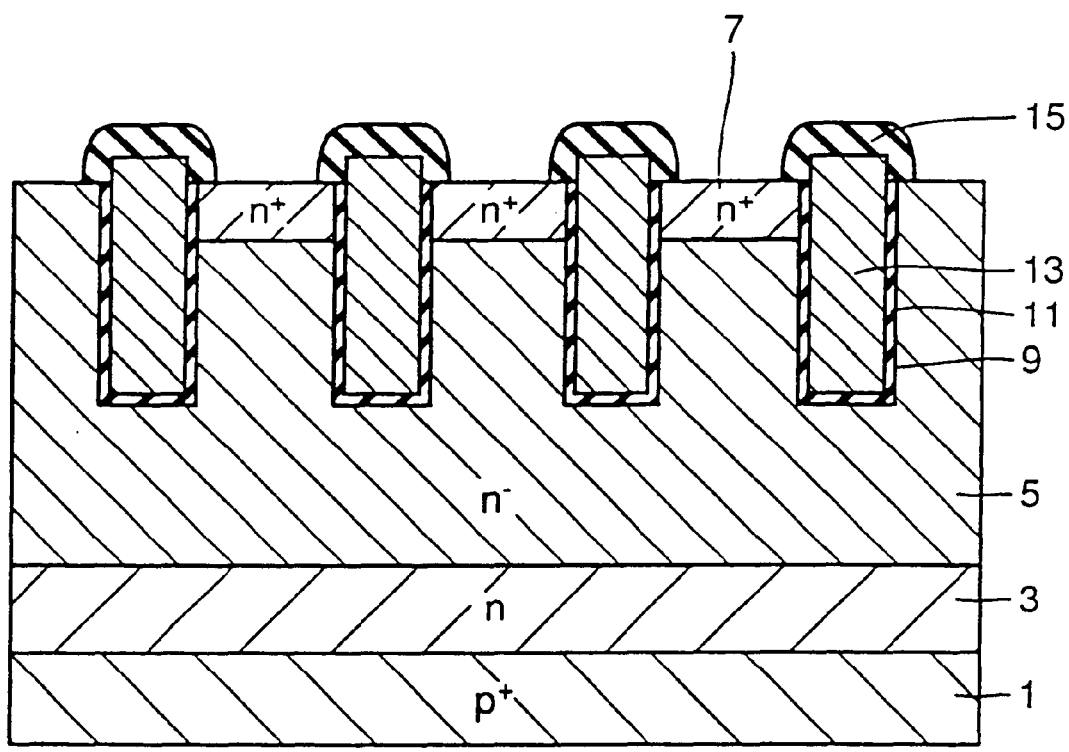

Referring to FIG. 9, thereafter, selective ion implantation of n type impurity element such as Sb, As, P or the like is performed to the surface of n$^-$ region 5 sandwiched between the trenches 9. Thereafter, introduced impurity is diffused by heat treatment, for example, and n$^+$ cathode region 7 is formed entirely at the surface of n$^-$ region 5 sandwiched between the trenches. The cathode region 7 is made shallower than the depth of trench 9.

Thereafter, the cathode electrode 17 is formed to be electrically connected to cathode region 7, and anode electrode 19 is formed to be electrically connected to p$^+$ collector region 1. Thus, the semiconductor device shown in FIGS. 2 and 3 is completed.

The method of operating the semiconductor device in accordance with a present embodiment will be described.

Referring to FIG. 3, on-state is realized by applying a small positive voltage to the gate electrode layer 13. In this case, current flows from $p^+$ collector region 1 to $n^+$ cathode region 7. This operation is the same as the pin diode, so that electrons are introduced from $n^+$ cathode region 7 to $n^-$ semiconductor substrate 5, holes are introduced from $p^-$ collector region 1, whereby conductivity modulation occurs in $n^-$ substrate 5. Thus, on-state voltage becomes lower.

Off-state is realized by applying a negative voltage to gate electrode layer 13. When a negative voltage is applied to gate electrode layer 13, a depletion layer extends around the trench 9, the current path of the main current is cut off, and thus the device can be turned off.

In the semiconductor device in accordance with the present embodiment, gate electrode layer 13 opposes to $n^-$ region 5 and the sidewall of cathode region 7 with insulating film 11 interposed, as specifically shown in FIG. 3. In other words, the control method by the gate electrode layer 13 is of voltage controlled type. Therefore, different from SITh in which gate is formed by pn junction, gate electrode layer 13 never extracts a part of the main current as gate current in the turn off operation. Therefore, it is not necessary to provide large current to the gate control circuit. Therefore, the gate drive circuit can be simplified, it is not necessary to provide a protecting circuit in consideration of a surge current which is generated when a gate current flows, and a cooling apparatus in consideration of heat radiation is not necessary, either. Therefore, as compared with the first and second prior art examples, gate control circuit can be simplified in the semiconductor device in accordance with the present embodiment, and the system as a whole can be reduced in size, simplified and enables low energy loss.

Further, the pin diode is a bipolar device. In the bipolar device, both holes and electrons contribute to the operation. Therefore, even if the substrate thickness is increased to meet the demand of higher breakdown voltage, especially the thickness $T_0$ of $n^-$ region 5 of FIG. 3 is increased and current path when the pin diode operates becomes longer, there will be conductivity modulation generated by holes and electrons. Therefore, on-state voltage can be maintained low. Therefore, increase in steady loss can be suppressed and the amount of heat radiation can be reduced.

Figure 10:
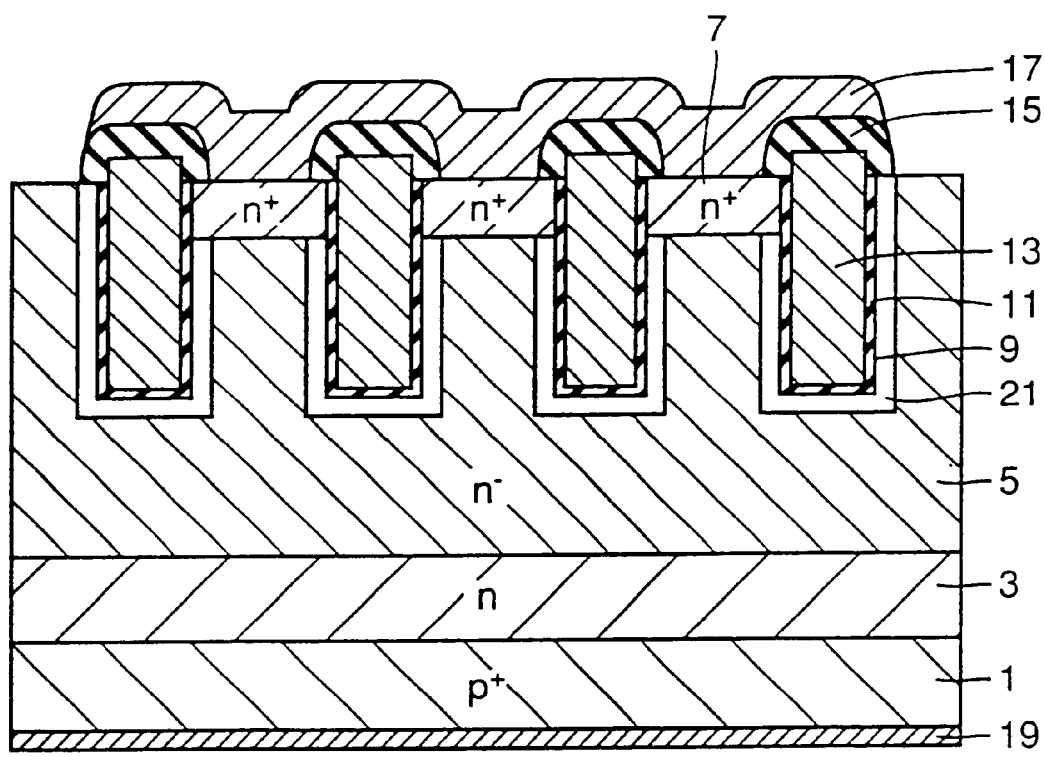
FIG. 10 is a schematic cross sectional view showing a main current conducting state of the semiconductor device in accordance with Embodiment 1 of the present invention.

Further, as shown in FIG. 3, gate electrode layer 13 opposes to $n^-$ region 5 and cathode region 7, as shown in FIG. 3. Therefore, when a positive voltage is applied to gate electrode layer 13 at on-state, there is generated an $n^+$ accumulation region 21 where the large number of electrons are pulled, around the trench 9, as shown in FIG. 10. Therefore, $n^+$ region serving as cathode region 7 is enlarged.

Now, as a method of improving on-state voltage Vf of the diode, it has been known to increase effective cathode area, as already described. The effective area of cathode here means the interface area between $n^-$ region and $n^+$ region, and $n^+$ region connected with cathode electrode.

In the semiconductor device in accordance with the present embodiment, since there is generated $n^+$ accumulation region 21 as shown in FIG. 10, $n^+$ cathode region 7 is enlarged. Therefore, the contact area between the entire effective cathode region including $n^+$ cathode region 7 plus $n^+$ accumulation region 21 and $n^-$ region 5 is enlarged. Thus, injection efficiency of electron on the side of the cathode can be improved, and on-state voltage Vf of the diode can be reduced. In this manner, even when the first main surface (cathode side) is the $n^+$ cathode region in its entirety, it becomes possible to reduce on loss by increasing $n^+$ region in the semiconductor chip as a whole, by enlarging effective cathode region. In other words, power loss of the semiconductor device can be reduced. In the semiconductor device in accordance with the present embodiment, since $n^+$ cathode region 7 is formed entirely at the first main surface on the cathode side, as compared with the example in which n region and p region exist at the first main surface (FIGS. 100 to 102), the electron current entering from the cathode side flows uniformly through the first main surface of the semiconductor device sandwiched by the trenches 9. Therefore, partial increase of current density can be prevented, and good on characteristic is obtained.

Embodiment 2

Figure 11:
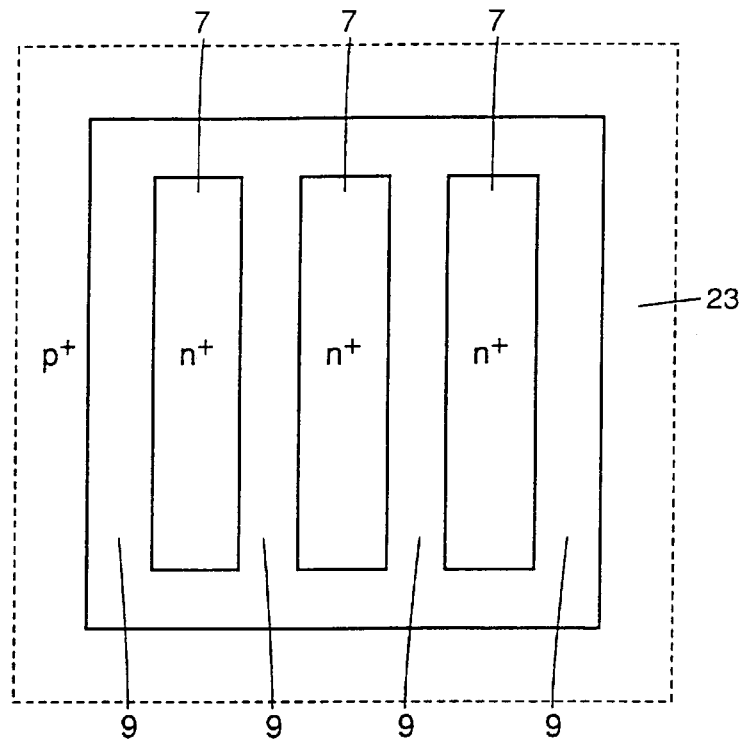
FIG. 11 is a schematic plan view showing a structure of a semiconductor device in accordance with Embodiment 2 of the present invention.
Figure 12:
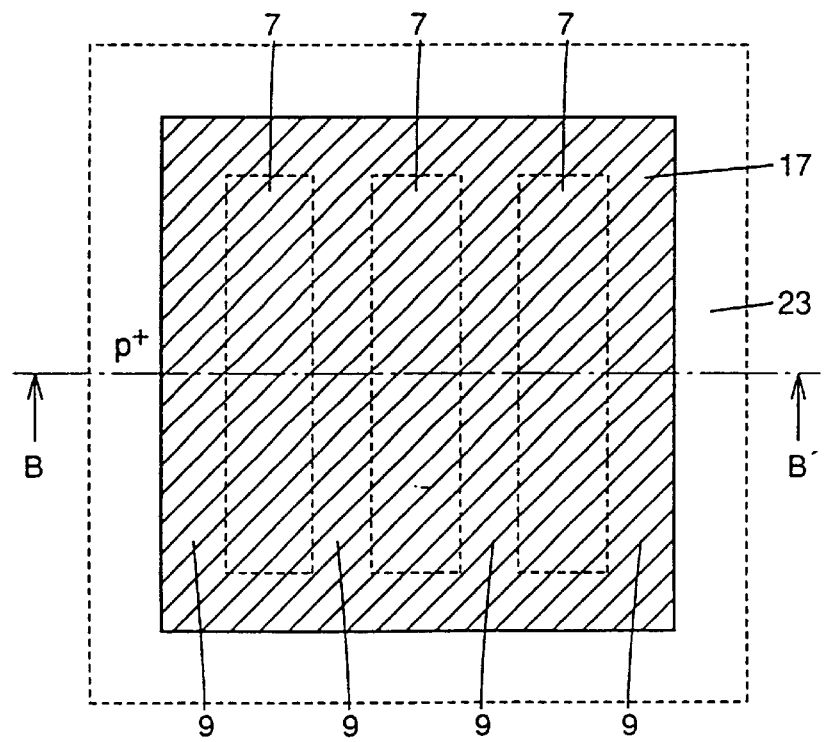
FIG. 12 is a schematic plan view showing the device of FIG. 11 with cathode electrode provided.
Figure 13:
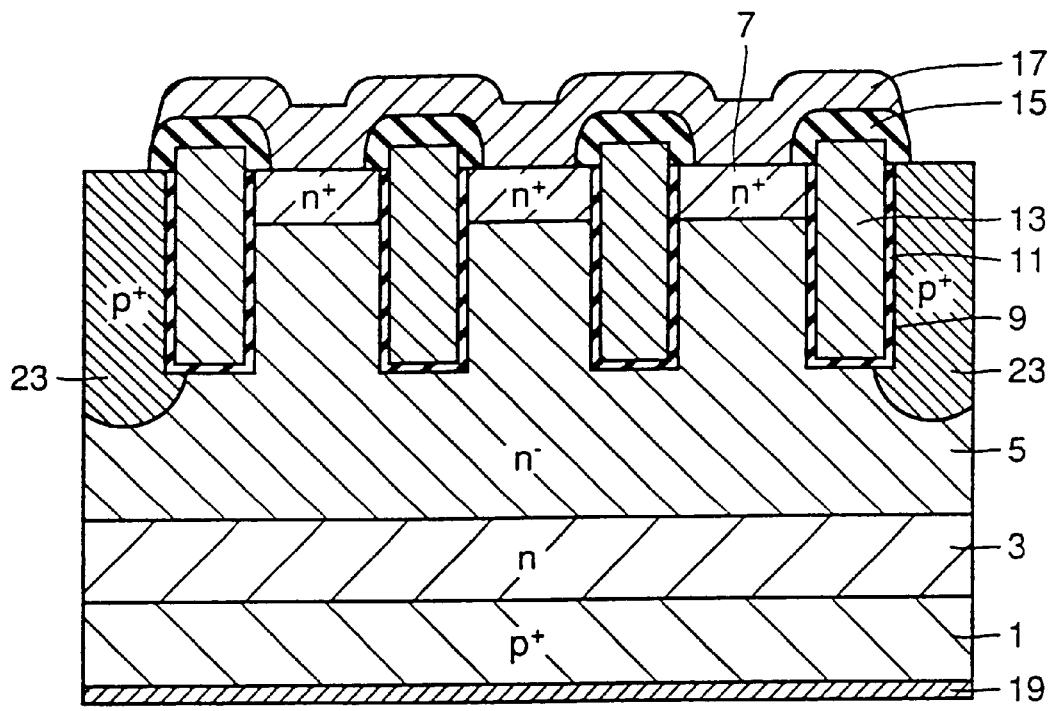
FIG. 13 is a schematic cross sectional view taken along the line B–B' of FIG. 12.

Referring to FIGS. 11 to 13, as compared with the semiconductor device in accordance with Embodiment 1, the semiconductor device of the present embodiment is different in that a $p^+$ isolation impurity region 23 is provided.

The $p^+$ isolation impurity region 23 is formed at the surface of $n^-$ region 5 to surround planer region of diode forming region and to be in contact with trenches 9. Further, $p^-$ isolation impurity region 23 is made deeper than trench 9.

Except this point, the present embodiment is the same as Embodiment 1. Therefore, corresponding portions are denoted by the same reference characters and description thereof is not repeated.

The method of manufacturing the semiconductor device in accordance with the present embodiment will be described.

The method of manufacturing the semiconductor device in accordance with the present embodiment first includes the same steps as Embodiment 1 shown in FIG. 4. Thereafter, referring to FIG. 14, a $p^+$ region 23a is formed selectively at a position surrounding the diode forming region, by deposition or ion implantation of an element such as B, serving as p type impurity. Thereafter, heat treatment or the like is performed.

Figure 15:
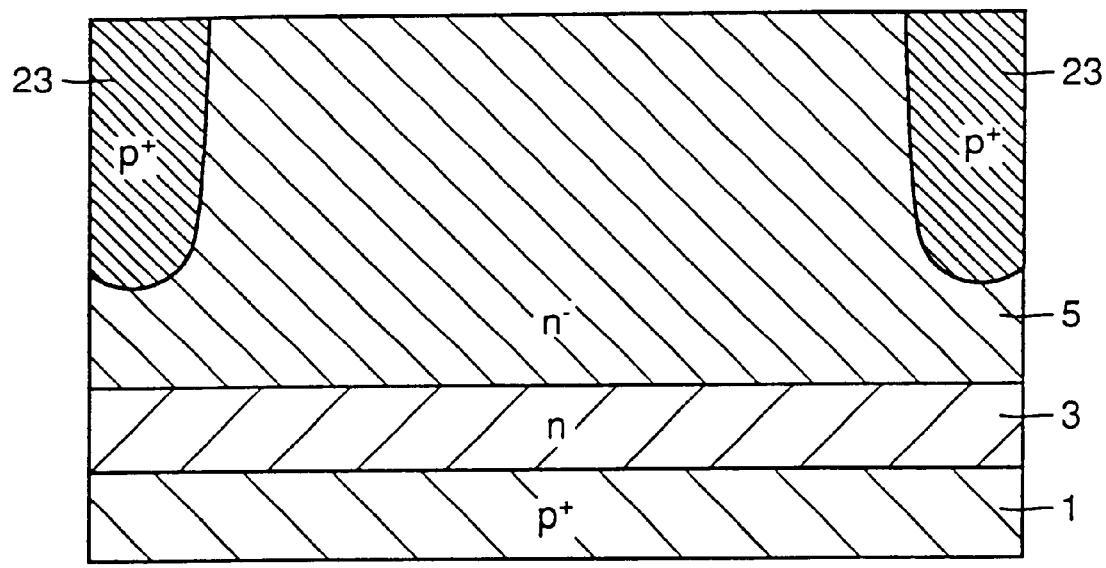

Referring to FIG. 15, by the above described heat treatment, p type impurity is diffused, and $p^+$ isolation impurity region 23 is formed at a prescribed position.

Figure 16:
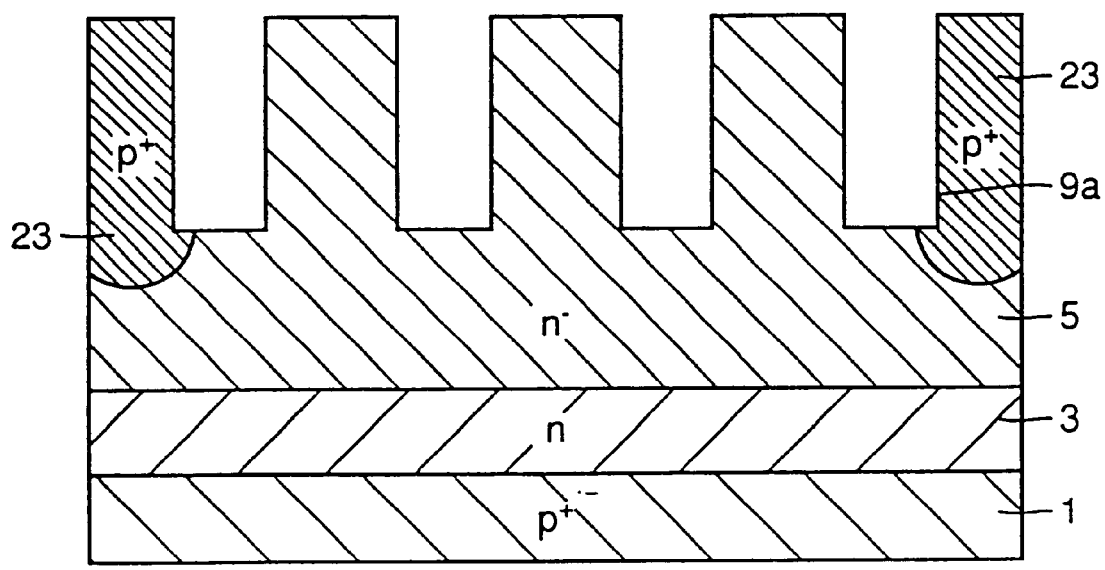

Referring to FIG. 16, thereafter, a trench 9a is formed having portions extending parallel to each other at the surface of $n^-$ region 5. Thereafter, approximately similar processes as in Embodiment 1 are performed. Therefore, the description thereof is not repeated.

The method of operating the semiconductor device by the gate is approximately the same as Embodiment 1.

Referring to FIG. 13, the $p^+$ isolation impurity region 23 is connected to cathode electrode 17 by an inverted layer formed around gate electrode layer 13, when a negative voltage is applied to gate electrode layer 13. Therefore, the pn junction formed by $p^+$ isolation impurity region 23 and $n^-$ region 5 is reversely biased. Therefore, main breakdown voltage maintaining capability of the device can be enhanced.

According to a semiconductor device of the present embodiment, p type impurity region 23 is formed deeper than trench 9 to surround diode forming region, as shown in FIGS. 12 and 13. Therefore, $p^+$ isolated region 23 is electrically isolated from the diode at on-state, on-state voltage can be maintained low. And, $p^+$ isolated region 23 is electrically connected cathode electrode 17 at off-state, breakdown voltage can be improved.

Embodiment 3

Figure 17:
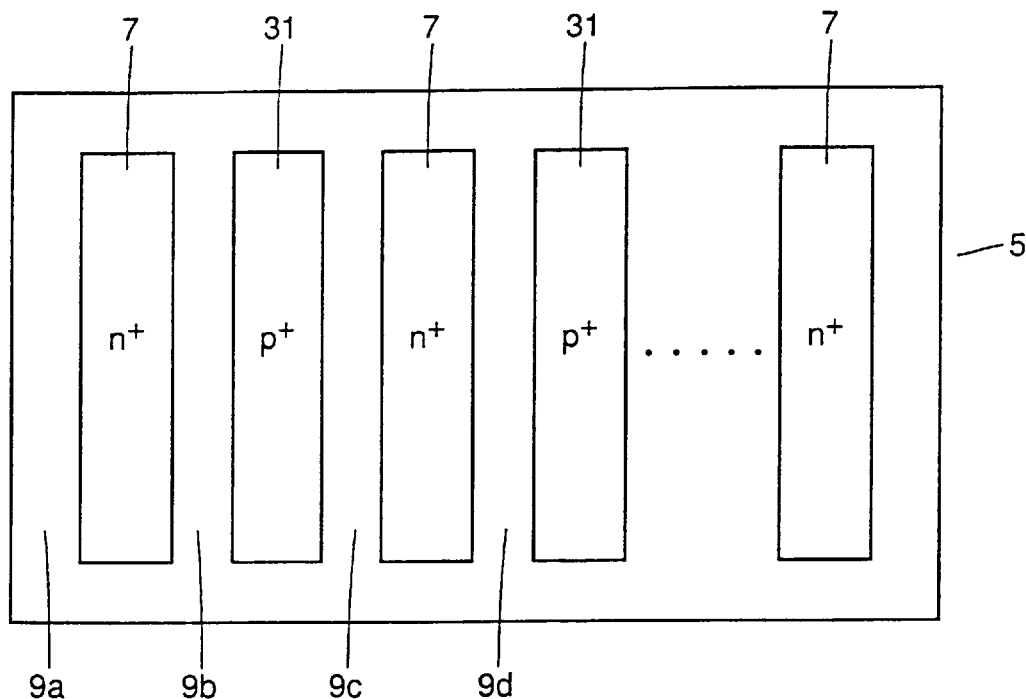
FIG. 17 is a schematic plan view showing the structure of the semiconductor device in accordance with Embodiment 3 of the present invention.
Figure 18:
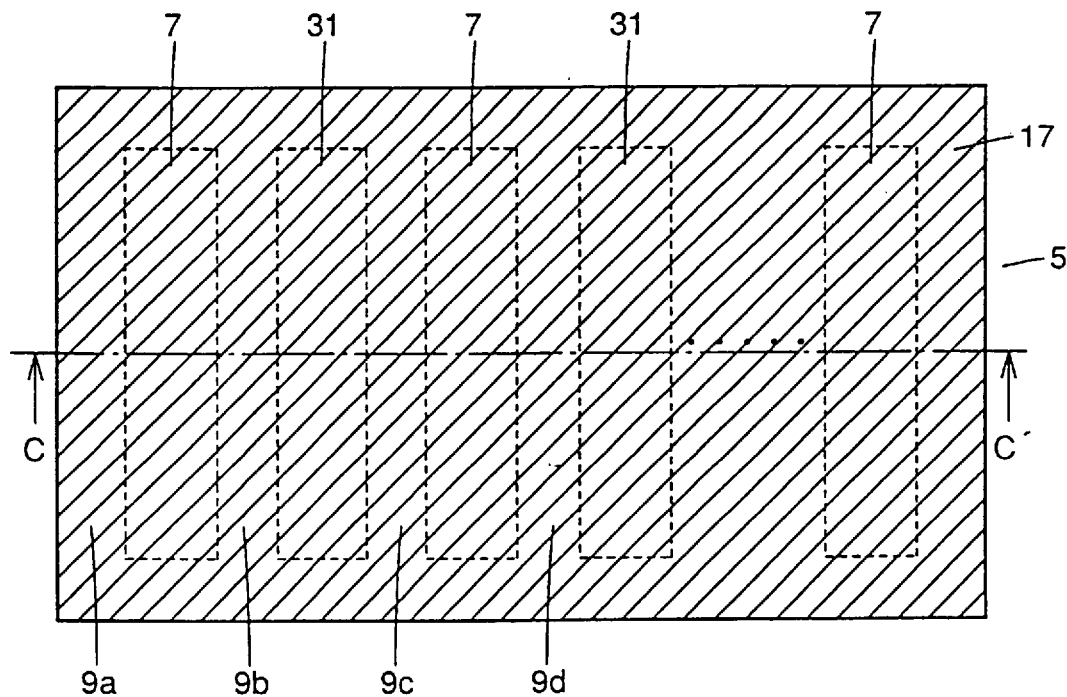
FIG. 18 is a schematic plan view showing the device of FIG. 17 with cathode electrode provided.
Figure 19:
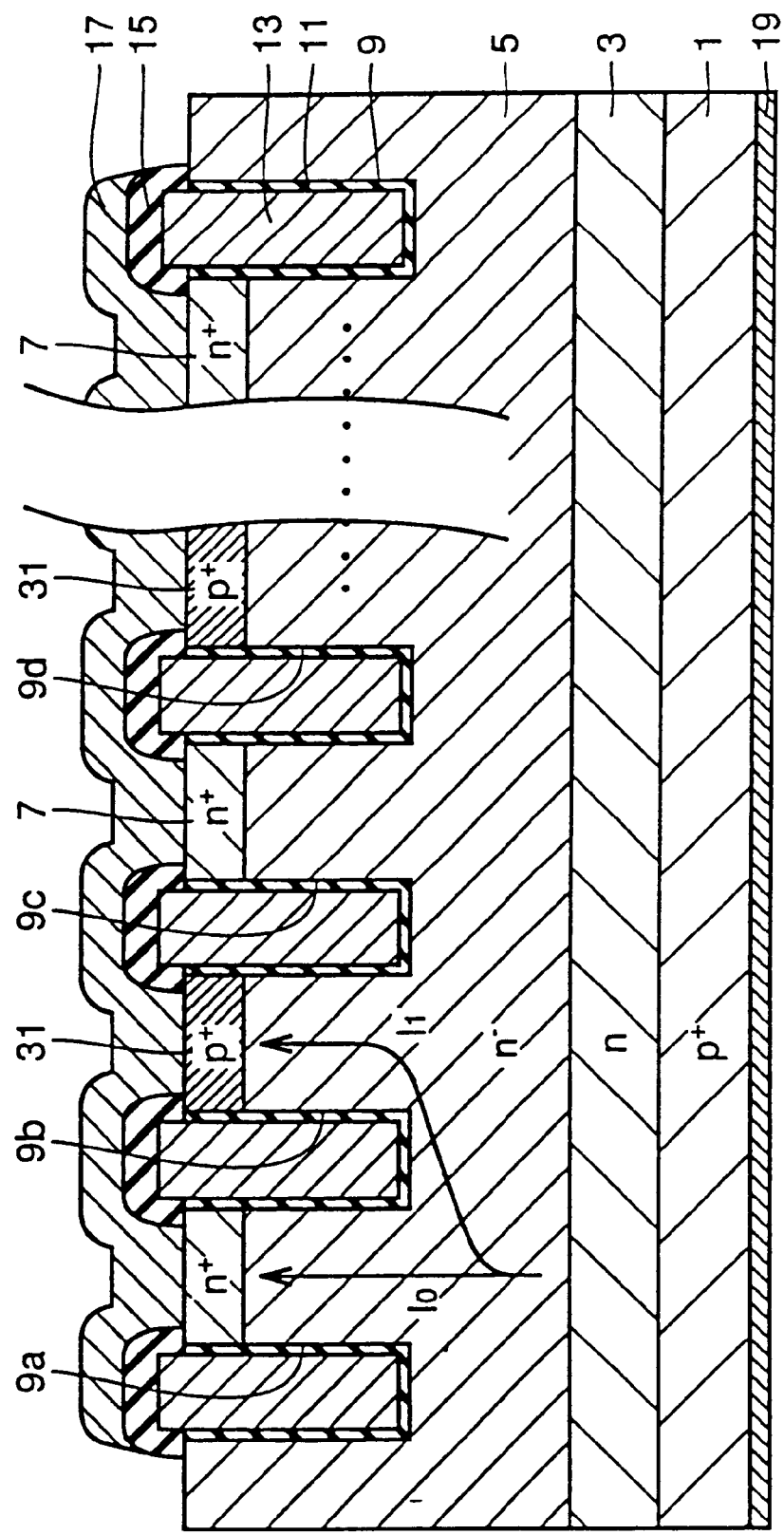
FIG. 19 is a schematic cross section taken along the line C–C' of FIG. 18.

Referring to FIGS. 17 to 19, the semiconductor device of the present embodiment differs from the semiconductor device of Embodiment 1 in that a p+ high concentration region 31 (hereinafter referred to as p+ contact region) is provided.

The p+ contact region 31 is formed at the first main surface in diode forming region, to be adjacent to n+ cathode region with trenches 9b and 9c interposed. The p+ contact region 31 is formed at the surface region sandwiched by trenches 9b and 9c extending parallel to each other, as shown in FIG. 18. The p+ contact region 31 is electrically connected to cathode electrode 17. The p+ contact region 31 has a surface impurity concentration of at least $1 \times 10^{17}$ cm⁻. The p+ contact region 31 and the n+ cathode region 7 are arranged alternately, with trenches interposed. The number of trenches 9a and 9b, . . . may be arbitrarily selected.

Except this point, the present embodiment is almost similar to Embodiment 1. Therefore, corresponding portions are denoted by the same reference characters and description thereof is not repeated.

The method of manufacturing the semiconductor device in accordance with the present embodiment will be described.

Figure 20:
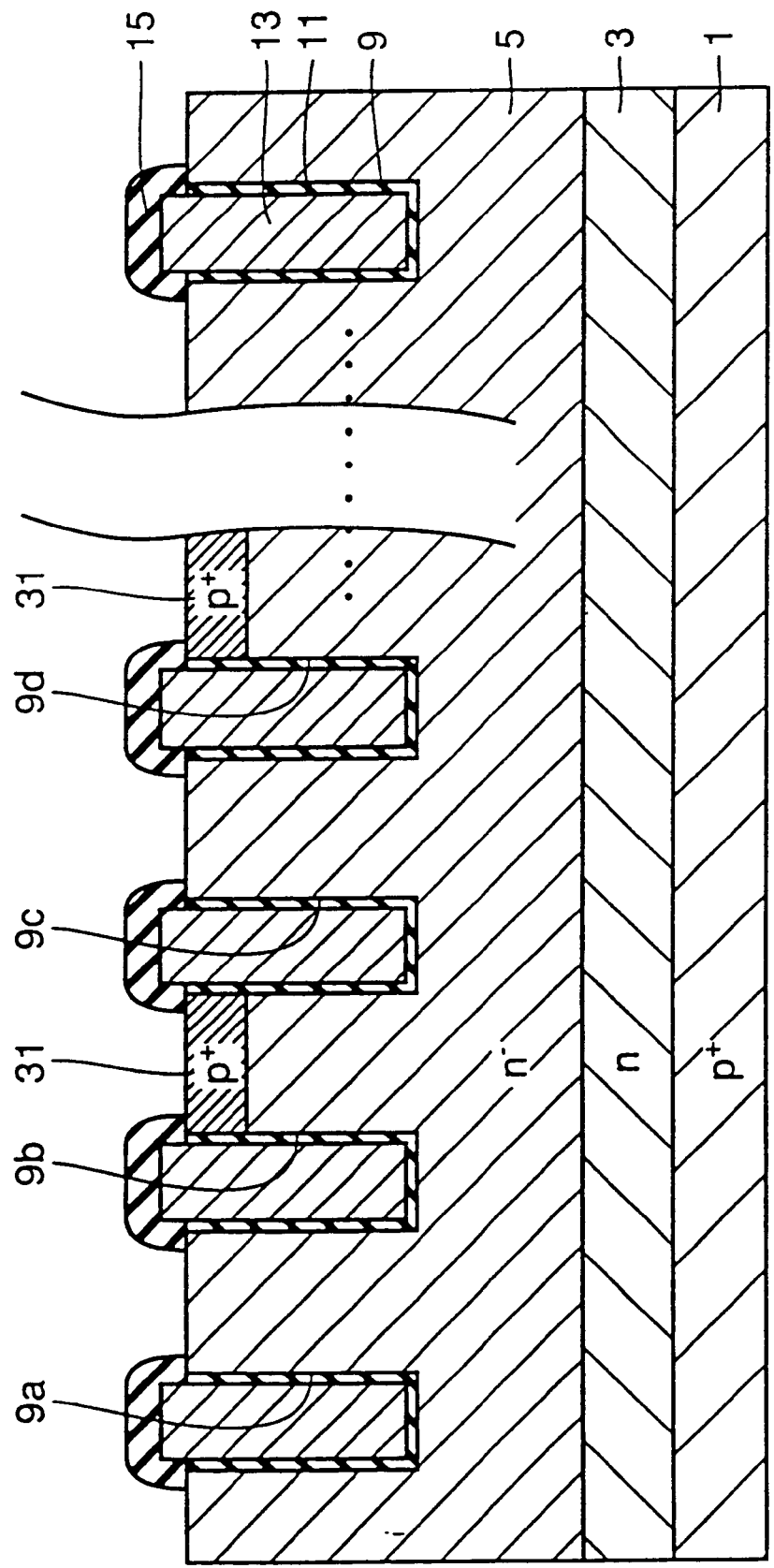
FIGS. 20 and 21 are schematic cross sectional views showing, in order, the steps of manufacturing the semiconductor device in accordance with Embodiment 3 of the present invention.

One of the method of manufacturing the semiconductor device in accordance with the present embodiment includes similar steps as Embodiment 1 shown in FIGS. 4 to 8. Then, referring to FIG. 20, by common photolithography process, portions other than the portion where p+ contact region is to be formed are masked by photoresist, and by ion implantation, depletion or the like of element such as boron serving as p type impurity, a p+contact region 31 is formed at the surface of n⁻ region 5 sandwiched between trenches 9b, 9c and so on extending parallel to each other. The p+ contact region 31 has the depth of about 0.5 μm to about 1.0 μm, and is made shallower than trench 9.

Figure 21:
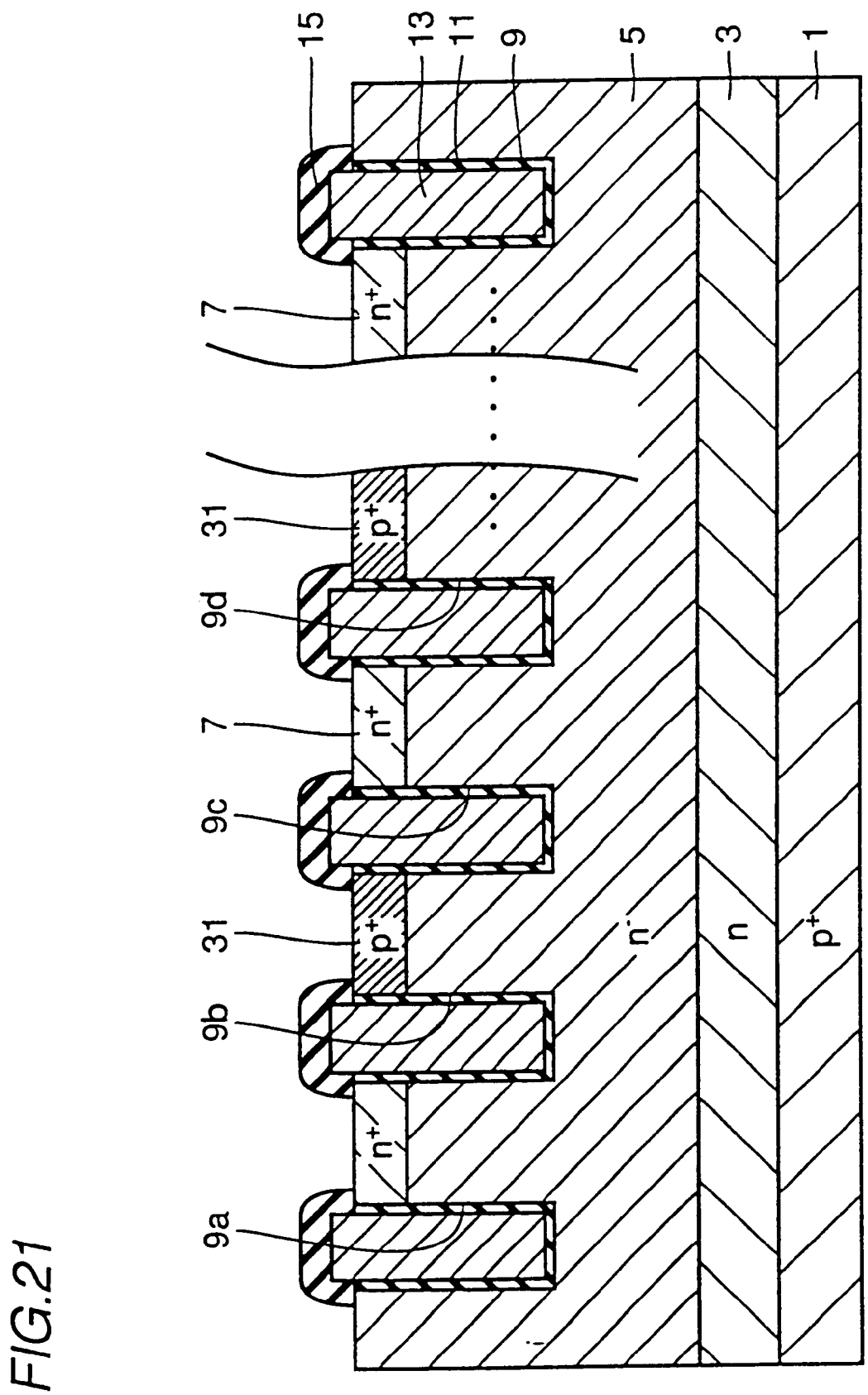

Again, referring to FIG. 21, by the combination of photolithography process and ion implantation process similar to those described above, n+ cathode region 7 is formed entirely at the surface of n⁻ region 5 sandwiched is between trenches 9a and 9b, and 9c and 9d, to be adjacent to p+ contact region 31 with trench 9b or 9c interposed. The following steps are approximately similar to those of Embodiment 1, and therefore, description thereof is not repeated.

The order of forming p+ contact region 31 and n+ cathode region 7 may be reversed. Elements and heat treatment used for diffusion of respective regions may be adjusted in accordance with the desired depth of diffusion.

The method of operating the semiconductor device in the present embodiment is also the same as Embodiment 1. Therefore, description thereof is not repeated.

In the semiconductor device in accordance with the present embodiment, p+ contact region 31 is arranged to be adjacent to n+ cathode region 7 with trench 9b or 9c interposed, as shown in FIG. 19. Therefore, on-state voltage Vf can be reduced, and turn-off time can be reduced. These points will be described in greater detail in the following.

Figure 22:
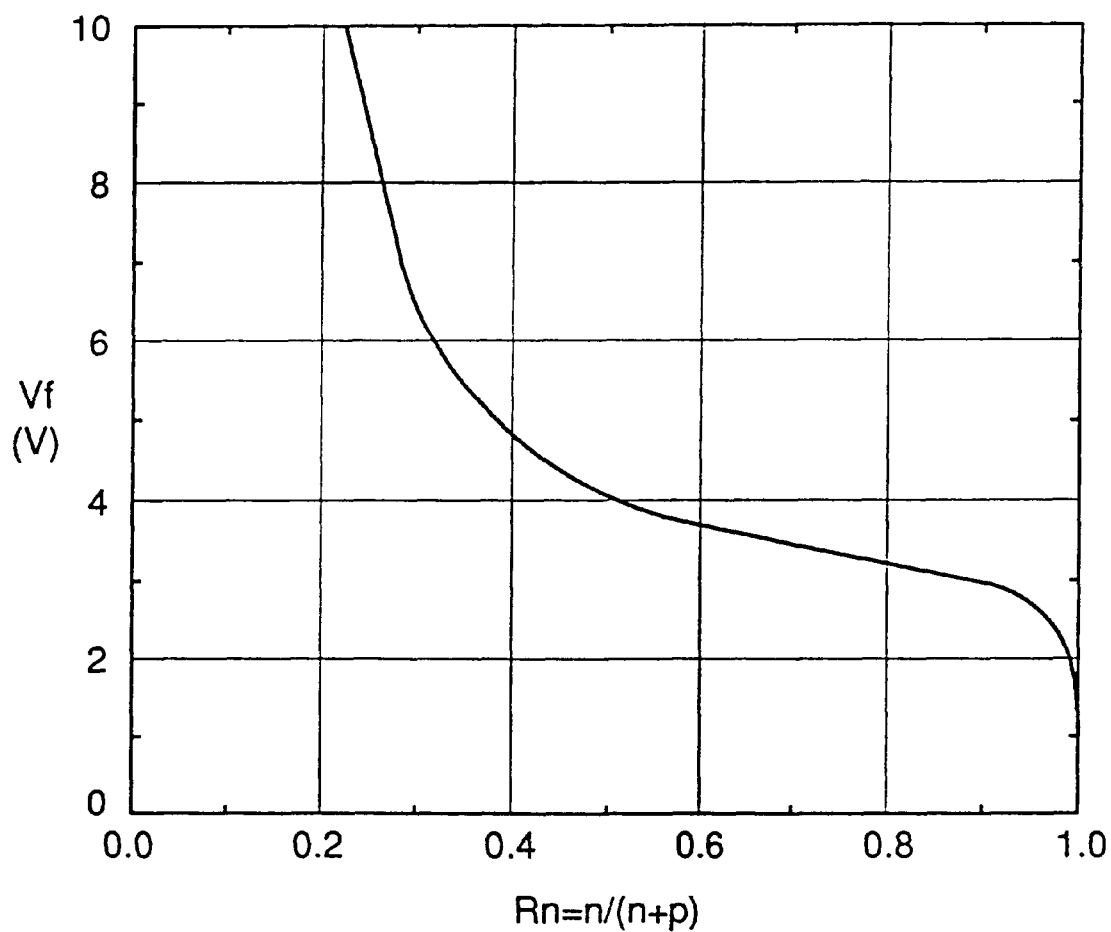
FIG. 22 is a graph showing relation between on-state voltage Vf and the ratio Rn.

FIG. 22 is a graph showing relation between on-state voltage Vf and ratio Rn, which is obtained by a simulation of a general trench IGBT or a trench diode. The ratio Rn here means the ratio of existence of n type impurity region when there are n type impurity region 7 and p type impurity region 31 on the side of the first main surface (cathode side) as shown in FIGS. 18 and 19, which is obtained in accordance with the following equation.

Here, the effective cathode region includes n+ accumulation region 21 (FIG. 10) provided when a positive voltage is applied to the gate electrode.

$$Rn = n^+ \text{ region (effective cathode region)}/(n^+ \text{ region (effective cathode region)} + p \text{ type region}) \quad (1)$$

As is apparent from FIG. 22, the larger the ratio Rn, that is, the larger the ratio of existence of n type impurity region, the lower the on-state voltage Vf. Accordingly, on-state voltage can be minimized, when there is no p type impurity region (that is, when the ratio Rn=1).

As shown in FIG. 19, in the semiconductor device in accordance with the present embodiment, p+ contact region 31 is provided adjacent to n+ cathode region 7. Therefore, hole current $I_1$ is drawn out from p+ contact region 31 to cathode electrode 17. Hole current $I_1$ is a part of the total hole current at turn-off. Therefore, current I flowing though the diode is reduced, and especially the tail current tends to decrease quickly. Thus, the turn-off time can be reduced.

Accordingly, in the semiconductor device in accordance with the present embodiment, by adjusting the ratio of existence of cathode region 7 and p+ contact region 31 at the surface of n⁻ region 5, optimum on-state voltage Vf and turn-off time in accordance with various diode properties can be selected in accordance with the expression (1) above.

Embodiment 4

Figure 23:
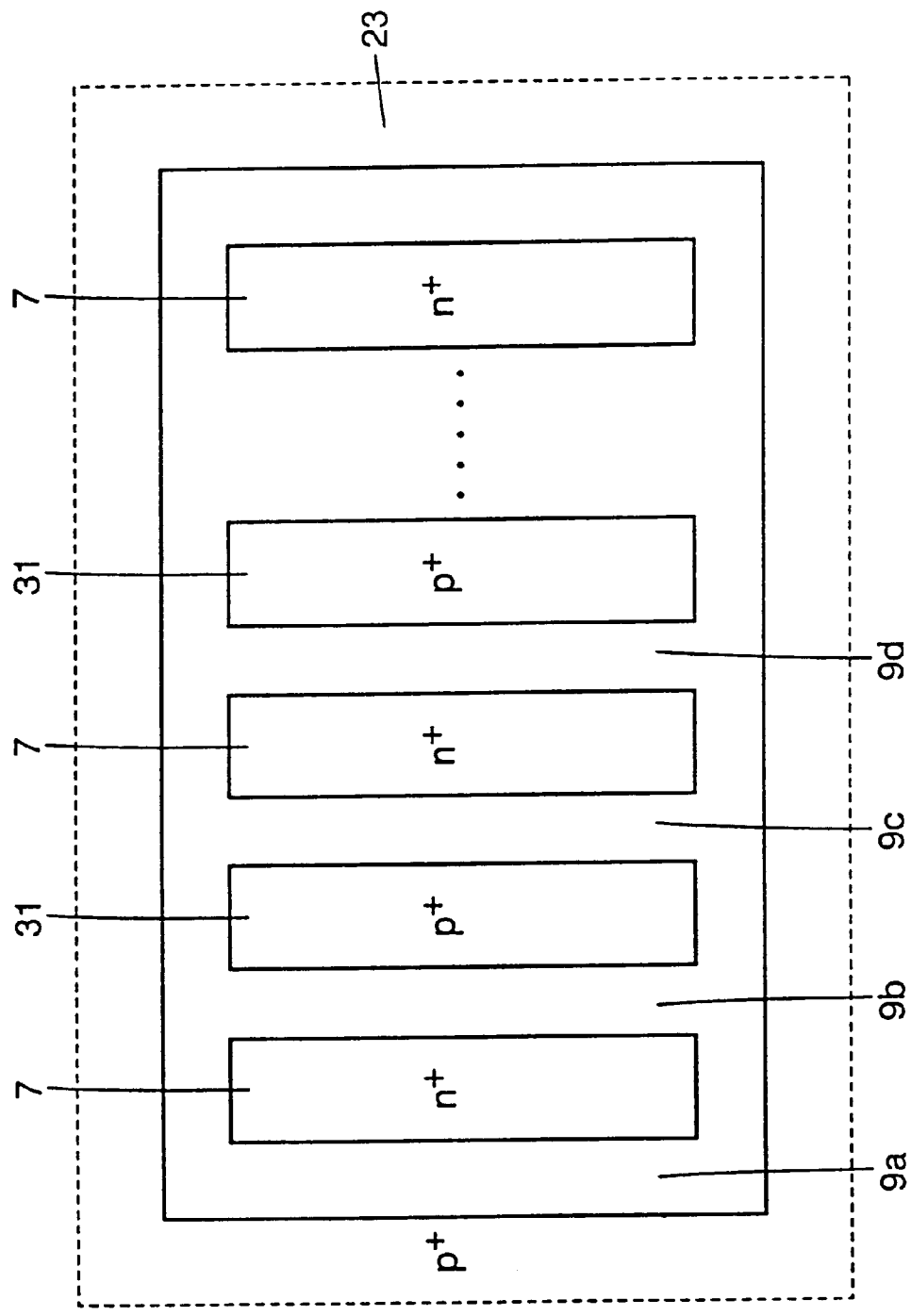
FIG. 23 is a schematic plan view showing a structure of the semiconductor device in accordance with Embodiment 4 of the present invention.
Figure 24:
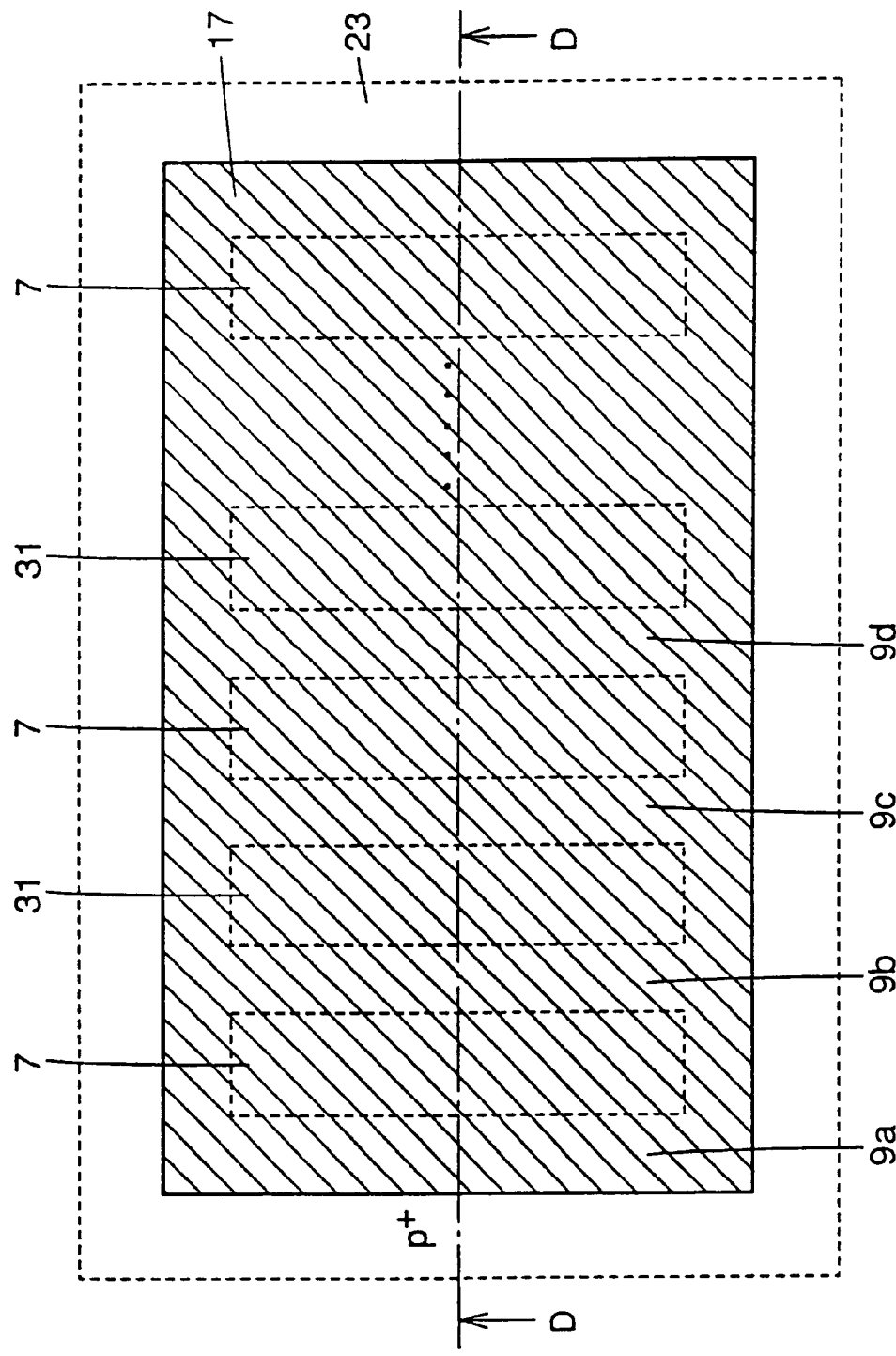
FIG. 24 is a schematic plan view showing the device of FIG. 23 with cathode electrode provided.
Figure 25:
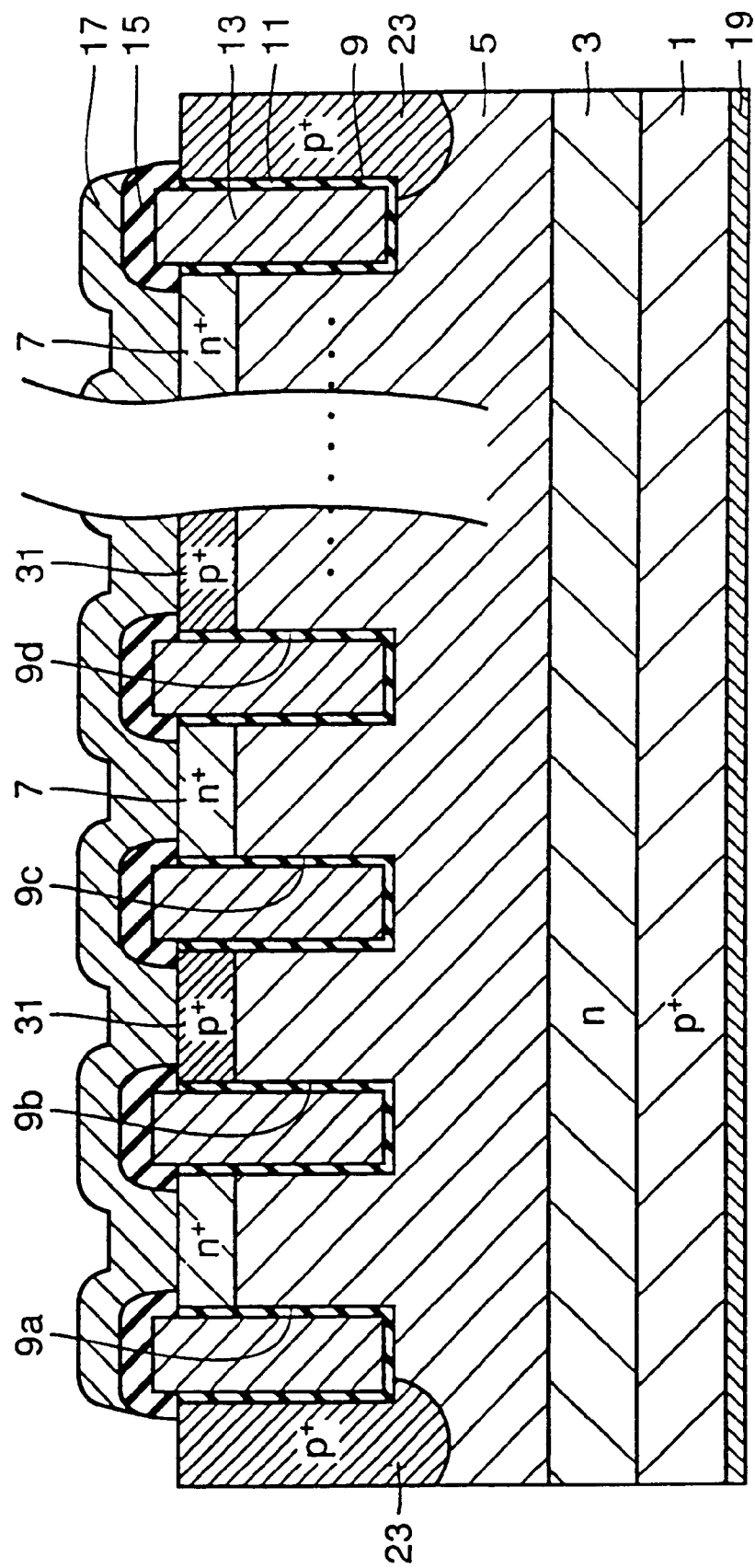
FIG. 25 is a schematic cross sectional view taken along the line D–D' of FIG. 24.

Referring to FIG. 23 to 25, the semiconductor device in accordance with the present embodiment differs from Embodiment 3 in that a p+ isolation impurity region 23 is provided.

The p+ isolation impurity region 23 is formed at the surface of n⁻ region 5 to surround the planer region of the diode forming region and to be in contact with trench 9. The p+ isolation impurity region 23 is made deeper than the trench 9.

Except these points, the present embodiment is the same as Embodiment 3. Therefore, corresponding portions are denoted by the same reference characters and description thereof is not repeated.

Referring to FIG. 25, the p+ isolation impurity region 23 is connected to cathode electrode 17 by an inverted layer formed around gate electrode layer 13, when a negative voltage is applied to gate electrode layer 13. Therefore, the pn junction formed by p+ isolation impurity region 23 and n⁻ region 5 is reversely biased. Therefore, main breakdown voltage maintaining capability of the device can be enhanced.

According to a semiconductor device of the present embodiment, p type impurity region 23 is formed deeper than trench 9 to surround diode forming region, as shown in FIGS. 24 and 25. Therefore, p+ isolated region 23 is electrically isolated from the diode at on-state, on-state voltage can be maintained low. And, p+ isolated region 23 is electrically connected cathode electrode 17 at off-state, breakdown voltage can be improved.

Embodiment 5

Figure 26:
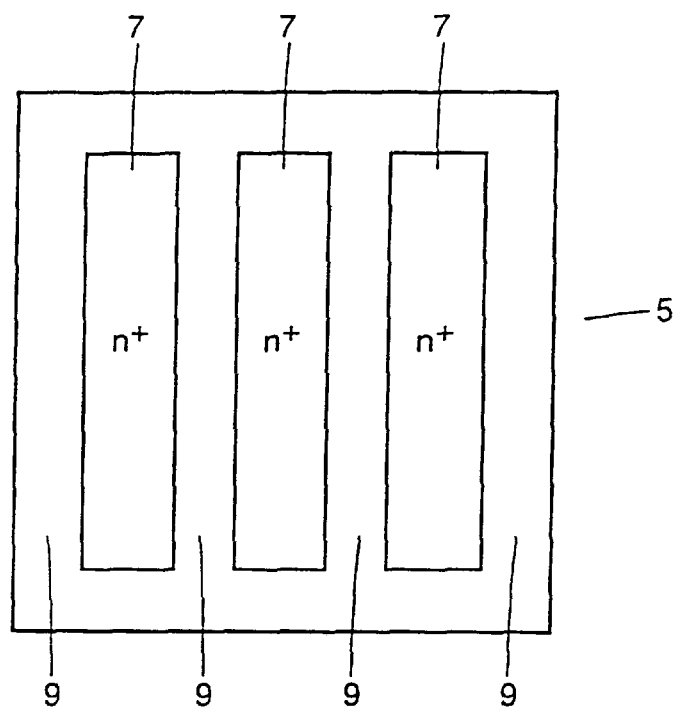
FIG. 26 is a schematic plan view showing a structure of a semiconductor device in accordance with Embodiment 5 of the present invention.
Figure 27:
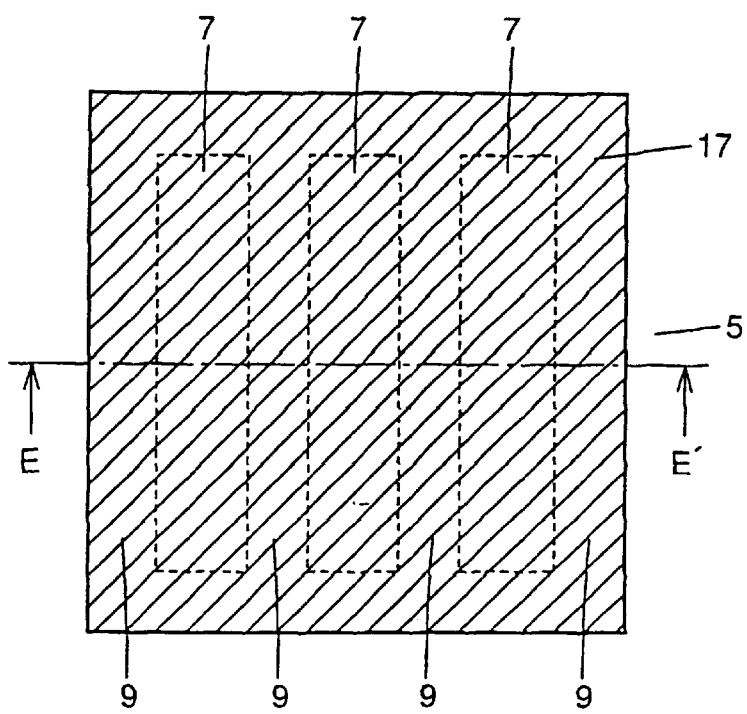
FIG. 27 is a schematic plan view showing the device of FIG. 26 with cathode electrode provided.
Figure 28:
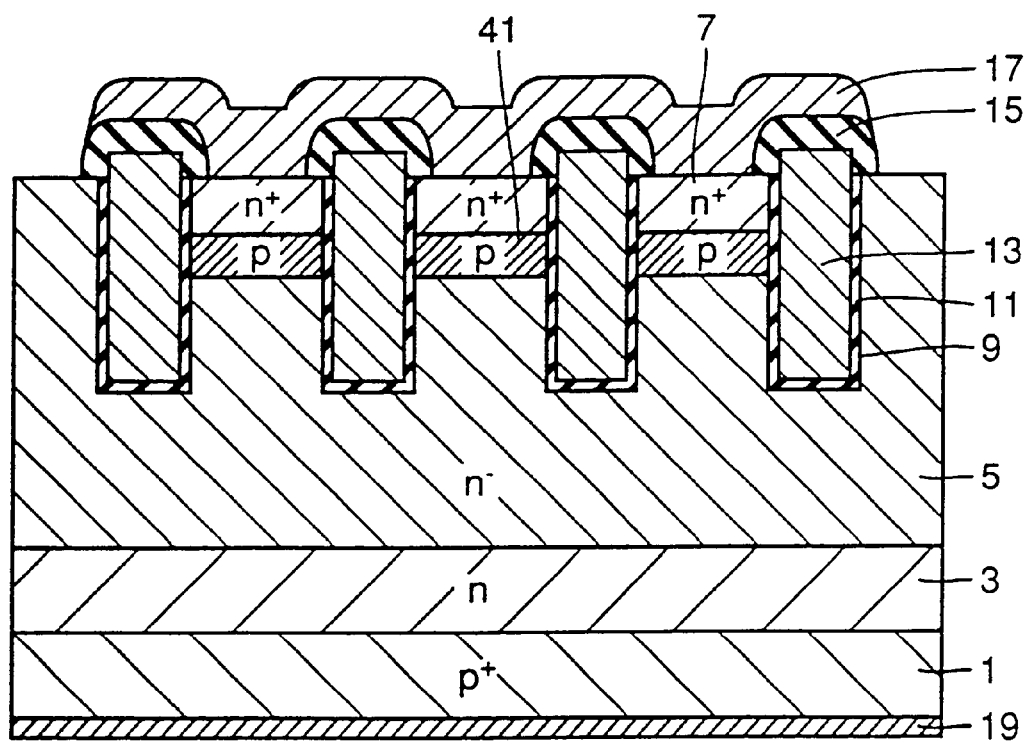
FIG. 28 is a schematic cross sectional view taken along the line E–E' of FIG. 27.

Referring to FIGS. 26 to 28, the present embodiment shows an example which has four layered pnpn thyristor. The four layered pnpn diode includes p+ collector region 1, an n type buffer region 3, an n⁻ region 5, a p type base region 41 and an n⁺ cathode region 7. These p⁺ collector region 1, n type buffer region 3, n⁻ region 5, p type base region 41 and n⁺ cathode region 7 are stacked successively. From the surface of n⁺ cathode region 7, a trench 9 is formed to reach n⁻ region 5 through n⁺ cathode region 7 and p type base region 41, and to have portions extending parallel to each other. The n⁺ cathode region 7 is formed entirely at the surface sandwiched between the trench 9 extending parallel to each other.

The p type base region 41 has peak impurity concentration of from $1\times10^{14}$ cm⁻³ to $5\times10^{17}$ cm⁻³, and the n⁺ cathode region 7 has a surface impurity concentration of at least $1\times10^{17}$ cm⁻³. The surface impurity concentration of n⁺ cathode region 7 is higher than the peak impurity concentration of p type base region 41.

Other structures are the same as those of Embodiment 1. Therefore, corresponding portions are denoted by the same reference characters and description thereof is not repeated.

The method of manufacturing the semiconductor device in accordance with the present embodiment will be described.

Figure 29:
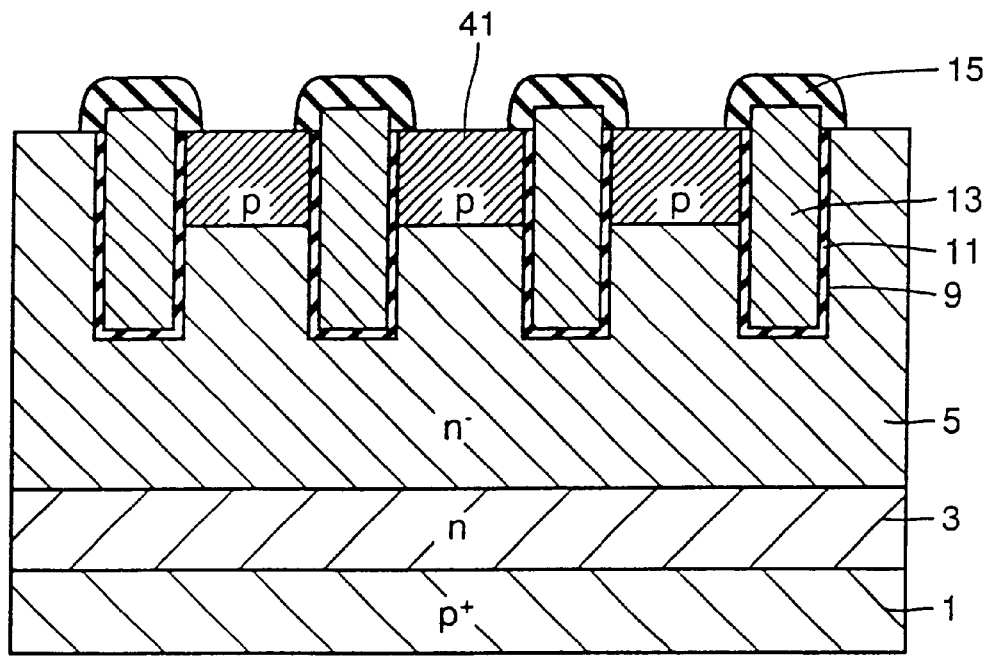
FIGS. 29 and 30 are schematic cross sectional views showing, in order, the steps of manufacturing the semiconductor device in accordance with Embodiment 5 of the present invention.

First, the method of manufacturing of the present embodiment includes the same steps as those of Embodiment 1 shown in FIGS. 4 to 8. Thereafter, referring to FIG. 29, p type base region 41 is formed at a portion of the first main surface of n⁻ region 5 sandwiched by parallel trenches 9 by ion implantation and diffusion, for example. The p type base region 41 is formed such that it has peak impurity concentration of $1\times10^{14}$ cm⁻³ to $5\times10^{17}$ cm⁻³, and that is shallower than trench 9 and deeper than n⁺ cathode region 7, which will be described later. That is, it is formed to have the depth of 1.0 μm to 15.0 μm, for example.

Figure 30:
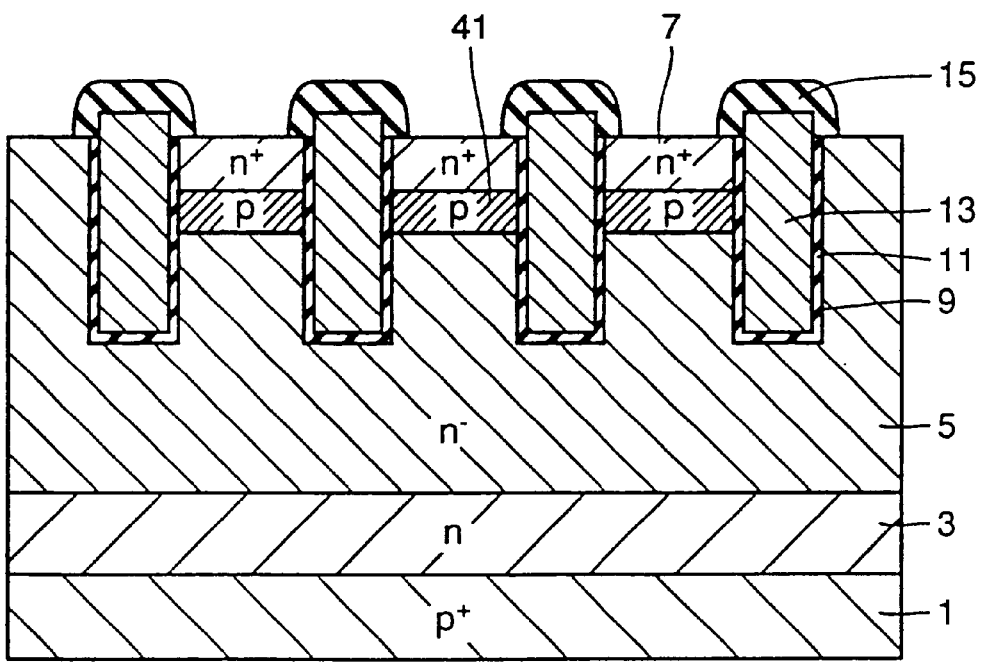

Referring to FIG. 30, n⁺ cathode region 7 is formed by ion implantation and diffusion, for example, at the first main surface sandwiched by trenches 9 extending parallel to each other. The n⁺ cathode region 7 is formed such that it has surface impurity concentration of at least $1\times10^{18}$ cm⁻³ and that it is shallower than p type base region 41. Subsequent steps are the same as those of Embodiment 1. Therefore, description thereof is not repeated.

The method of operating the semiconductor device in accordance with the present embodiment will be described.

On-state is realized by applying a positive voltage to gate electrode layer 13 shown in FIG. 28. When a positive voltage is applied to gate electrode layer 13, the portion of p type base region 41 which opposes to gate electrode layer 13 is inverted to n⁺ region, thus providing a channel and electron current flows. Then, corresponding to the electron current, holes are introduced from p⁺ anode region 1 to n⁻semiconductor substrate 5, causing conductivity modulation. Further, the hole current eventually enters p base region 41. When this current increases, the potential and p type base region 41 increases, and if the potential becomes larger than the internal potential, the diode provided by p type base region 41 and n⁺ cathode region 7 becomes turned on. Thus, current flows from n⁺cathode region 7 through p base region 41 directly to n⁻semiconductor substrate 5. Thus the four layered pnpn thyristor turns on, realizing on-state of the present embodiment.

Off-state is realized by applying a negative voltage to gate electrode layer 13 shown in FIG. 28. When a negative voltage is applied to gate electrode layer 13, n⁺ channel, which was formed in the on state, is eliminated, supply of electrons from n⁺ cathode region is stopped, and simultaneously, depletion layer extends from gate electrode layer 13 to n⁻ region 5. Thus, current path is pinched off, and current is reduced. And the device is turn off, when current is smaller than holding current of the thyristor provided by n⁺ cathode 7, p type base region 41, n⁻ region 5, and p⁺ anode region 1.

After the main current is cut off, the same breakdown voltage is maintained by the above described p type base region 41. Therefore, in the present embodiment, it is not necessary to apply a gate voltage to maintain off-state.

In the present embodiment, gate electrode layer 13 opposes to n⁻ region 5, p type base region 41 and cathode region 7 with insulating layer 11 interposed as shown in FIG. 28. In other words, the gate control method is of voltage controlled type. Therefore, as already described with reference to Embodiment 1, the gate control circuit can be simplified as compared with the current controlled type device. Further, cathode region 7 having a large area is formed at the first main surface sandwiched between the trenches. Therefore, as already described with reference to Embodiment 1, on-state voltage Vf can be reduced.

Further, in accordance with the present embodiment, it is not necessary to apply a gate voltage to maintain off-state of the device. Namely, the device has a normally off type structure. Therefore, as compared with a structure which requires continuous application of gate voltage, the gate control circuit can be simplified in the present embodiment.

Embodiment 6

Figure 31:
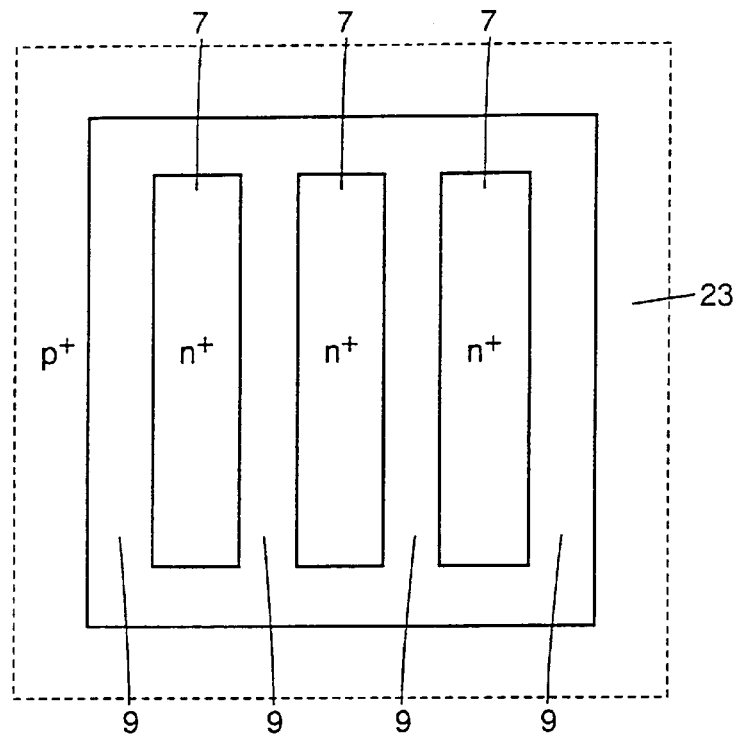
FIG. 31 is a schematic plan view showing the structure of the semiconductor device in accordance with Embodiment 6 of the present invention.
Figure 32:
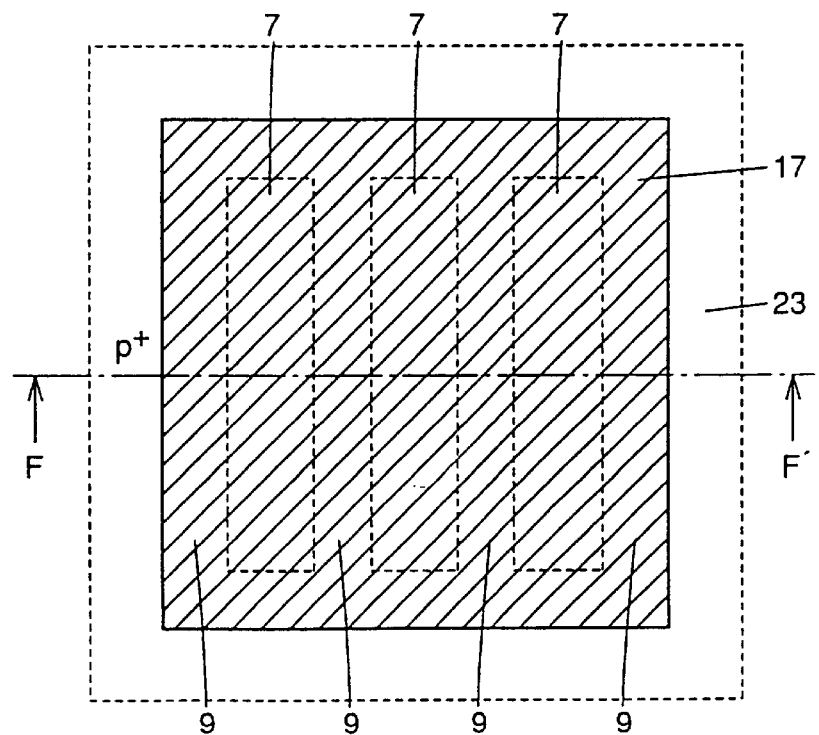
FIG. 32 is a schematic plan view showing the device of FIG. 31 with cathode electrode provided.
Figure 33:
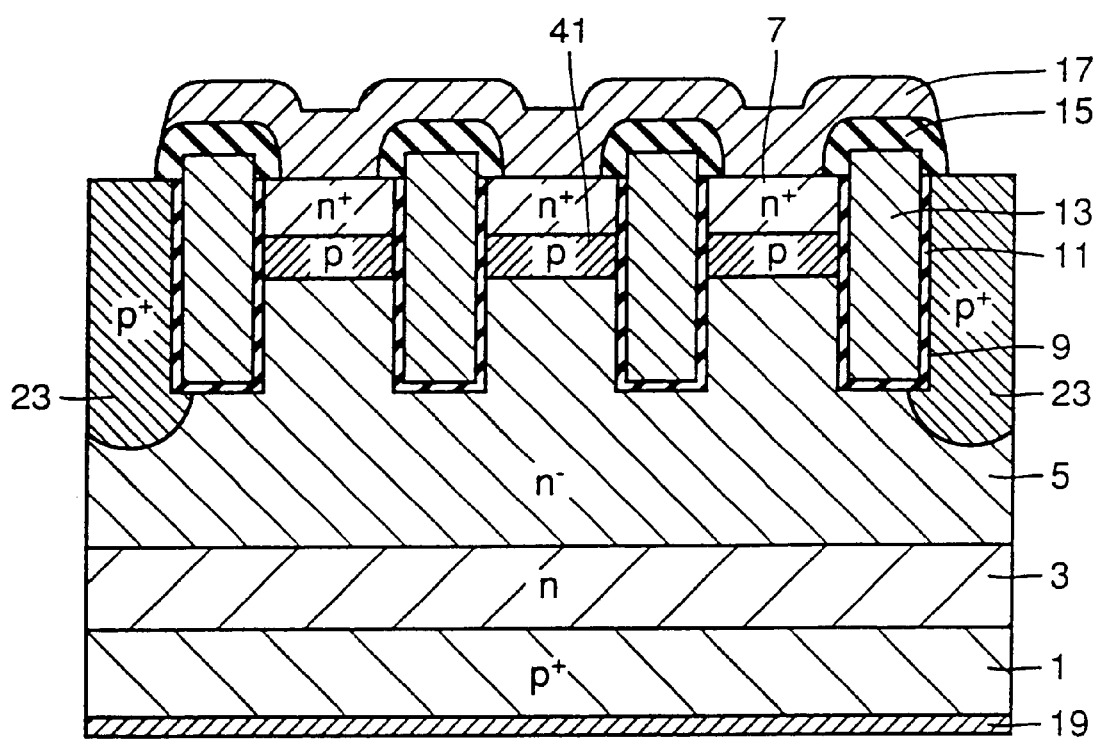
FIG. 33 is a schematic cross section taken along the line F–F' of FIG. 32.

Referring to FIGS. 31 to 33, the semiconductor device of the present embodiment differs from Embodiment 5 in that p⁺ isolation impurity region 23 is formed. The p⁺ isolation impurity region 23 is formed to surround planer region of diode forming region and to be in contact with trenches 9. The p⁺ isolation impurity region 23 is made deeper than the trench 9.

Except these points, the present embodiment is the same as Embodiment 5. Therefore, corresponding portions are denoted by the same reference characters, and description thereof is not repeated.

The method of manufacturing p⁺ isolation impurity region 23 is approximately similar to the method described with reference to FIGS. 14 to 16. Therefore, description thereof is not repeated.

Referring to FIG. 33, the p⁺ isolation impurity region 23 is connected to cathode electrode 17 by an inverted layer formed around gate electrode layer 13, when a negative voltage is applied to gate electrode layer 13. Therefore, the pn junction formed by p⁺ isolation impurity region 23 and n⁻ region 5 is reversely biased. Therefore, main breakdown voltage maintaining capability of the device can be enhanced.

According to a semiconductor device of the present embodiment, p type impurity region 23 is formed deeper than trench 9 to surround diode forming region, as shown in FIGS. 32 and 33. Therefore, p⁺ isolated region 23 is electrically isolated from the diode at on-state, on-state voltage can be maintained low. And, p⁺ isolated region 23 is electrically connected cathode electrode 17 at off-state, breakdown voltage can be improved.

Embodiment 7

Figure 34:
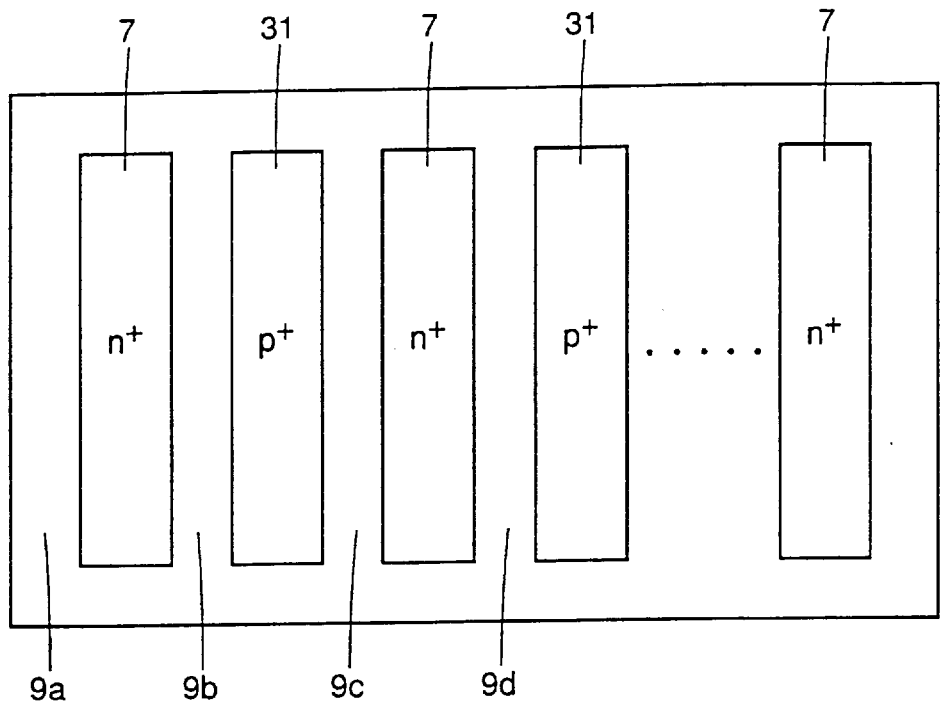
FIG. 34 is a plan view schematically showing the structure of the semiconductor device in accordance with Embodiment 7 of the present invention.
Figure 35:
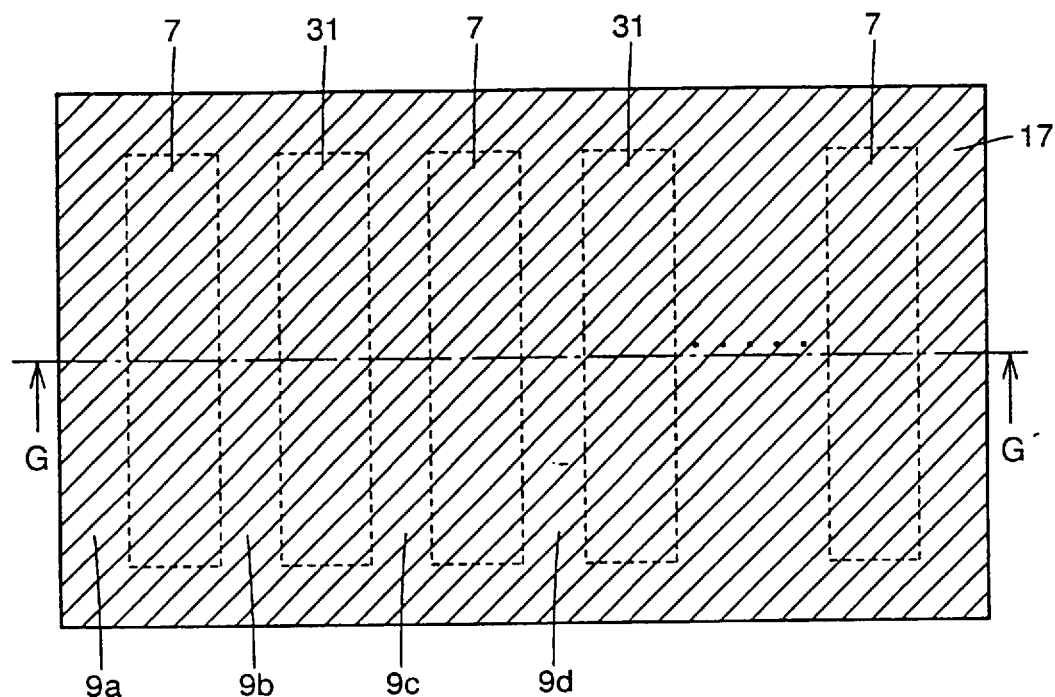
FIG. 35 is a schematic plan view showing the device of FIG. 34 with cathode electrode provided.
Figure 36:
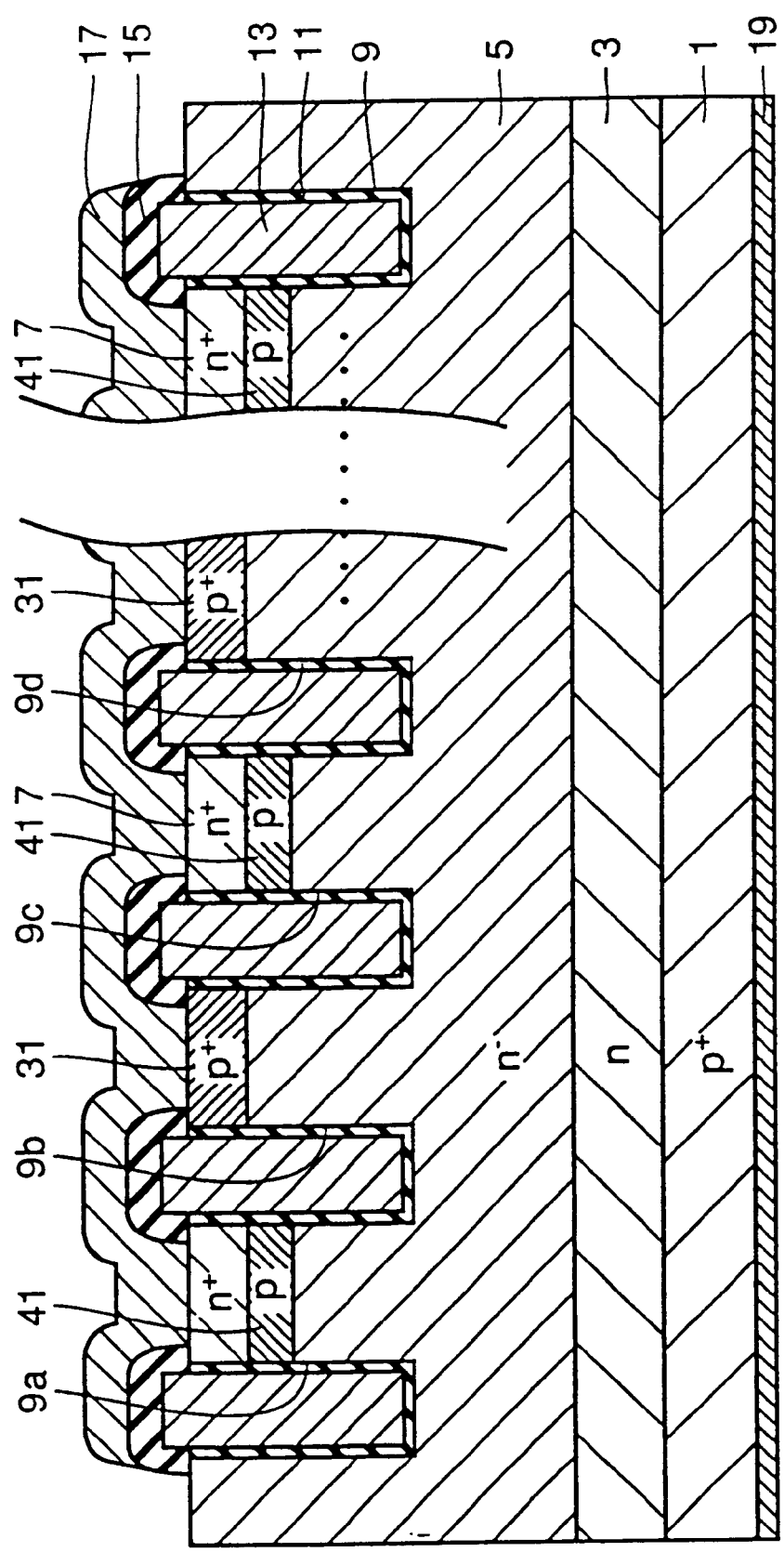
FIG. 36 is a schematic cross sectional view taken along the line G–G' of FIG. 35.

Referring to FIGS. 34 to 36, the semiconductor device in accordance with the present embodiment differs from Embodiment 5 in that a p⁺ contact region 31 is provided. The p⁺ contact region 31 is formed to be adjacent to cathode region 7 with trench 9c or 9d interposed, and is electrically connected to cathode electrode 17. The p+ contact region 31 has an surface impurity concentration of at least $1\times10^{17}$ cm$^{-3}$. The p+ contact region 31 and n+ cathode region 7 are arranged alternately, with the trenches interposed. Further, the number of trenches 9a, 9b, . . . extending parallel to each other can be arbitrarily selected.

Other structures are the same as those of Embodiment 5. Therefore, corresponding portions are denoted by the same reference characters and description thereof is not repeated.

The method of manufacturing the semiconductor device in accordance with the present embodiment will be described.

Figure 37:
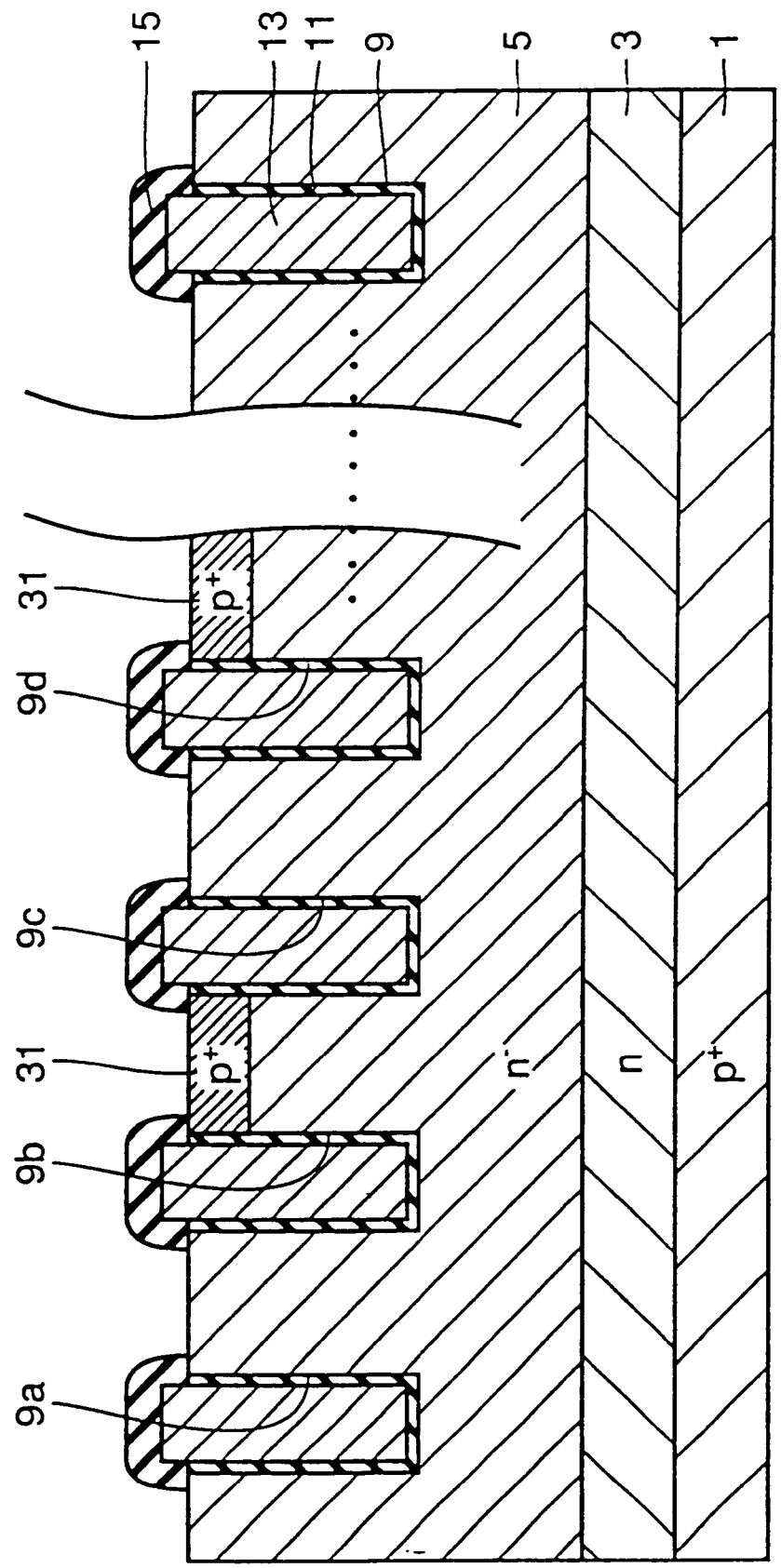
FIGS. 37 and 38 are schematic cross sectional views showing, in order, the steps of manufacturing the semiconductor device in accordance with Embodiment 7 of the present invention.

The method of manufacturing in accordance with the present embodiment first includes the same steps as Embodiment 1 shown in FIGS. 4 to 8. Thereafter, referring to FIG. 37, p+ contact region 31 is formed at the surface of n− region 5 sandwiched between trenches 9b and 9c extending parallel to each other, by photolithography process, ion implantation and diffusion, for example.

Figure 38:
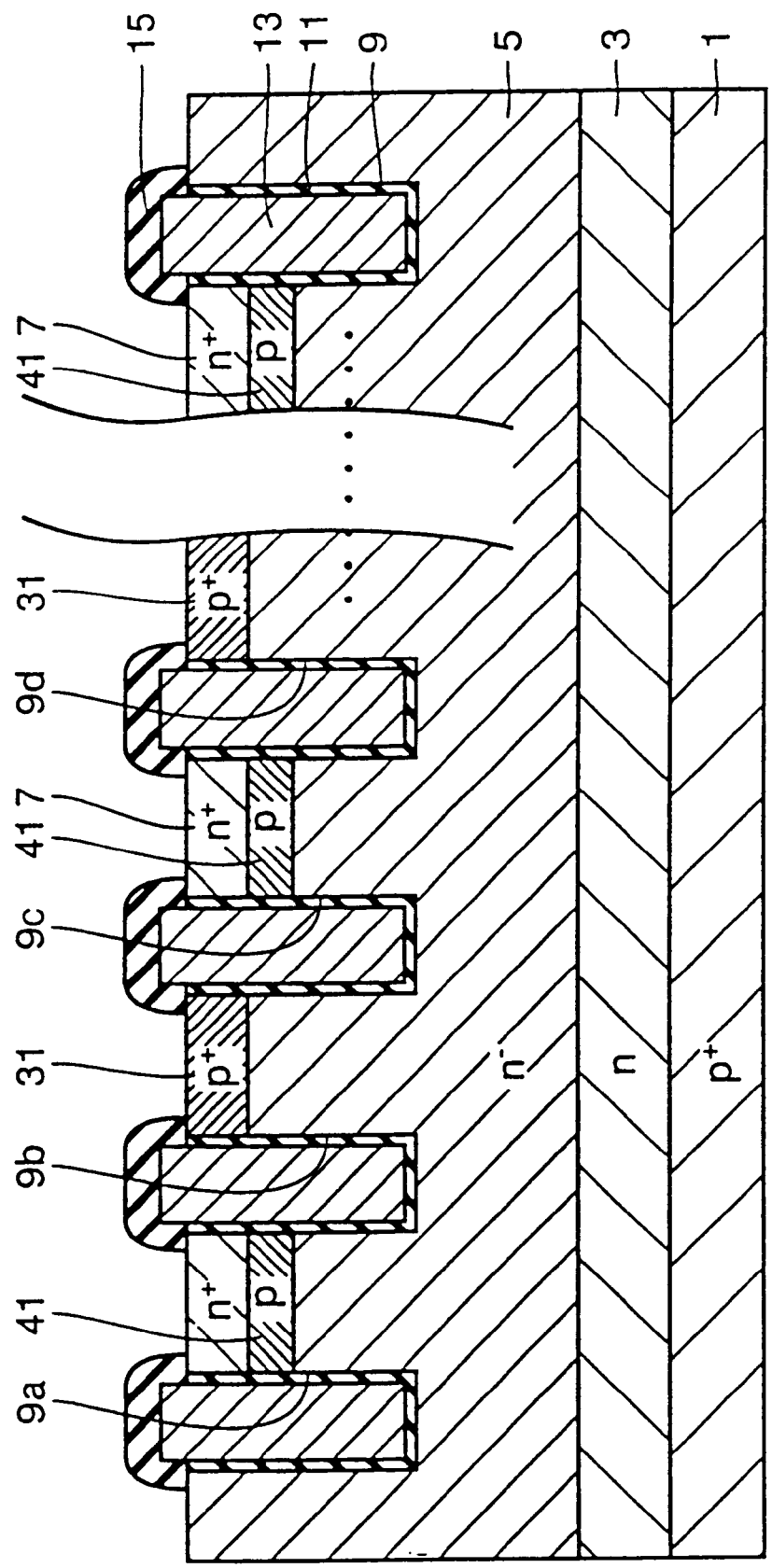

Referring to FIG. 38, through the same steps as shown in FIGS. 30 and 31, p type base region 41 and n+ cathode region 7 are formed adjacent to p+ contact region 31 with trenches 9b and 9c interposed. Subsequent steps are the same as those of Embodiment 1. Therefore, description thereof is not repeated.

In the present embodiment, since p+ contact region 31 is formed to be adjacent to n+ cathode region 7 with trench 9 interposed, turn-off time can be reduced, as described with reference to Embodiment 3.

Embodiment 8

Figure 39:
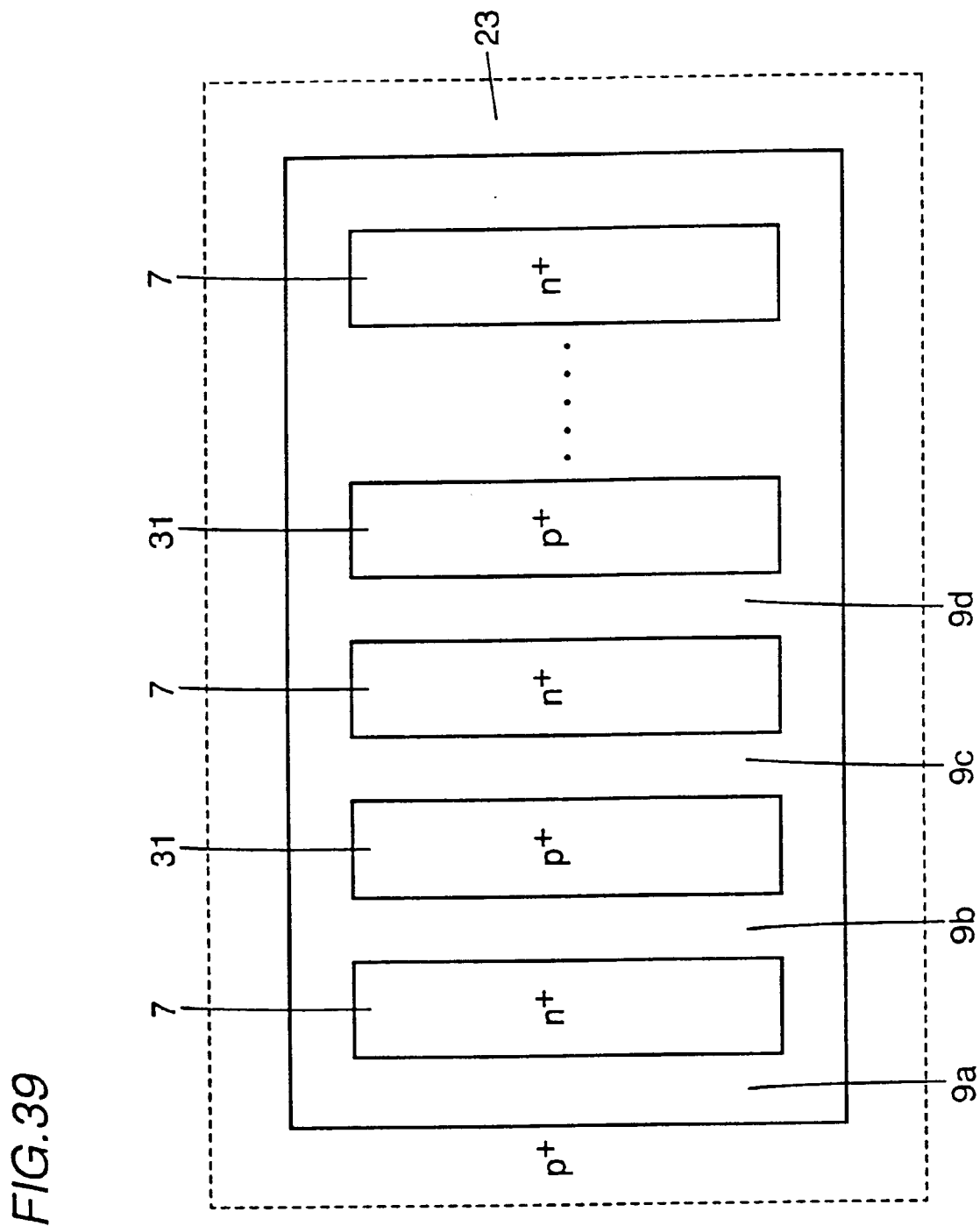
FIG. 39 is a plan view schematically showing a structure of a semiconductor device in accordance with Embodiment 8 of the present invention.
Figure 40:
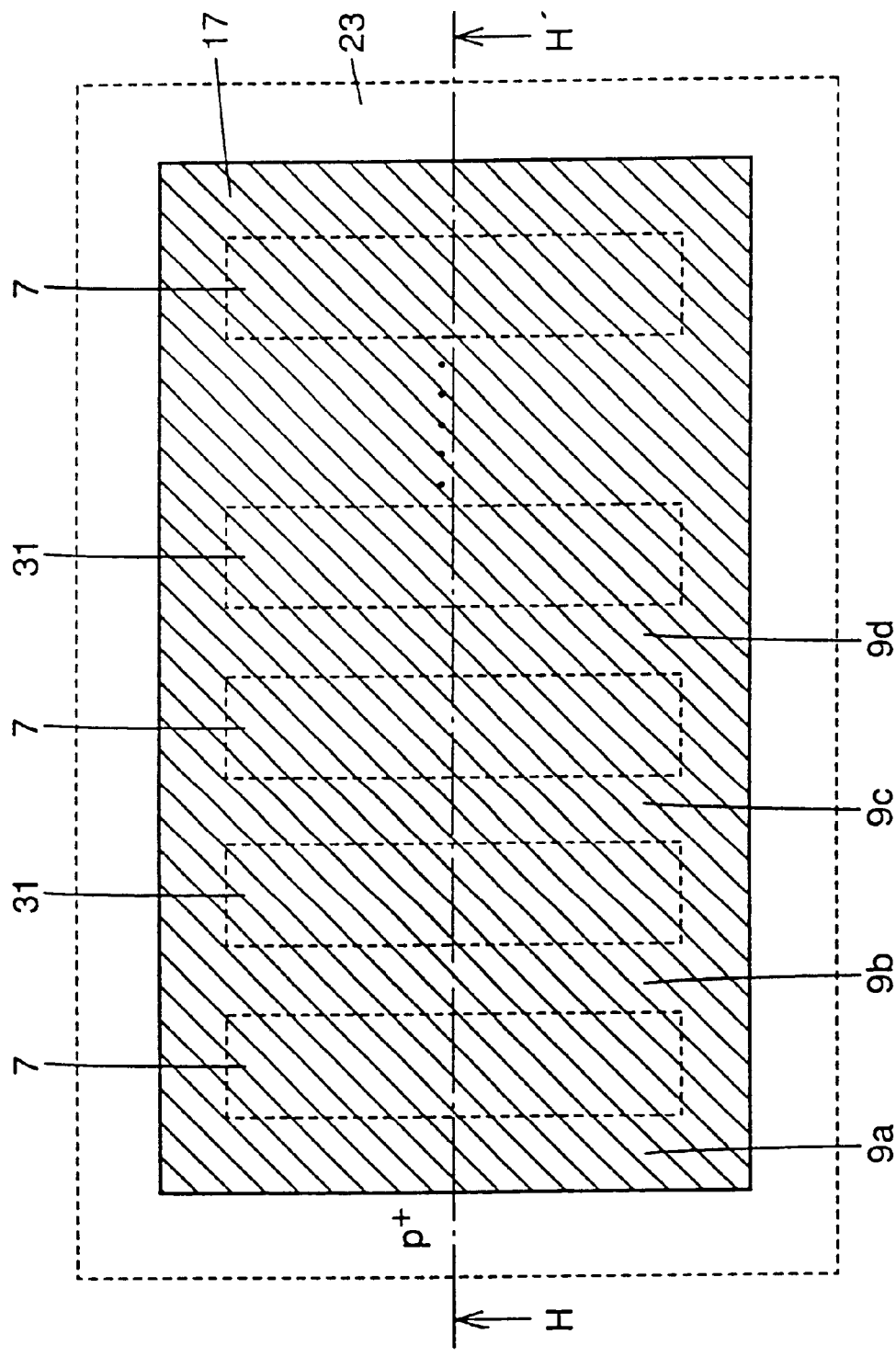
FIG. 40 is a schematic plan view showing the device of FIG. 39 with cathode electrode provided.
Figure 41:
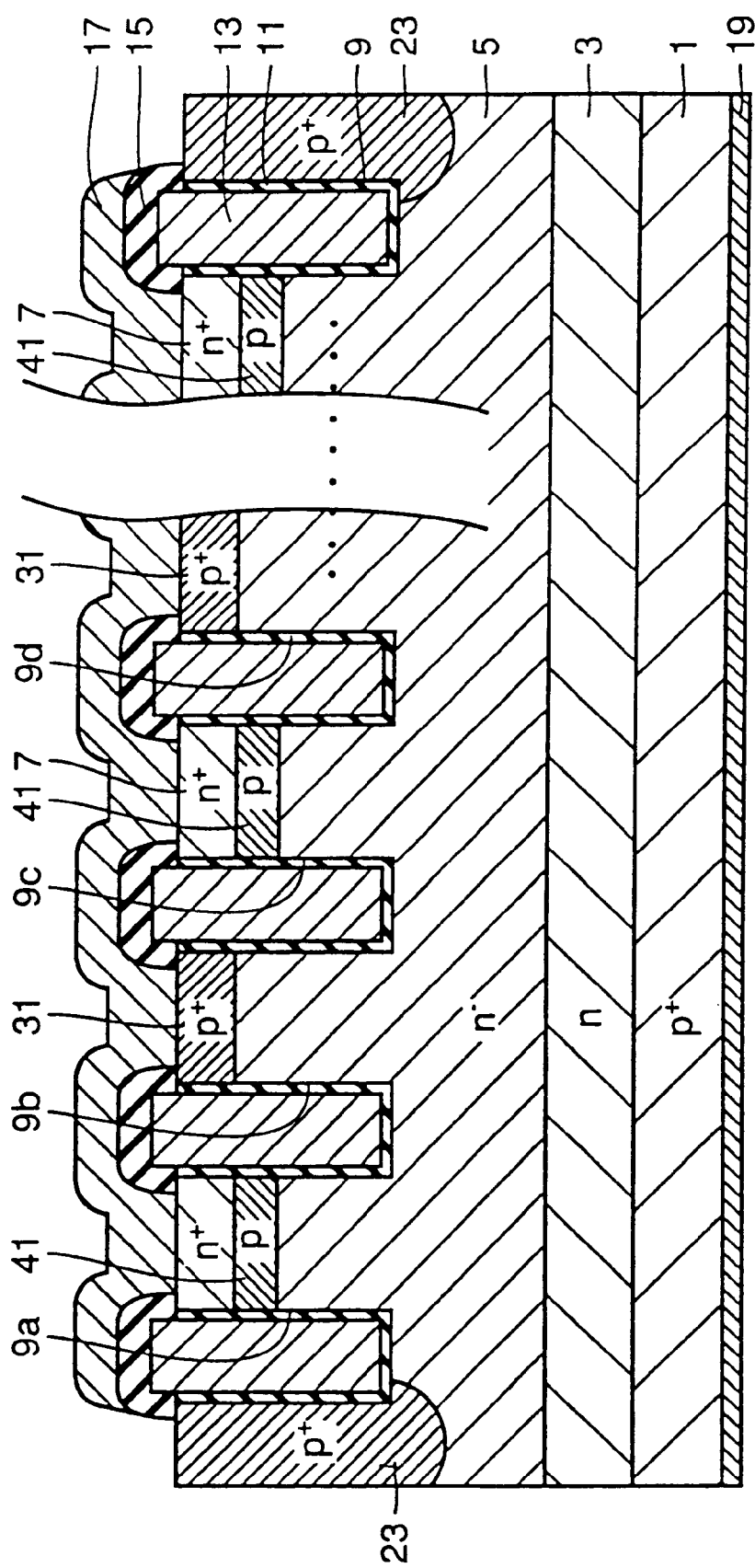
FIG. 41 is a schematic cross sectional view taken along the line H–H' of FIG. 40.

Referring to FIGS. 39 to 41, the semiconductor device in accordance with the present embodiment differs from Embodiment 7 in that p+ isolation impurity region 23 is formed. The p+ isolation impurity region 23 is provided to surround, two dimensionally, the diode forming region, to be in contact with trench 9. The p+ isolation impurity region 23 is formed to be deeper than the trench 9.

Other structures are the same as those of Embodiment 7. Therefore, corresponding portions are denoted by the same reference characters and description thereof is not repeated.

Figure 14:
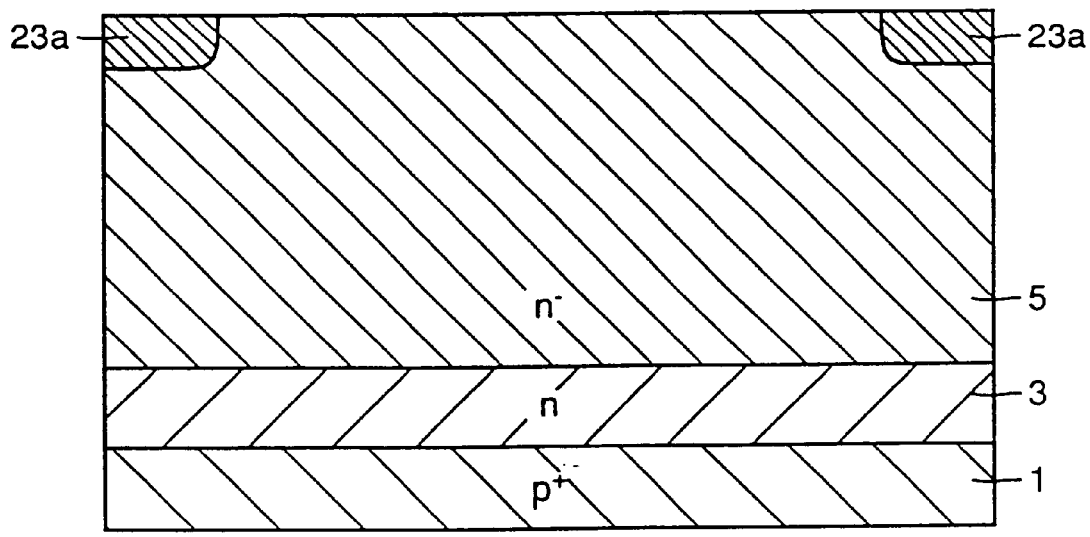
FIGS. 14 to 16 are schematic cross sectional views showing, in order, the steps of manufacturing the semiconductor device in accordance with Embodiment 2 of the present invention.

The method of manufacturing p+ isolation impurity region 23 of the semiconductor device in accordance with the present embodiment is the same as the method shown in FIGS. 14 to 16 described above.

Referring to FIG. 41, the p+ isolation impurity region 23 is connected to cathode electrode 17 by an inverted layer formed around gate electrode layer 13, when a negative voltage is applied to gate electrode layer 13. Therefore, the pn junction formed by p+ isolation impurity region 23 and n− region 5 is reversely biased. Therefore, main breakdown voltage maintaining capability of the device can be enhanced.

According to a semiconductor device of the present embodiment, p type impurity region 23 is formed deeper than trench 9 to surround diode forming region, as shown in FIGS. 40 and 41. Therefore, p+ isolated region 23 is electrically isolated from the diode at on-state, on-state voltage can be maintained low. And, p+ isolated region 23 is electrically connected cathode electrode 17 at off-state, breakdown voltage can be improved.

Embodiment 9

Figure 42:
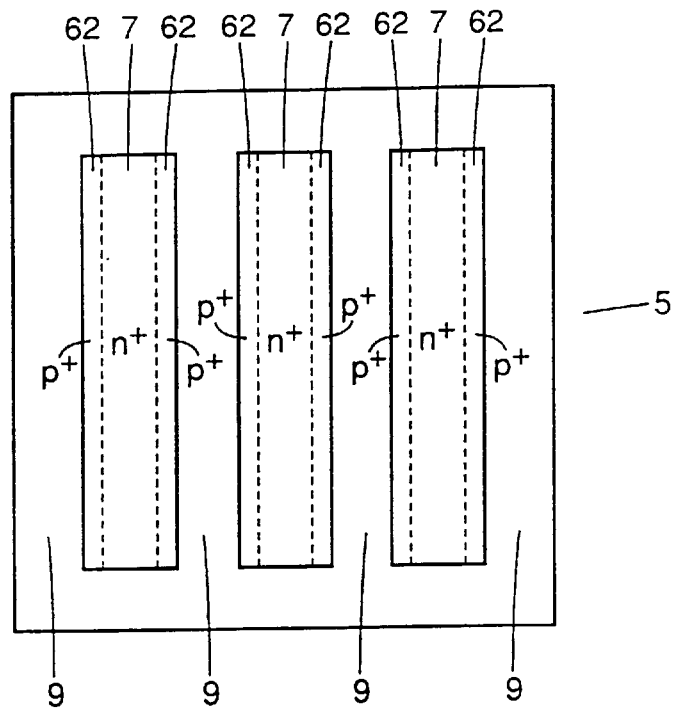
FIG. 42 is a schematic plan view showing the structure of a semiconductor device in accordance with Embodiment 9 of the present invention.
Figure 43:
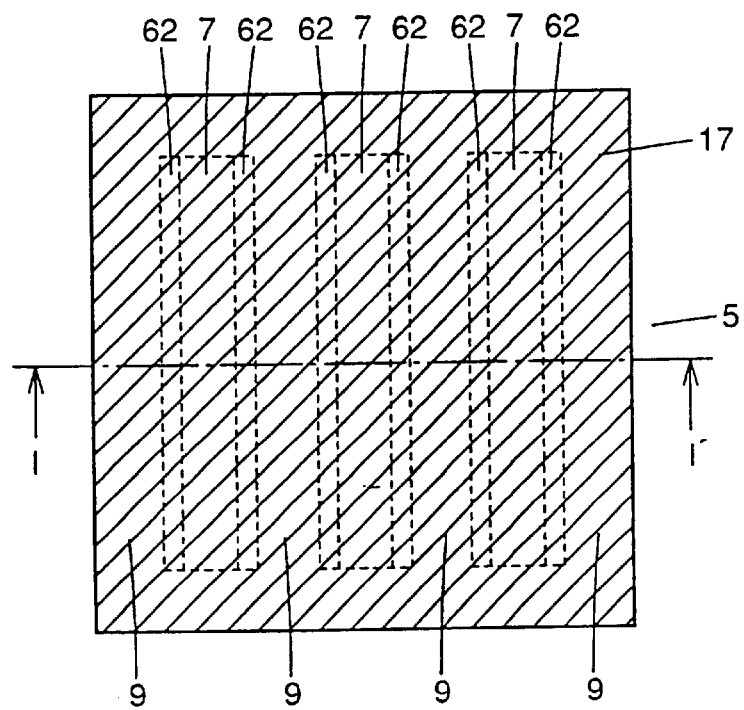
FIG. 43 is a schematic plan view showing the device of FIG. 42 with cathode electrode provided.
Figure 44:
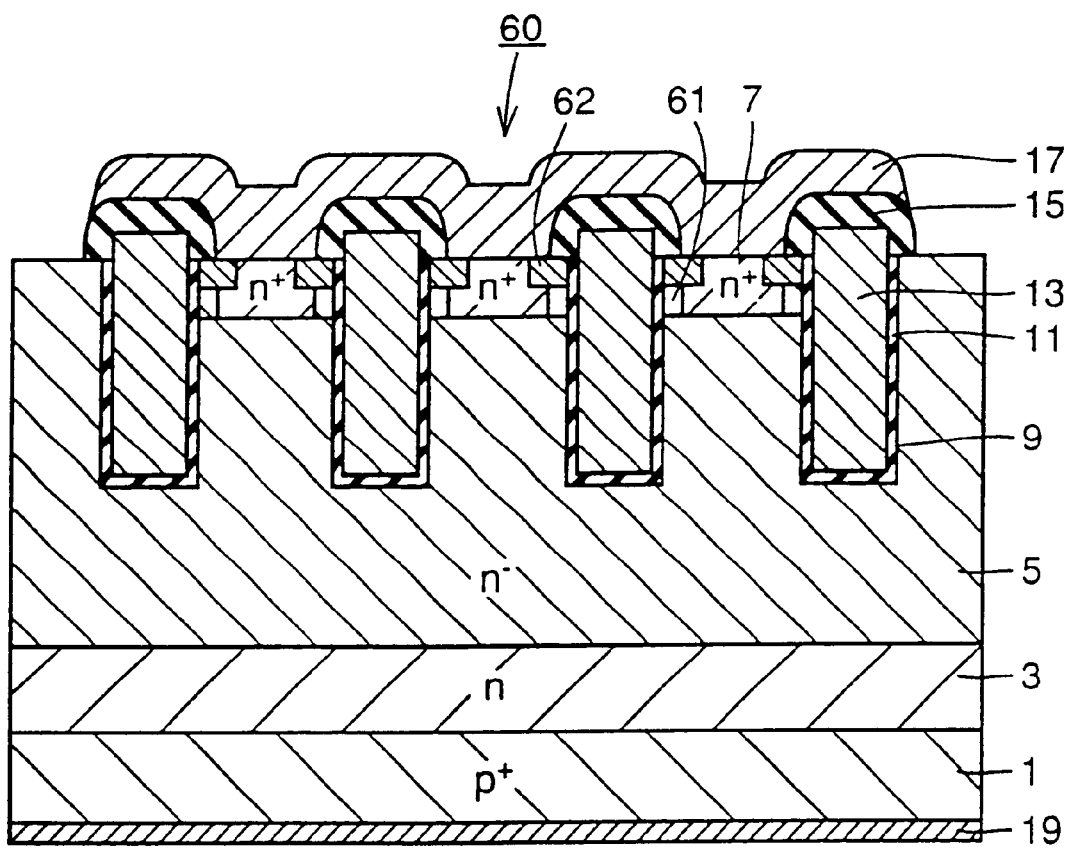
FIG. 44 is a schematic cross sectional view taken along the line I–I' of FIG. 43.

Referring to FIGS. 42 to 44, the present embodiment shows an example which includes a diode structure. The diode has a stacked structure of p+ collector region 1, an n type buffer region 3, an n− region 5 and an n+ cathode region 7. Trench 9 is formed from the surface of n+cathode region 7 through n+cathode region 7 to reach n− region 5. At the substrate surface, p+contact region 62 is provided to be in contact with trench 9. Immediately below p+ contact region 62, there is provided n− region 61 to be in contact with trench 9 and p+ contact region 62.

The p+ contact region 62 has surface impurity concentration of at least $1\times10^{17}$ cm$^{-3}$, and n− region 61 has impurity concentration of, for example, $1\times10^{12}$ cm$^{-3}$ to $1\times10^{17}$ cm$^{-3}$, which is lower than that of n+ cathode region 7.

Other structures are the same as those of Embodiment 1. Therefore, corresponding portions are denoted by the same reference characters and description thereof is not repeated. The method of manufacturing a semiconductor device in accordance with the present embodiment will be described.

Figure 45:
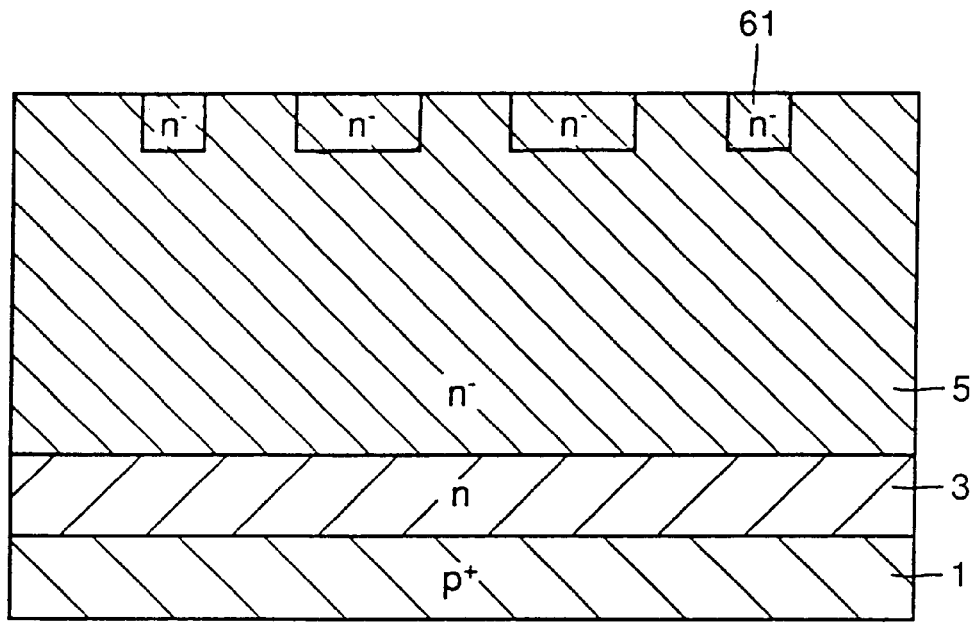
FIGS. 45 to 48 are schematic cross sectional views showing, in order, the steps of manufacturing the semiconductor device in accordance with Embodiment 9 of the present invention.

Referring to FIG. 45, first, p+ collector region 1, n type buffer region 3 and n− region are formed stacked in this order. At the surface of n− region 5, an epitaxially grown layer having low concentration corresponding to n− region 61 is formed, and thereafter selective ion implantation, diffusion and the like are performed, so that an island-shaped n− region 61 is left.

Figure 46:
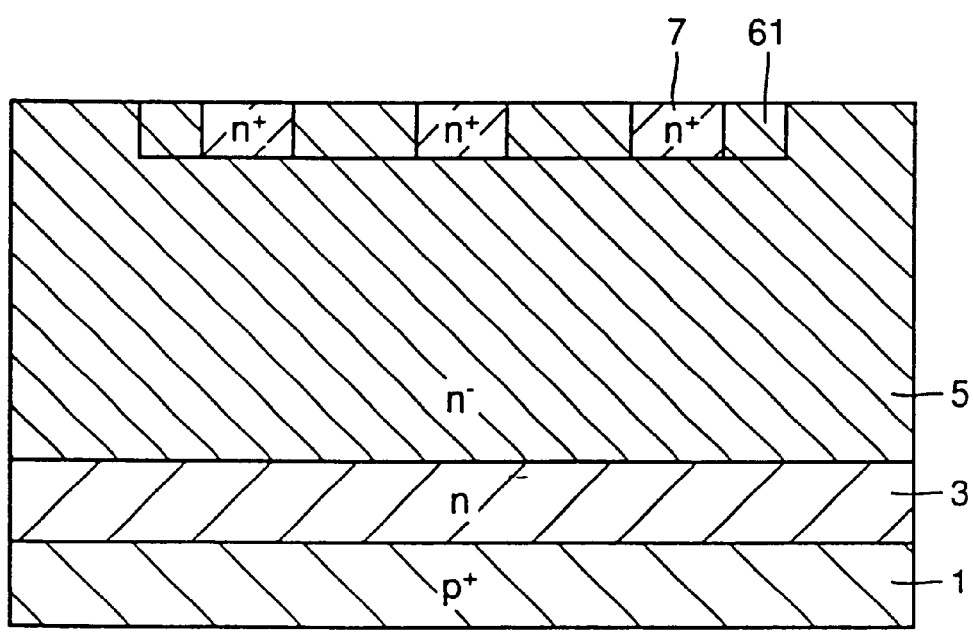

Referring to FIG. 46, at a region between n− regions 61, n+ cathode region 7 is formed by ion implantation and diffusion, for example.

The depth of diffusion of cathode region 7 is made approximately the same as the depth of diffusion of n− region 61.

Figure 47:
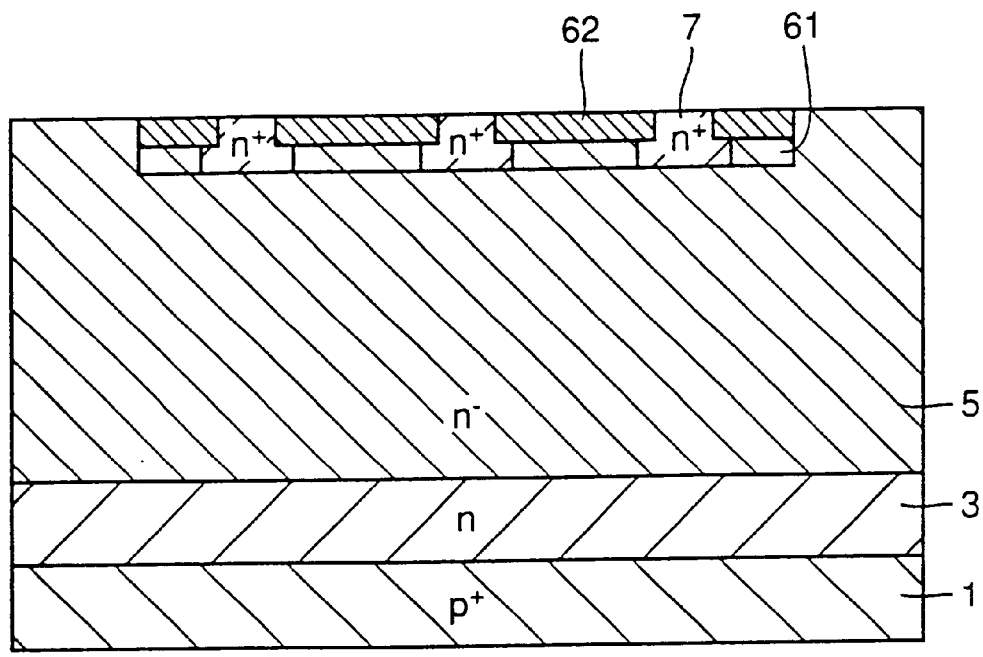

Referring to FIG. 47, at a substrate surface above n region 61, p+ contact region 62 is formed by ion implantation and diffusion, for example. The p+ contact region 62 is formed shallower than n+ cathode region 7.

Figure 48:
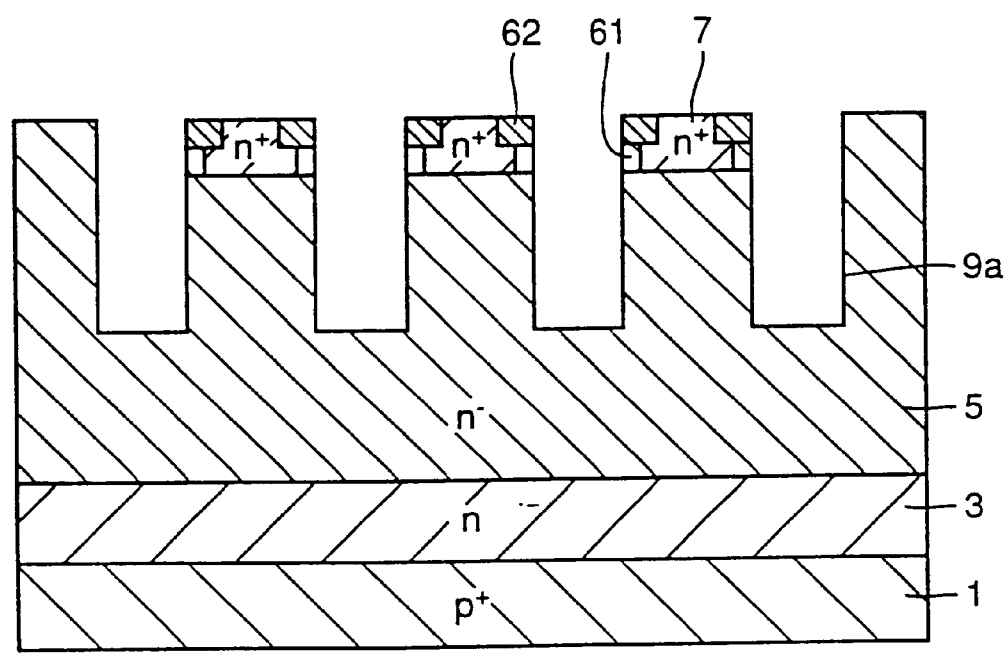

Referring to FIG. 48, a trench 9a is from the substrate surface to reach n− region 5 through p+ contact region 62 and n− region 61. Thereafter, several steps as in Embodiment 1 are carried out, and thus the semiconductor device shown in FIG. 44 is completed.

Here, n− region 61 should preferably be formed to have impurity concentration lower than n− region 5. However, if n− region 5 has sufficiently low impurity concentration, n− region 61 may be formed by leaving n− region 5.

Figure 49:
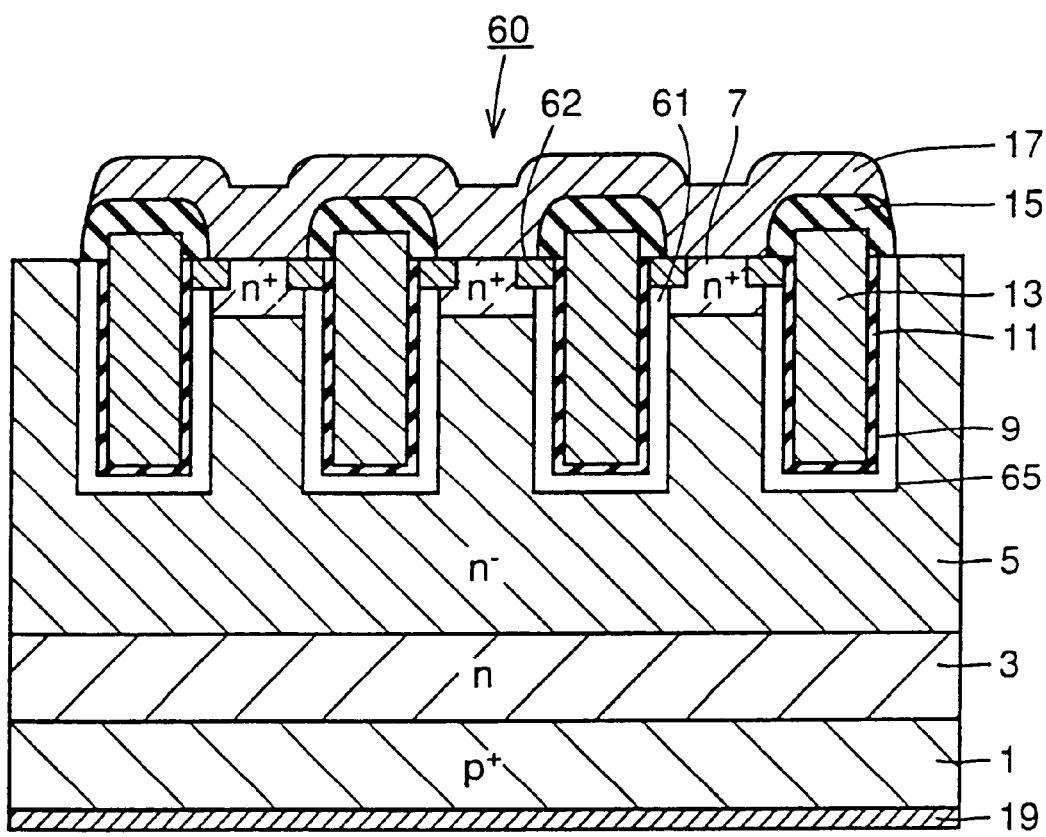
FIG. 49 is a schematic cross sectional view showing a main current conducting state of the semiconductor device in accordance with Embodiment 9 of the present invention.

The method of control of the semiconductor device in accordance with the present embodiment will be described. First, on-state is realized by applying a positive voltage to gate electrode layer 13. AT this time, an n type accumulation region 65 having high electron density is formed as trench 9, as shown in FIG. 49. Therefore, present embodiment works in same manner of Embodiment 1.

Off-state can be realized by applying a negative voltage to gate electrode layer 13. When a negative voltage is applied to gate electrode layer 13, similar to Embodiments 1 to 8 described above, n+ accumulation layer (channel) which is an electron current path is eliminated, thus the current path becomes pinched off, and the device becomes turned off. Further, n− regions 5 and 61 in contact with trench 9 are turned to p+ inversion regions.

In order to reduce turn-off time, it is necessary to quickly extract minority carriers (here, hole). In the present embodiment, the holes, which are the minority carriers are extracted through the path of p+ inversion region and p+ contact region 62 generated around trench 9. As already described with reference to Embodiment 2, the turn-off time can be reduced in the present embodiment, also.

Referring to FIG. 49, at on-state, there is generated an n type accumulation channel region 65 having high electron concentration around trench 9, and n type accumulation region 65 is regarded as an extension of $n^+$ cathode region 7. Namely, it is considered that effective cathode region becomes large. Thus cathode area, which is the area of contact between $n^+$ cathode region 7 and $n^-$ region 5 is increased. This enhances injection efficiency of electron, and this can reduce on-state voltage Vf.

Embodiment 10

Figure 50:
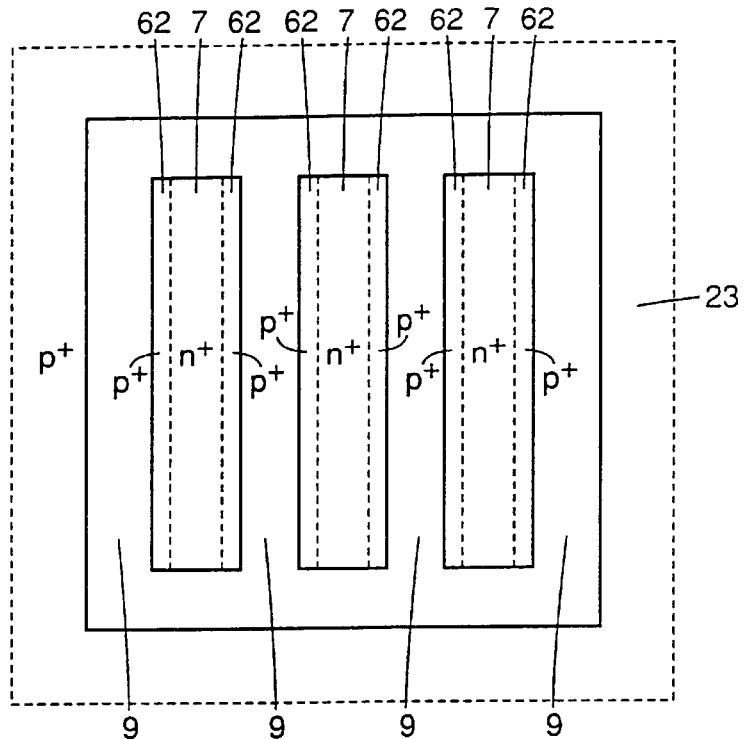
FIG. 50 is a plan view schematically showing a structure of a semiconductor device in accordance with Embodiment 10 of the present invention.
Figure 51:
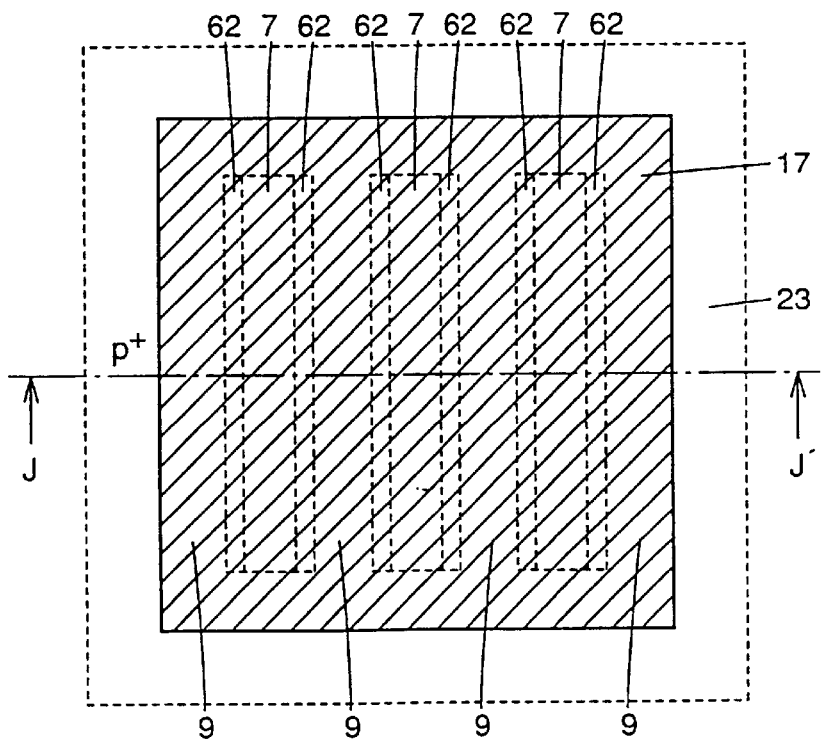
FIG. 51 is a schematic plan view showing the device of FIG. 50 with cathode electrode provided.
Figure 52:
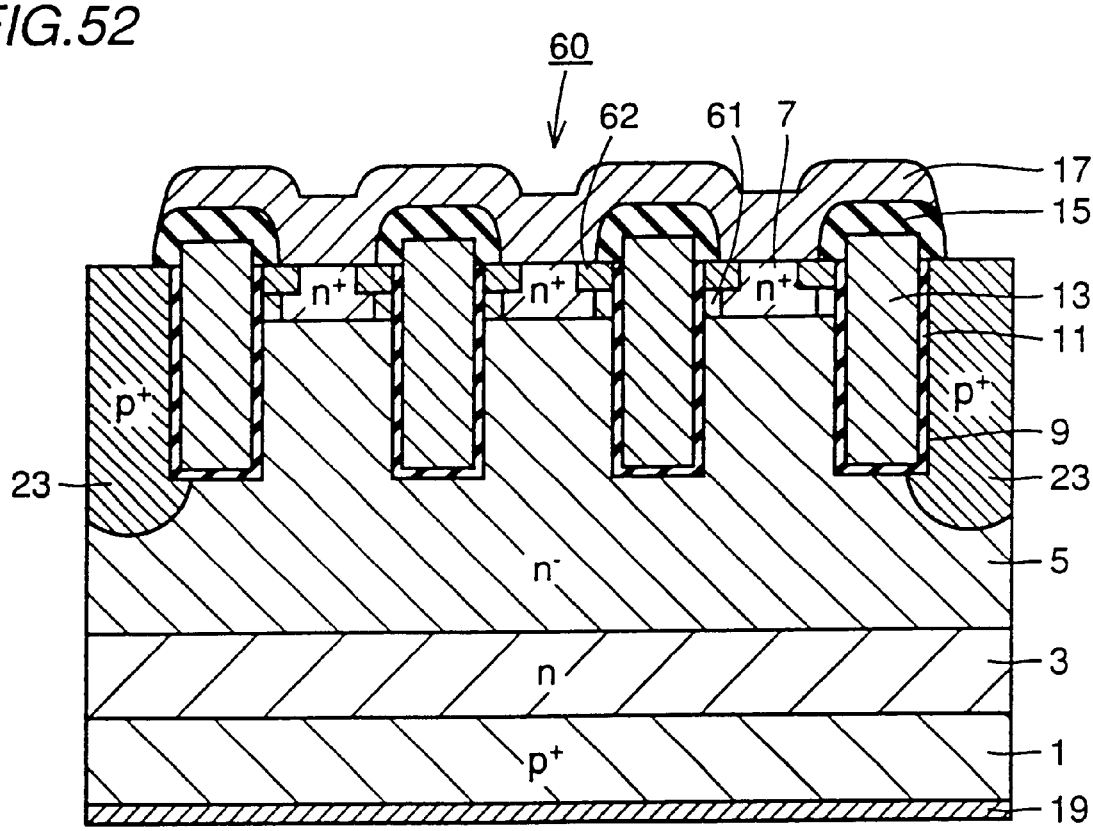
FIG. 52 is a schematic cross sectional view taken along the line K–K' of FIG. 51.

Referring to FIGS. 50 to 52, the structure of the semiconductor device in accordance with the present embodiment differs from Embodiment 9 in that $p^+$ isolation impurity region 23 is provided. The $p^+$ isolation diffusion region 23 is formed to surround, two dimensionally, the diode forming region, and to be in contact with trench 9. The $p^+$ isolation impurity region 23 is made deeper than trench 9.

The method of manufacturing a semiconductor device in accordance with the present embodiment will be described.

Figure 53:
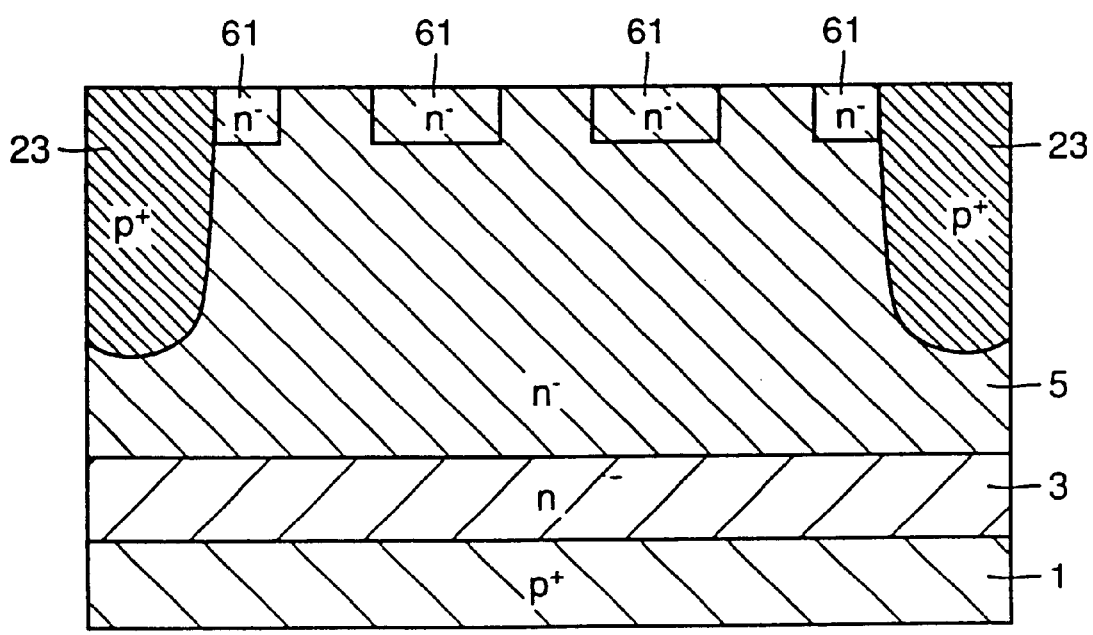
FIG. 53 is a schematic cross sectional view showing the method of manufacturing the semiconductor device in accordance with Embodiment 10 of the present invention.

The method of manufacturing a semiconductor device in accordance with the present embodiment first includes the same steps as Embodiment 2 shown in FIGS. 14 and 15. Thereafter, the step shown in FIG. 45 is performed, and the state of FIG. 53 is attained. Thereafter, similar steps as in Embodiment 1 are performed, and the semiconductor device shown in FIG. 52 is completed.

Referring to FIG. 52, the $p^+$ isolation impurity region 23 is connected to cathode electrode 17 by an inverted layer formed around gate electrode layer 13, when a negative voltage is applied to gate electrode layer 13. Therefore, the pn junction formed by $p^+$ isolation impurity region 23 and $n^-$ region 5 is reversely biased. Therefore, main breakdown voltage maintaining capability of the device can be enhanced.

According to a semiconductor device of the present embodiment, p type impurity region 23 is formed deeper than trench 9 to surround diode forming region, as shown in FIGS. 51 and 52. Therefore, $p^+$ isolated region 23 is electrically isolated from the diode at on-state, on-state voltage can be maintained low. And, $p^+$ isolated region 23 is electrically connected cathode electrode 17 at off-state, breakdown voltage can be improved.

Figure 54:
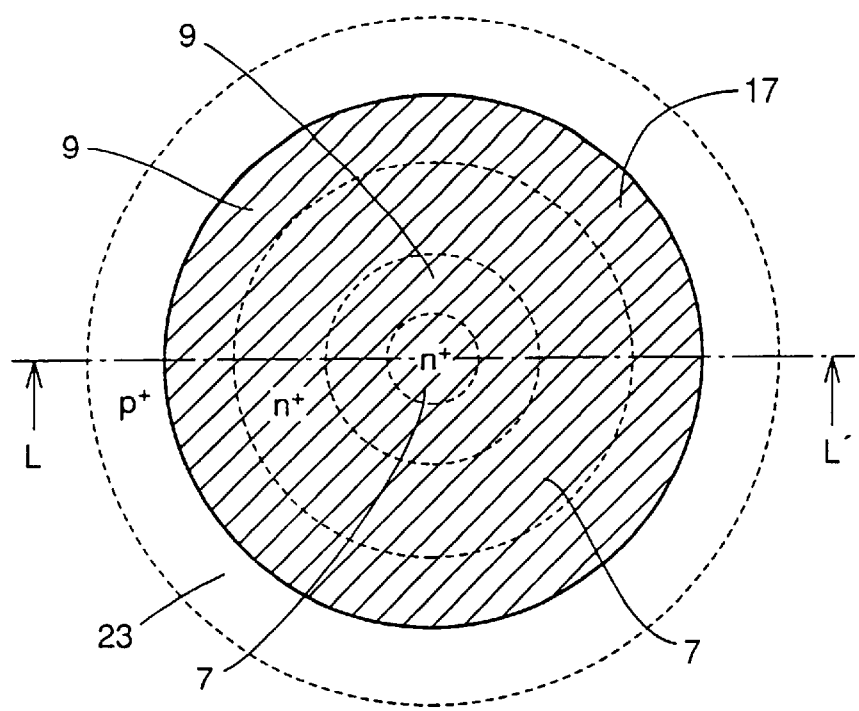
FIG. 54 is a schematic plan view showing trenches arranged concentrically.
Figure 55:
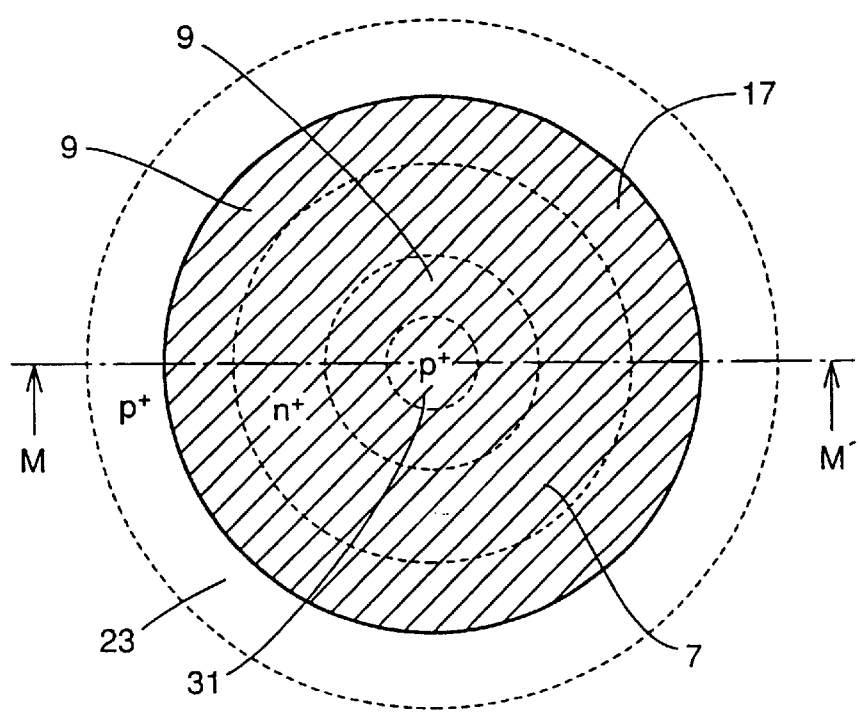
FIG. 55 is a schematic plan view showing trenches arranged concentrically.
Figure 56:
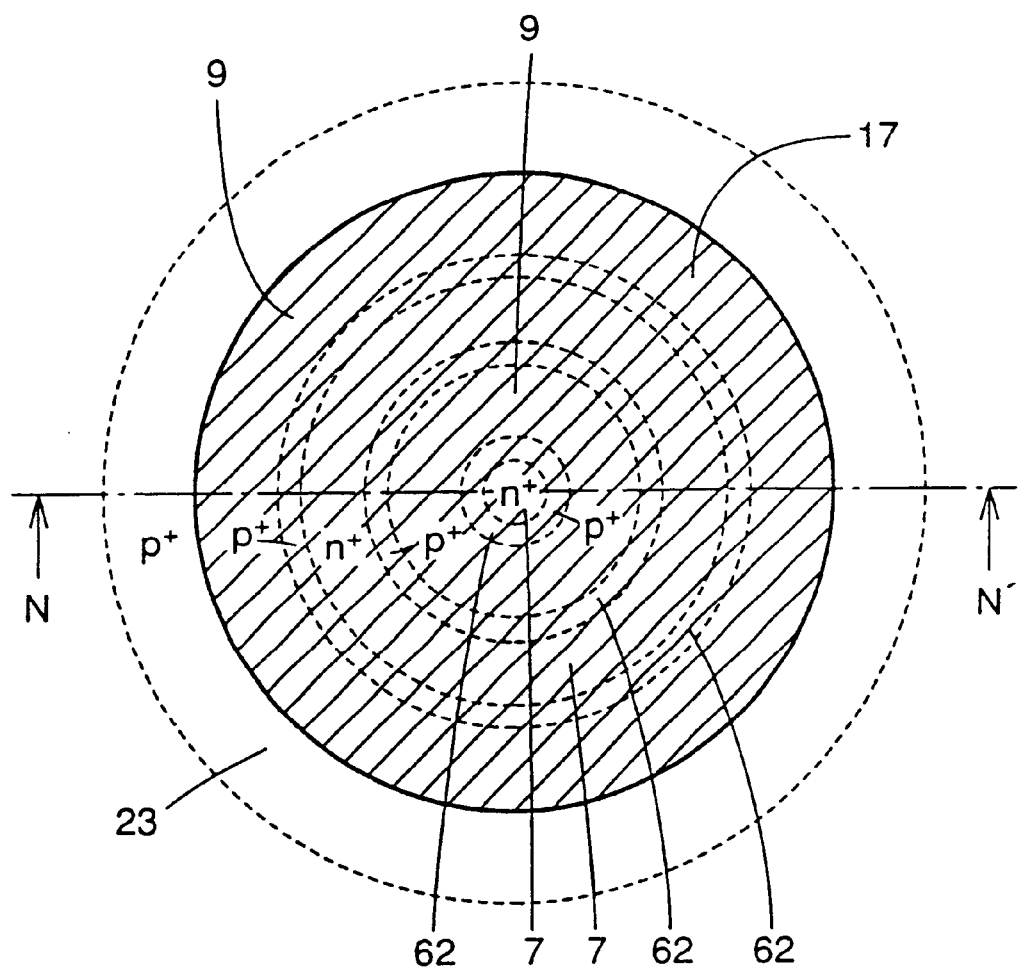
FIG. 56 is a schematic plan view showing trenches arranged concentrically.

Here, the trench 9 formed in respective embodiments may be arranged concentrically as shown in FIGS. 54 to 56, for example.

The planer structure shown in FIG. 54 corresponds to Embodiments 2 and 6. The cross section taken along the line L–L' of FIG. 54 corresponds to schematic cross sectional views of FIGS. 13 and 33.

The planer structure shown in FIG. 55 corresponds to Embodiments 4 and 8. The cross section taken along the line M–M' of FIG. 55 corresponds to schematic cross sectional views of FIGS. 25 and 41. The number of trenches 9 shown in FIGS. 25 and 41 may be arbitrarily selected.

The planer structure shown in FIG. 56 corresponds to Embodiment 10. The cross section taken along the line N–N' of FIG. 56 corresponds to the schematic cross sectional view of FIG. 56.

Embodiment 11

Figure 57:
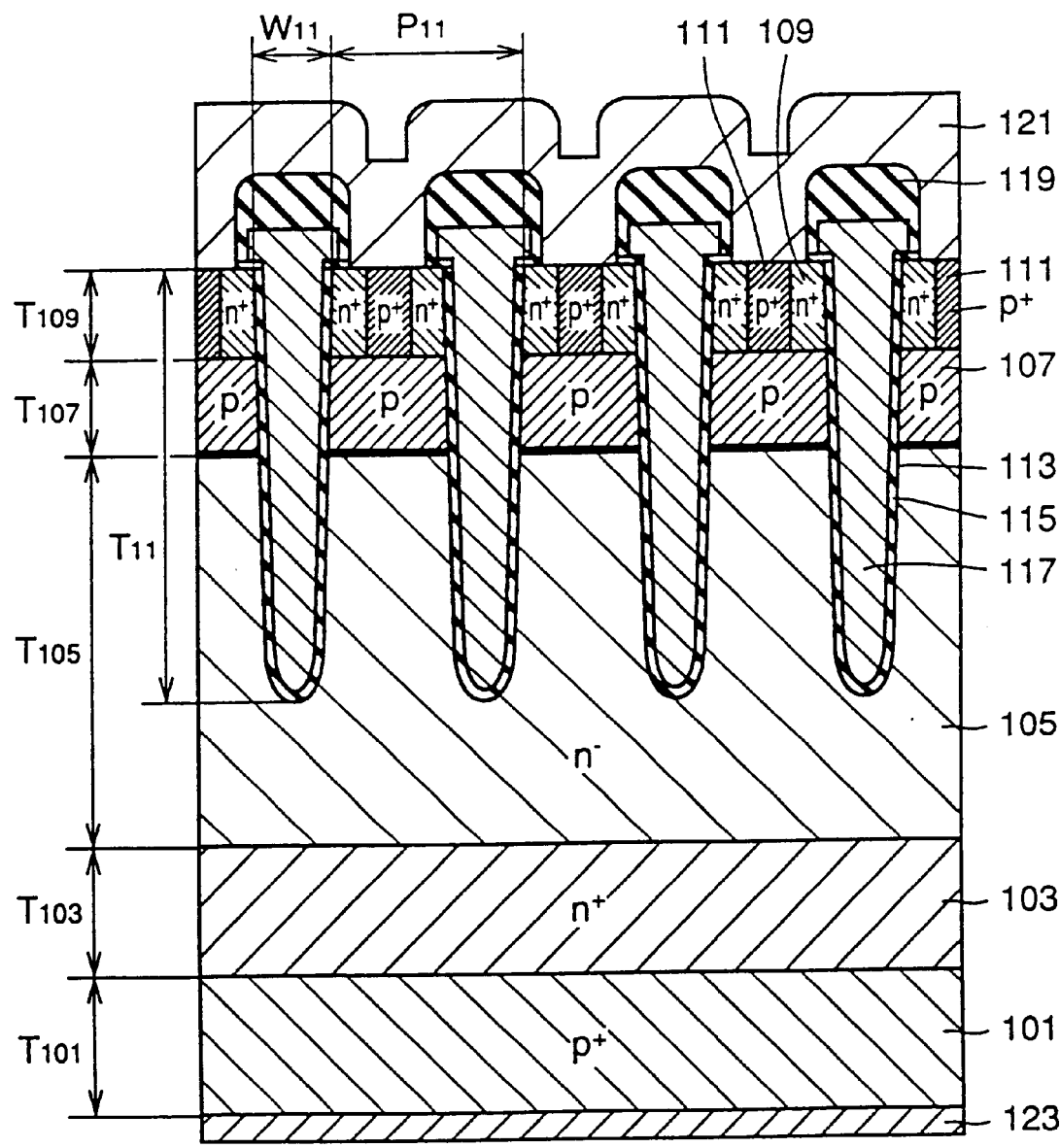
FIG. 57 is a cross sectional view schematically showing a structure of a semiconductor device in accordance with Embodiment 11 of the present invention.

Referring to FIG. 57, the semiconductor device in accordance with the present embodiment relates to an IGBT example. The structure of the semiconductor device in accordance with the present embodiment is different especially in the shape of the trenches, from the structure of the semiconductor device shown in FIG. 98. More specifically, the trench 113 in the present embodiment is made deeper than the trench 413 shown in FIG. 98. The depth $T_{11}$ of trench 113 is from 5 to 15 μm and the width $W_{11}$ is 0.8 to 3.0 μm. The pitch $P_{11}$ between the trenches 113 is, for example, 4 μm.

As for the semiconductor device of the first conductivity type, in a device having a breakdown voltage in the order of several hundred V, an epitaxially grown substrate having low impurity concentration of n type of several ten Ω is used as $n^-$ substrate ($n^-$ region) 105. In the device having the breakdown voltage in the order of several thousand V, an $n^-$ substrate 105 having high specific resistance of at least 100 Ωcm and low impurity concentration of n type is used. More specifically, a silicon polycrystalline substrate manufactured by FZ (Floating Zone) method to have the thickness of about 600 μm of about 350 Ωcm, which is irradiated with neutral line and has its resistivity adjusted by heat treatment, is used.

Further, in order to control resistivity, n or p type impurity is doped in the substrate having high resistance. However, in the on state of a bipolar device, electrons and holes which are carriers, are sufficiently accumulated in the high resistance layer, causing conductivity modulation. Therefore, the substrate may be sometimes regarded as an intrinsic semiconductor.

In the present embodiment, the thickness $T_{101}$ of $p^+$ collector region is, for example, 3 to 350 μm, the thickness $T_{103}$ of $n^+$ buffer region 103 is, for example, 8 to 30 μm, the thickness $T_{105}$ of $n^-$ region 105, for example, 40 to 600 μm, the thickness $T_{107}$ of p type base region 107 is, for example, 2.0 to 3.5 μm, and the thickness $T_{109}$ of $n^+$ emitter region 109 is, for example, 0.5 to 1.5 μm.

The p type base region 107 has only to be formed to be shallower than trench 113, and more specifically, the depth thereof is about 3 μm.

As for the impurity concentrations of various portions, it is $1 \times 10^{16}$ $cm^{-3}$ to $5 \times 10^{21}$ $cm^{-3}$ in $p^+$ collector region, $1 \times 10^{13}$ $cm^{-3}$ to $1 \times 10^{19}$ $cm^{-3}$ in $n^+$ buffer region 103, $1 \times 10^{12}$ $cm^{-3}$ to $1 \times 10^{14}$ $cm^{-3}$ in $n^-$ region 105, the peak concentration of p type base region 107 is $1 \times 10^{15}$ $cm^{-3}$ to $1 \times 10^{17}$ $cm^{-3}$, the concentration of $p^+$ contact region 111 at the substrate surface is at least $1 \times 10^{18}$ $cm^{-3}$, and the concentration of $n^+$ emitter region 109 at the substrate surface is $1 \times 10^{19}$ $cm^{31}$ to $1 \times 10^{20}$ $c^{-3}$.

Figure 98:
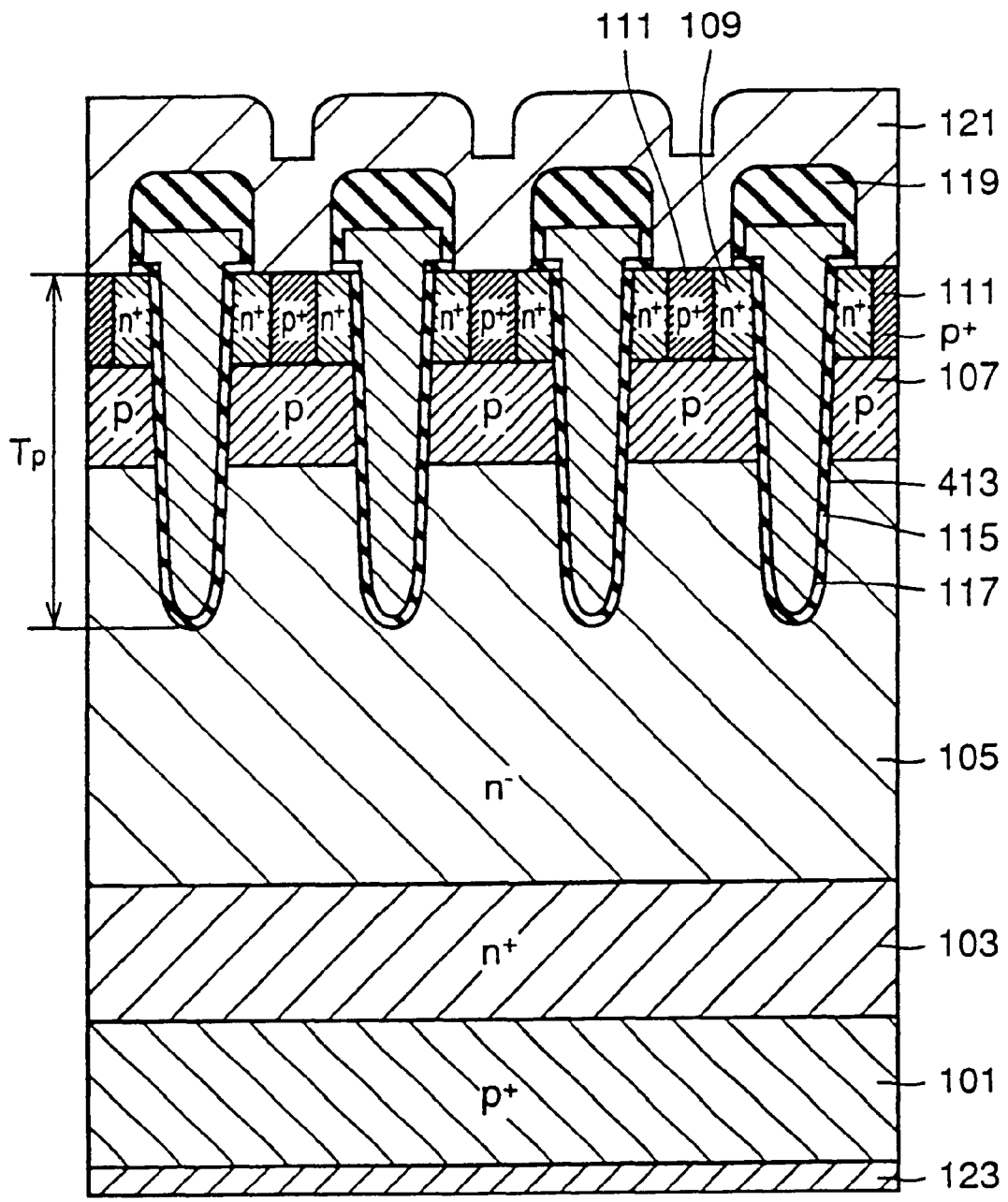
FIG. 98 is a schematic cross sectional view showing a structure of a semiconductor device in accordance with a third prior art example.

Other structures are approximately the same as those of the third prior art example shown in FIG. 98. Therefore, corresponding portions are denoted by the same reference characters and description thereof is not repeated.

The method of manufacturing the semiconductor device in accordance with the present embodiment will be described.

Figure 58:
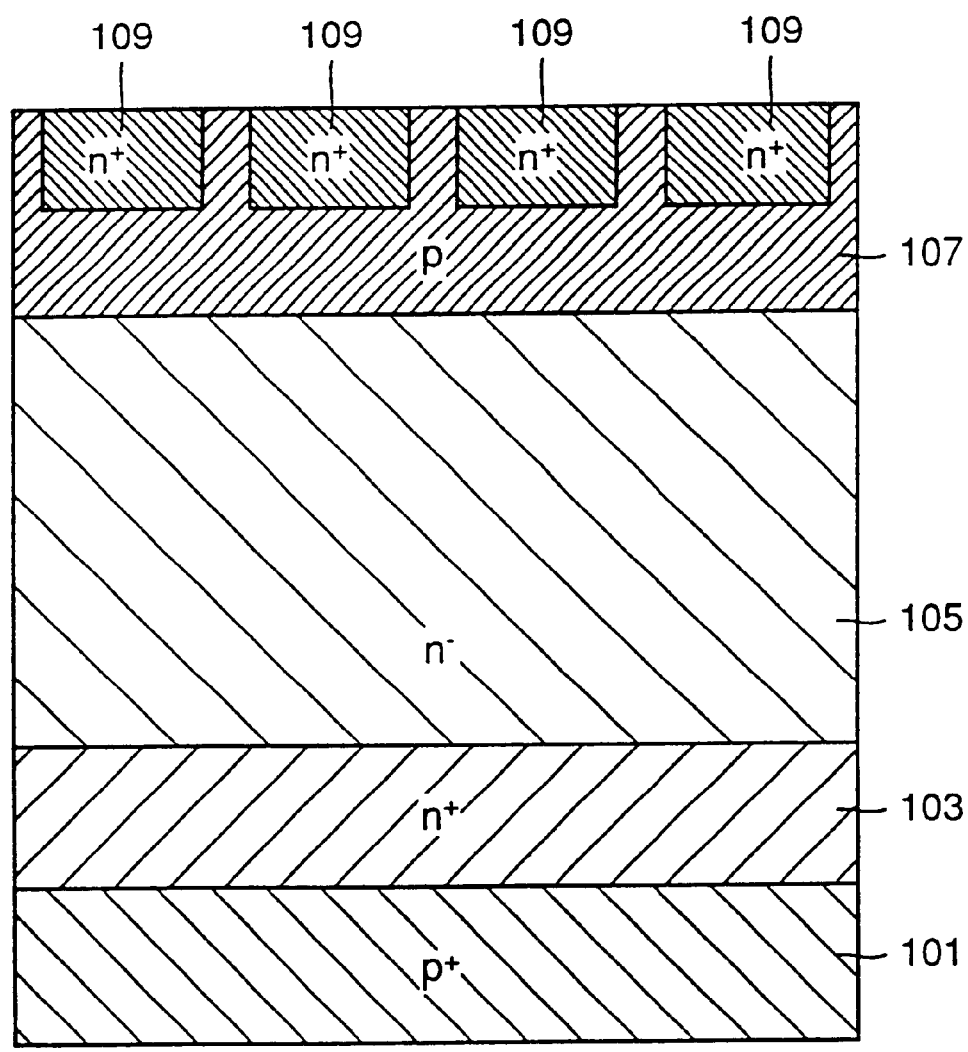
FIGS. 58 to 62 are schematic cross sectional views showing, in order, the method of manufacturing the semiconductor device in accordance with Embodiment 11 of the present invention.

First, referring to FIG. 58, $p^+$ collector region 101, $n^+$ buffer region 103 and $n^-$ region 105 are formed stacked successively. Thereafter, at the surface of $n^-$ region 105, p type base region 107 and $n^+$ emitter region 109 are formed.

Figure 59:
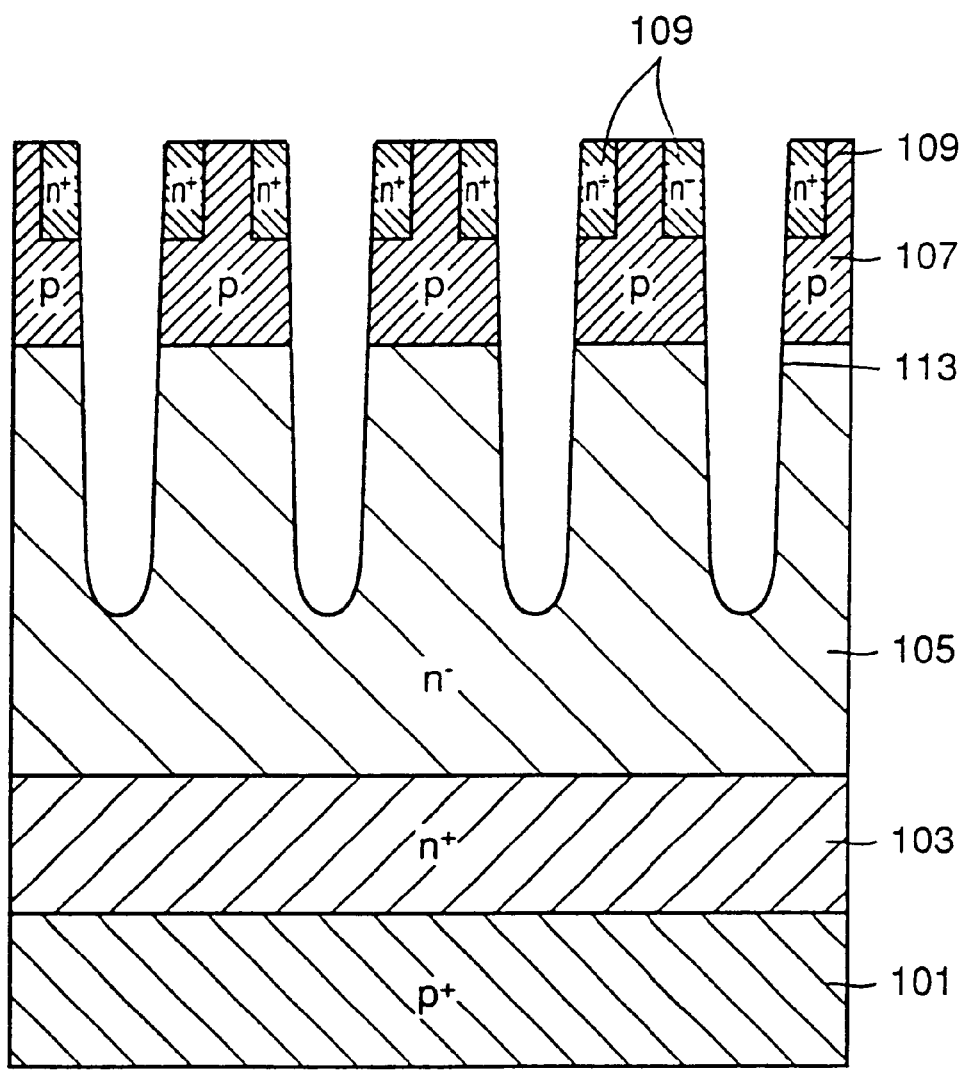

Referring to FIG. 59, by anisotropic etching of the substrate, trench 113 having its bottom reaching $n^-$ region 105 through $n^+$ emitter region 109 and p type base region 107 is formed. The trench 113 is formed to have the width of 0.8 to 3.0 μm and the depth of 5.0 to 15.0 μm, by controlling etching. More preferably, the trench has a depth of at least 10.0 μm.

Figure 60:
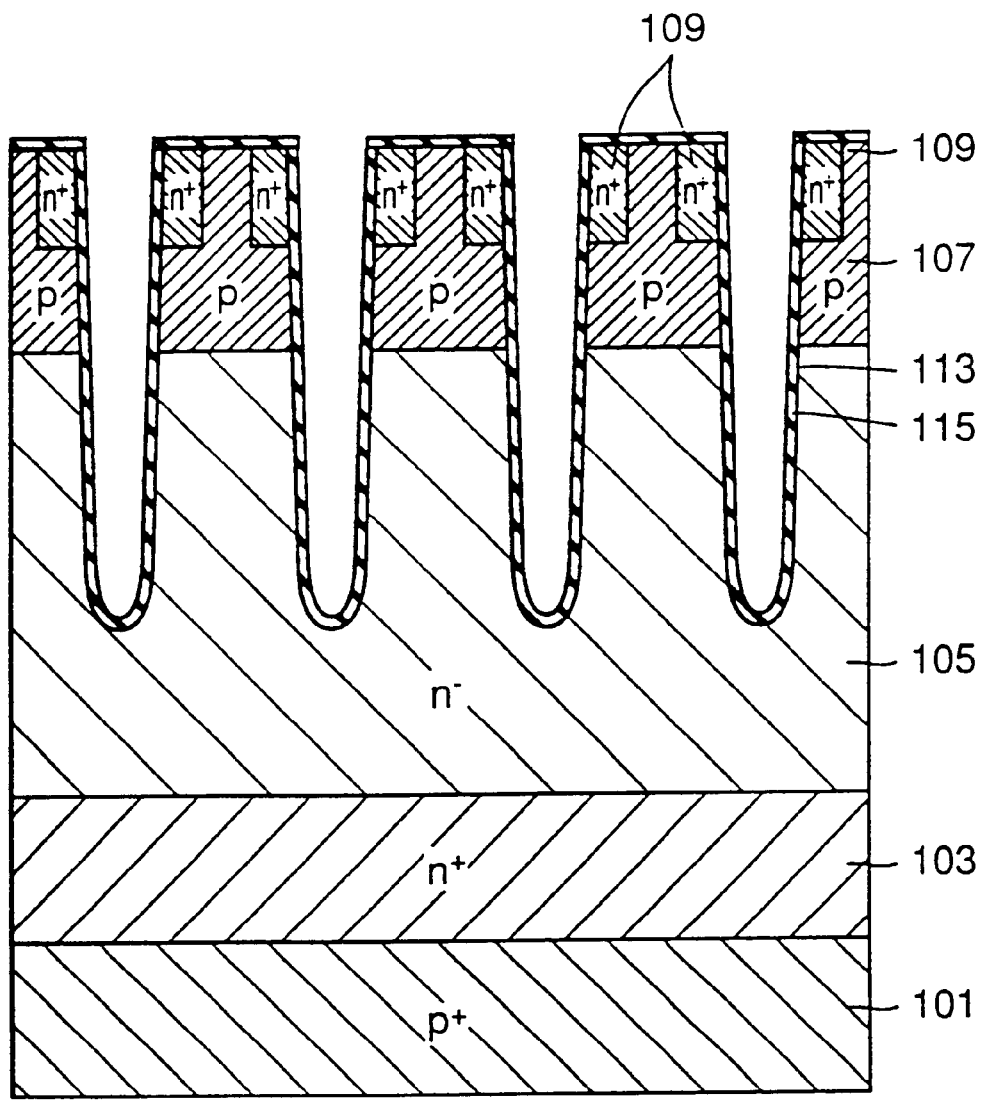

Referring to FIG. 60, by, for example, thermal oxidation, a gate oxide film 115 of silicon oxide film is formed along the inner wall surface of and covering the surface of trench 113.

Before the formation of gate oxide film 115 and after the formation of trench 113, isotropic plasma etching (i.e. chemical dry etching) may be performed followed by sacrificial oxidation to form a silicon oxide film once on the inner wall surface or the like of trench 113, so as to improve MOS characteristic and characteristic of gate oxide film.

Figure 61:
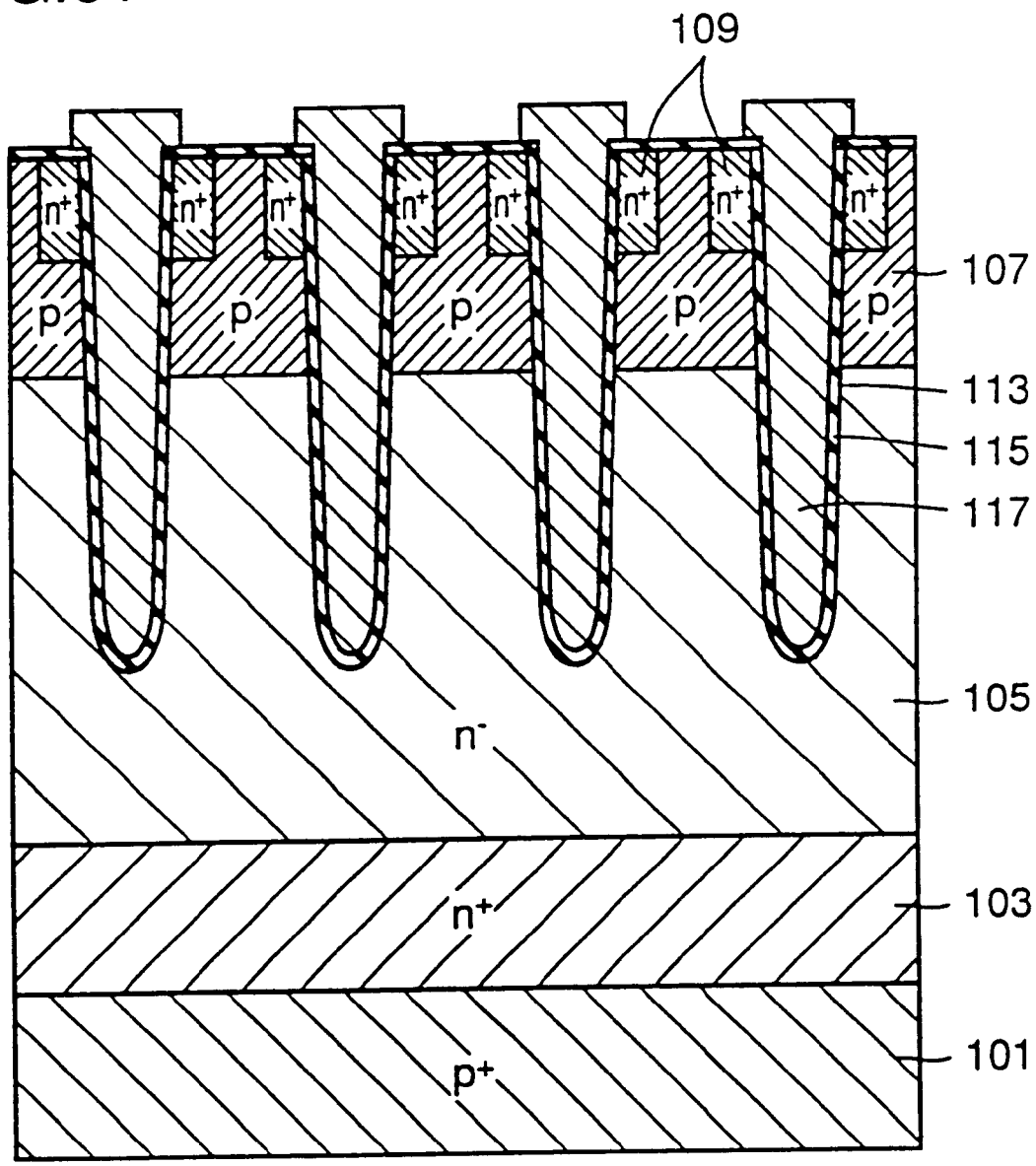

Referring to FIG. 61, a doped polysilicon layer, doped with an n type impurity such as phosphorous is formed to fill trench 113. By anisotropically etching the doped polysilicon layer, gate electrode layer 117 is formed which fill the trench 113 and has its upper end projecting from trench 113.

Figure 62:
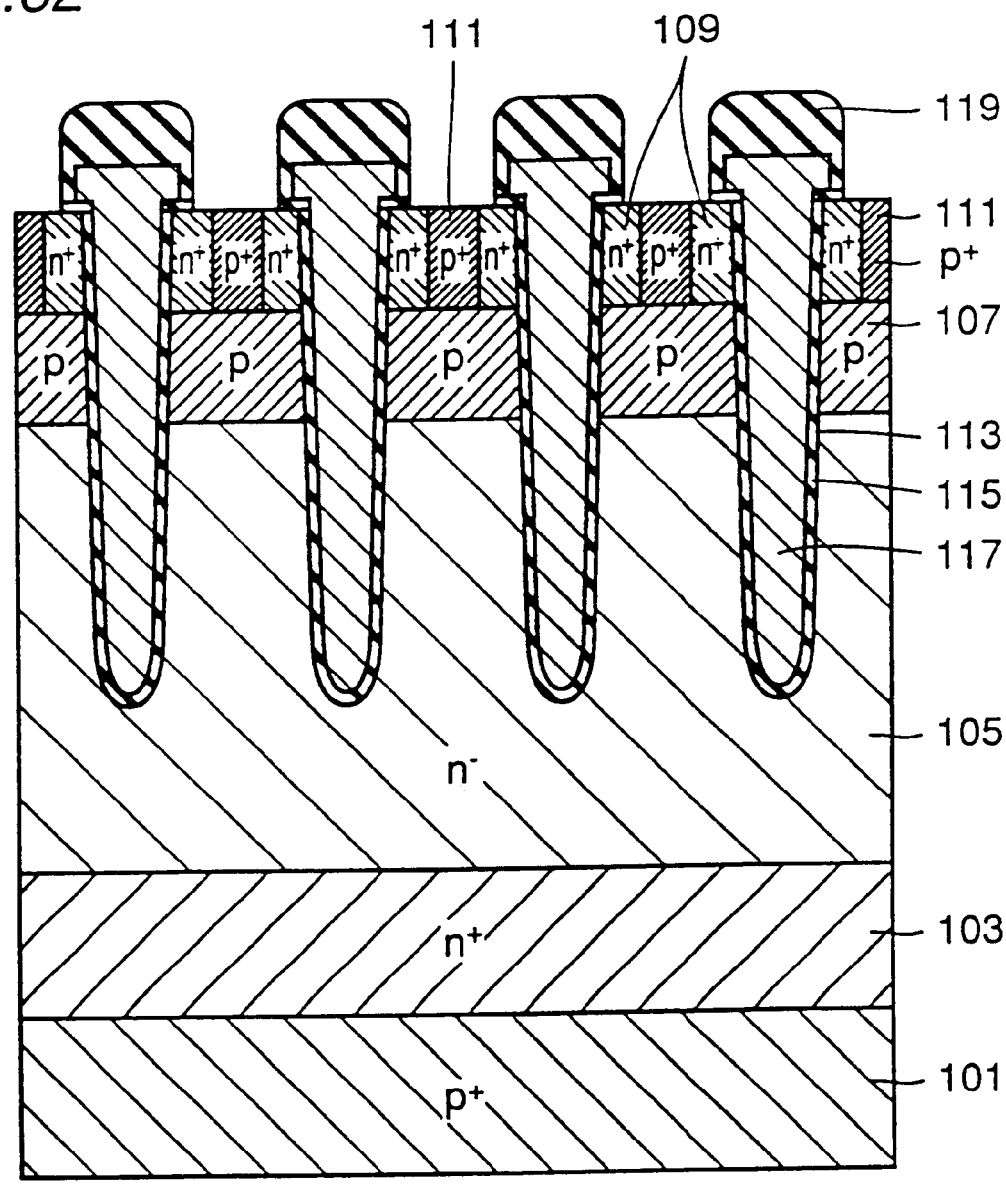

Referring to FIG. 62, at a region between trenches 113, a p$^+$ contact region 11 for reducing contact resistance is formed by implantation of p type ion and diffusion, for example. The p$^+$ contact region 111 must have concentration of at least $1 \times 10^{20}$ cm$^{-3}$, and it may have approximately the same depth as n$^+$ emitter region 109. An interlayer insulating layer 119 formed of an CVD oxide film such as BPSG is formed to cover the upper end of gate electrode layer 110 projecting from trench 113.

Thereafter, cathode electrode 121 is formed to be electrically connected to n$^+$ emitter region 109 and p$^+$ contact region 111, anode electrode 123 is formed to be electrically connected to p$^+$ collector region 101, and thus the semiconductor device shown in FIG. 57 is completed.

The method of controlling on and off states by gate electrode layer 117 in the semiconductor device in accordance with the present embodiment is approximately the same as in the third prior art example shown in FIG. 98. Therefore, description thereof is not repeated.

In view of the result shown in FIG. 22, the inventors have found that the larger the ratio Rn, the smaller the on-state voltage Vf. Especially, it was found that when the ratio Rn is at least 0.4, on-state voltage Vf becomes low and stable. Further, it was found that ratio Rn of 0.7 or higher is more preferable. When the ratio Rn in the IGBT structure of the prior art example (FIG. 98) is evaluated, it was found that the ratio Rn was smaller than 0.4, which means that electrons supplying capability from cathode surface is very poor.

Figure 99:
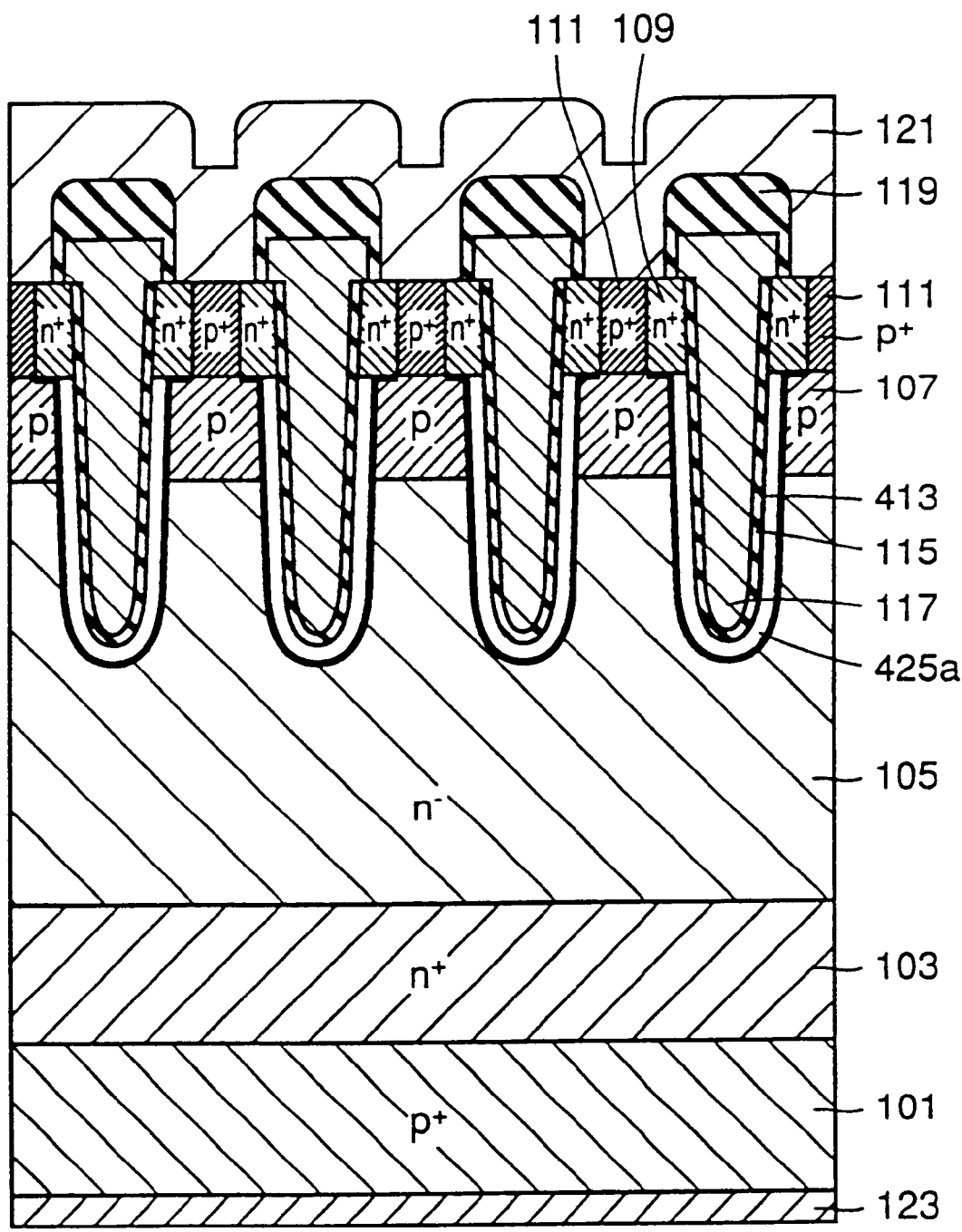
FIG. 99 is a schematic cross sectional view showing how an n$^+$ accumulation layer is generated in the third prior art example.

In the semiconductor device in accordance with the present embodiment, the depth of trench 113 is at least 5 μm which is deeper than the third prior art example shown in FIG. 98, and hence n$^+$ accumulation region 425a generated in on-state shown in FIG. 99 has larger distribution as compared with the third prior art example. Therefore, the effective cathode region constituted by n$^+$ accumulation region 425a and n$^+$ emitter region 109 becomes larger than the third prior art example, and hence larger effective cathode area can be ensured. Since effective cathode area shown in FIG. 22 is enlarged, the ratio Rn (=n/(n+p)) is increased. More specifically, the ratio Rn shown in FIG. 22 can be set to be 0.4 or higher, which value can not be obtained in the third prior art example shown in FIG. 98. Since the ratio Rn can be made higher than the third prior art example, on-state voltage Vf can be decreased from the third prior art example.

Here, the area p which is an element defining the ratio Rn refers to the contact area of p type base region 107 and n$^-$ region 105, which is represented by a thick line in FIG. 57.

The depth $T_{11}$ should preferably be at least 10 μm so as to decrease on-state voltage Vf.

According to the semiconductor device of the present embodiment, the control method by the gate electrode layer 117 is of voltage controlled type. Therefore, in the semiconductor device in accordance with the present embodiment, as compared with the first and second prior art examples, the structure of the gate control circuit can be simplified, the whole system can be reduced in size, simplified and energy consumption can be reduced.

Embodiment 12

Figure 63:
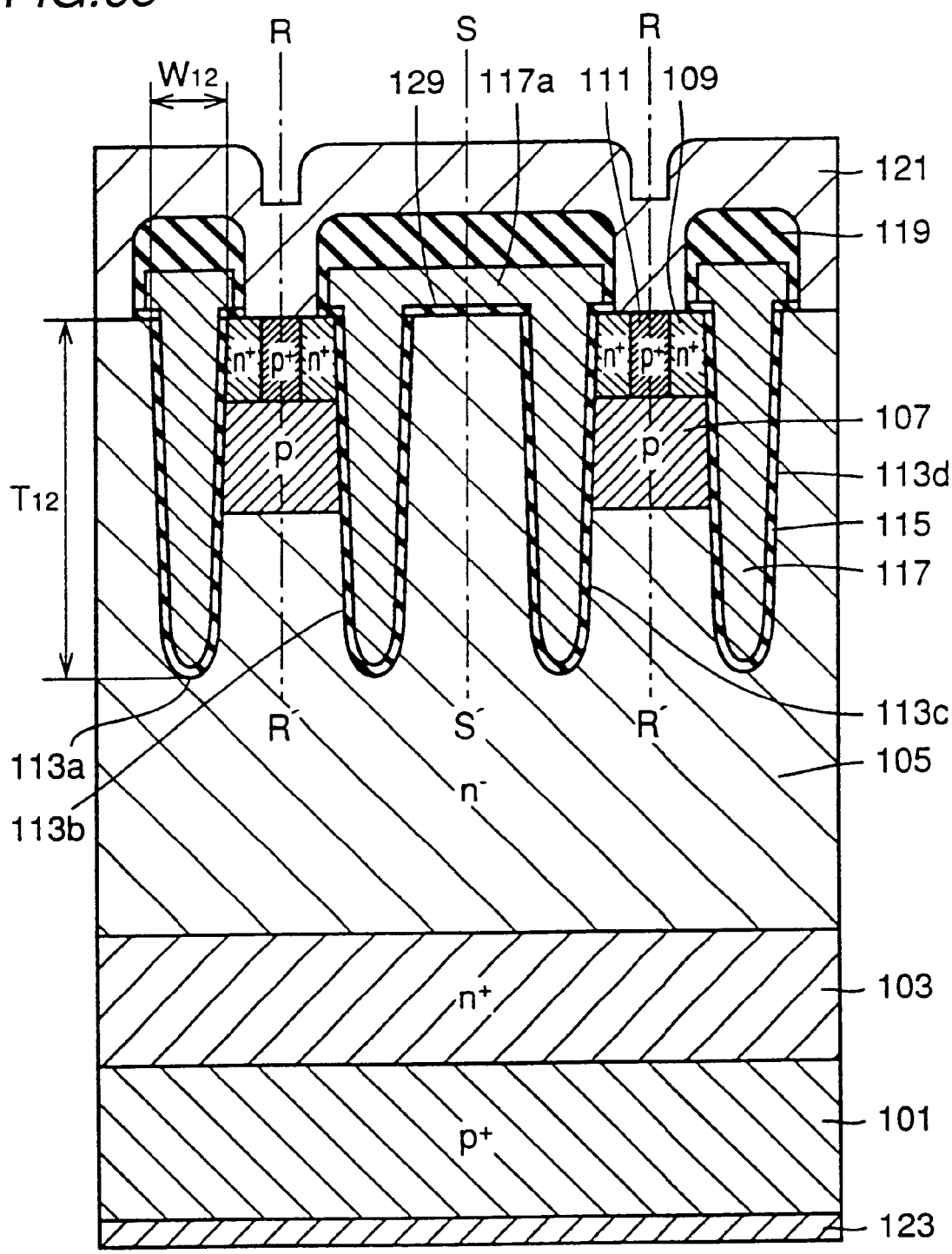
FIG. 63 is a cross sectional view schematically showing the structure of the semiconductor device in accordance With Embodiment 12 of the present invention.

Referring to FIG. 63, the structure of the semiconductor device in accordance with the present embodiment differs from the structure of the semiconductor device in accordance with Embodiment 11 in the structure of the region 31 between the trenches and the structure of gate electrode layer.

In the region sandwiched between trenches 113a and 113b and in the region sandwiched between trenches 113c and 113d, p type base region 107, n$^+$ emitter region 109 and p$^+$ contact region 111 are formed as in Embodiment 11. In the region sandwiched between trenches 113b and 113c, p type base region 107 and the like are not formed, and only n$^-$ region 105 is positioned.

Gate electrode layer 117 filling trench 113b and gate electrode layer 117 filling trench 113c are formed integrally by a conducting portion 117a, and they are electrically connected to each other. The conducting portion 117a is formed on the region sandwiched between trenches 113b and 113c, with an insulating film 129 interposed.

Other structures are approximately the same as those of Embodiment 11. Therefore, corresponding portions are denoted by the same reference characters, and description thereof is not repeated.

The above described structure will be hereinafter referred to as MAE (MOS Accumulated Emitter) structure.

The structure of the present embodiment is in line symmetry with respect to both lines R–R' and S–S' of FIG. 63. Therefore, a unit cell may be regarded as a structure between R–R' line and S–S' line, or it may be considered as a structure between one R–R' line and another R–R'line. Here, for convenience of calculation of the ratio Rn, the former structure, that is, the structure between R–R' line and S–S' line is regarded as a unit cell.

The method of manufacturing a semiconductor device in accordance with the present embodiment will be described.

Figure 64:
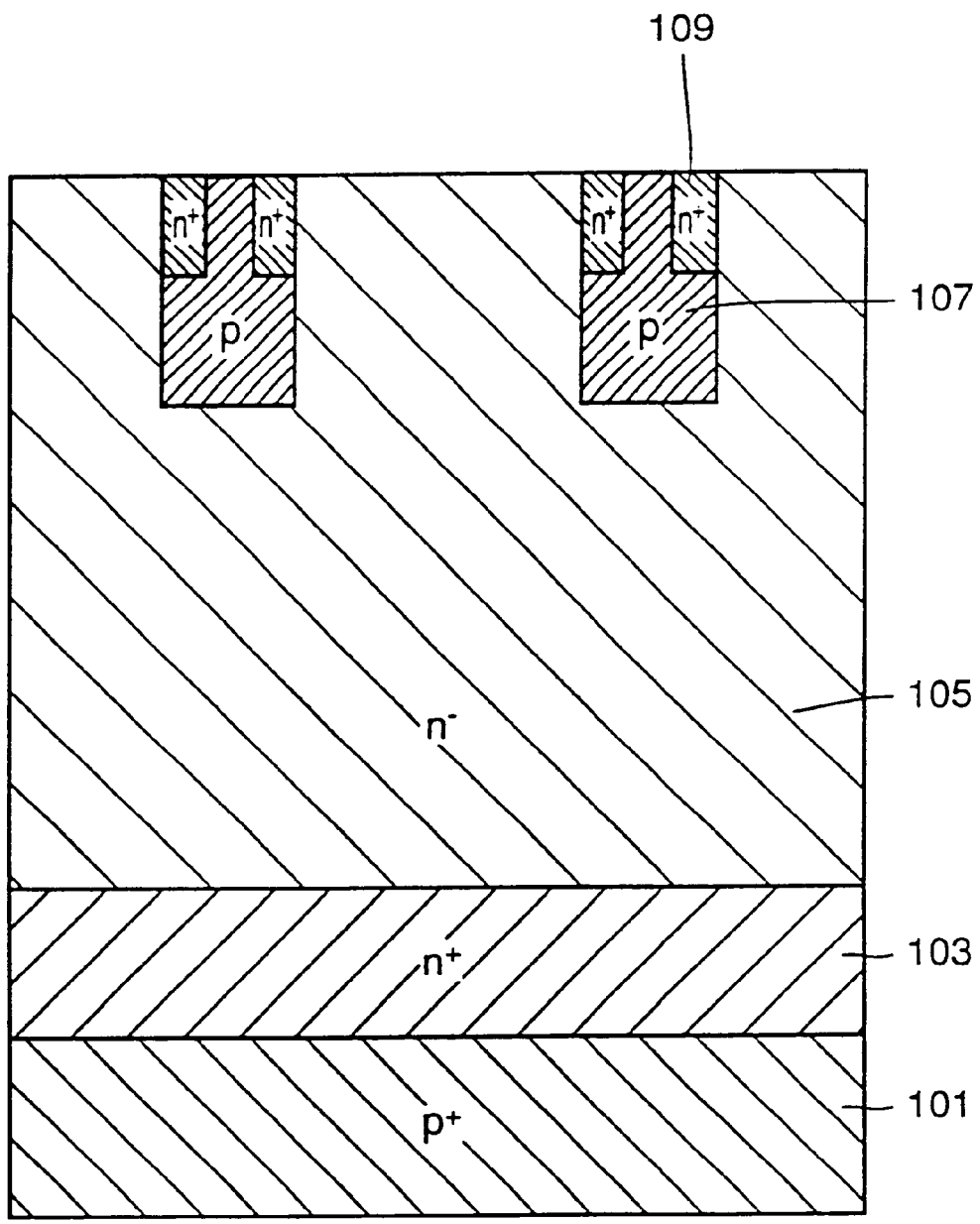
FIGS. 64 to 67 are schematic cross sectional views showing, in order, the method of manufacturing a semiconductor device in accordance with Embodiment 12 of the present invention.

Referring to FIG. 64, p$^+$ collector region 101, n type buffer region 103 and n$^-$ region 105 are formed stacked successively. Thereafter, at the surface of n$^-$ region 105, p type base region 107 and n$^+$ emitter region 109 are selectively formed.

Figure 65:
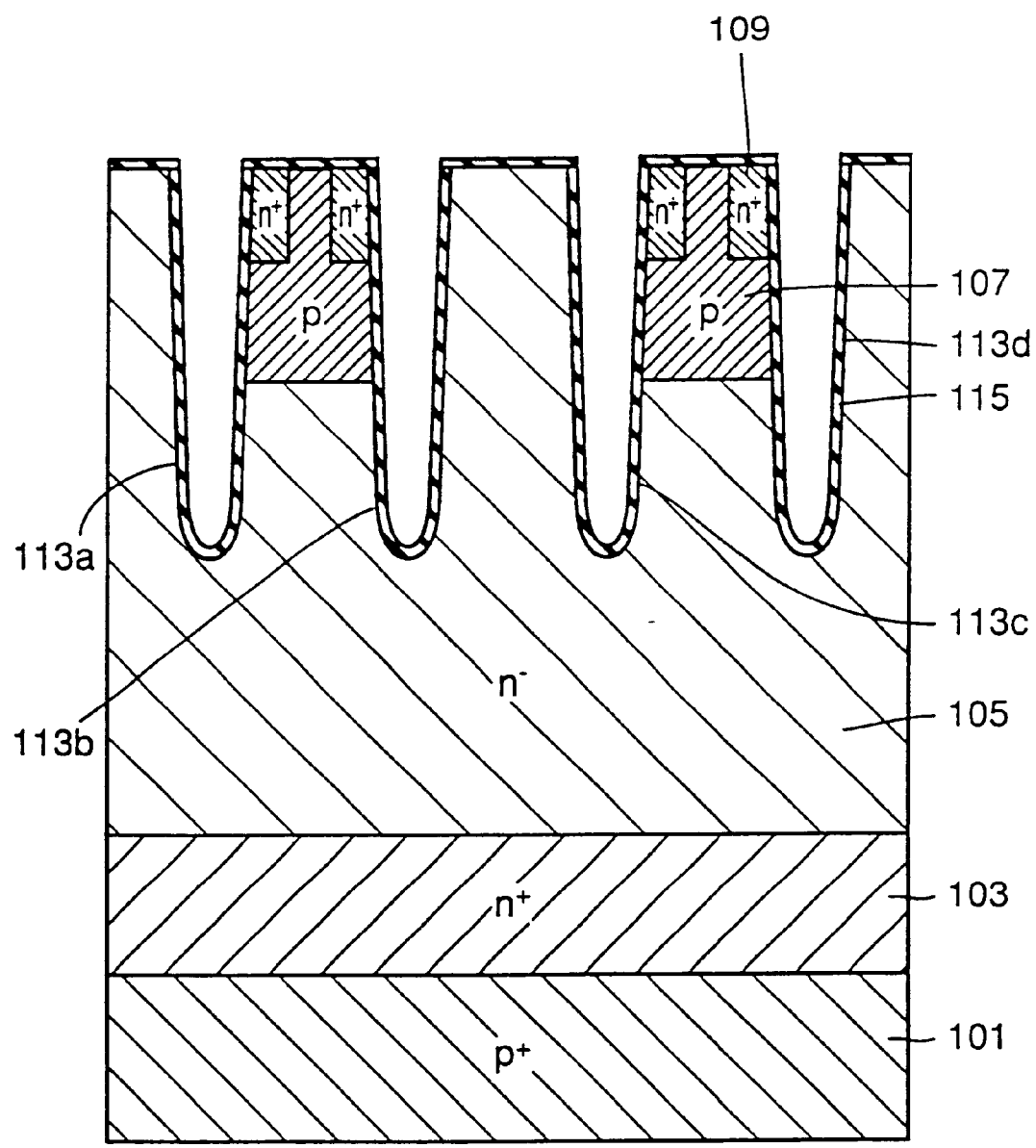

Referring to FIG. 65, by anisotropic dry etching used in common semiconductor process, trenches 113a to 113d are formed at the substrate surface which will be the first main surface. Each trench is formed to have the width of 0.8 to 3.0 μm and the depth of 5 to 15 μm by etching control, as in Embodiment 11. The trenches are formed such that in the region sandwiched between trenches 113a and 113b and in the region sandwiched between trenches 113c and 113d, p type base region 107 and n$^+$ emitter region 109 are positioned, and that in the region sandwiched between trenches 113b and 113c, only the n$^-$ region 105 is positioned. In this state, the n$^+$ emitter region 109 is positioned along the sidewall of the trench.

Gate oxide film 115 of silicon oxide film is formed along the inner wall surface of and to cover the surface of trenches 113a to 113d, by, for example, thermal oxidation.

Before the formation of gate oxide film 115 and after the formation of each trench, isotropic plasma etching may be performed, followed by sacrificial oxidation to form a silicon oxide film on the inner wall surface of each trench, so that MOS characteristic and the characteristic of the gate oxide film 115 can be improved.

Figure 66:
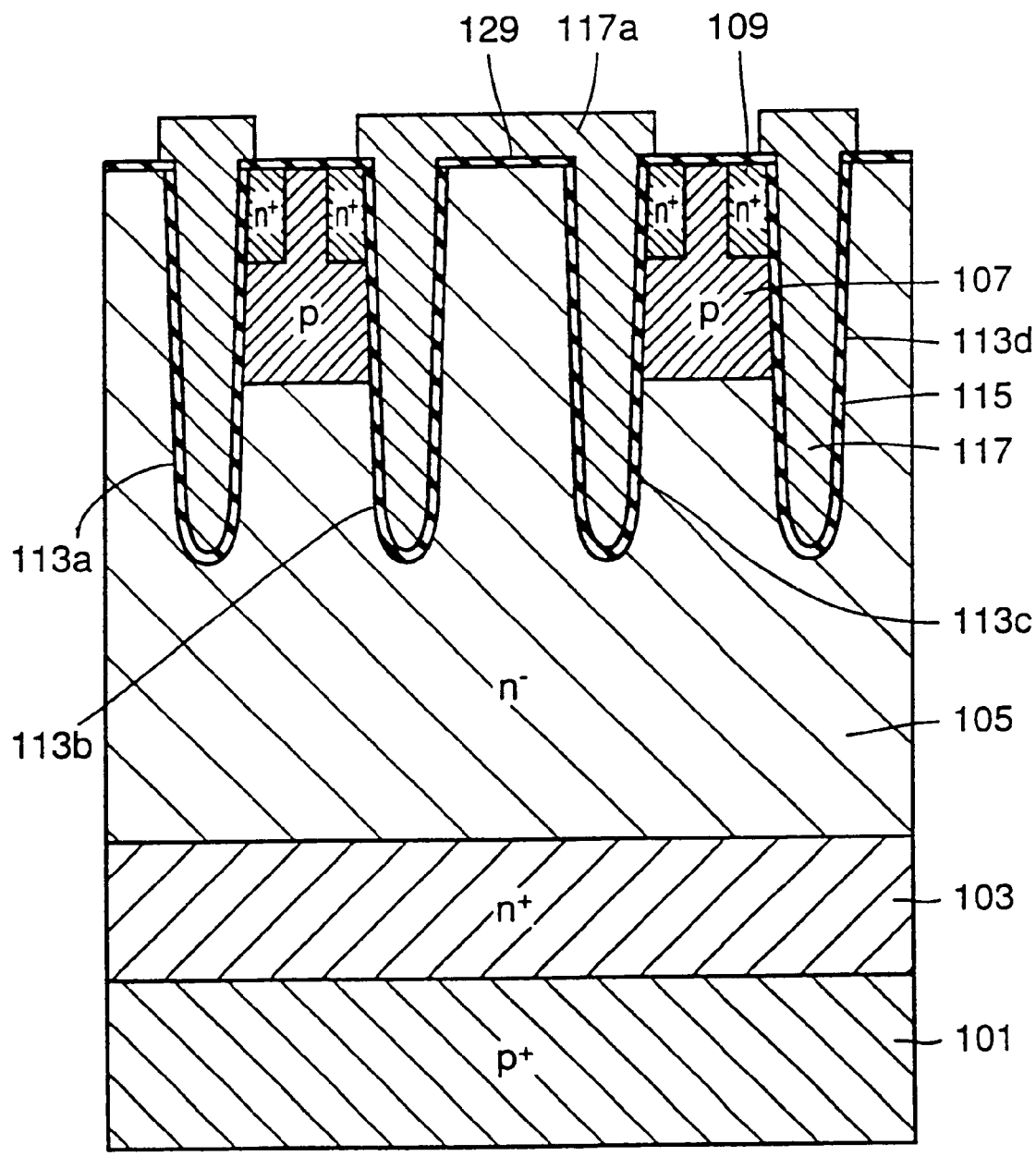

Referring to FIG. 66, a doped polysilicon layer doped with an n type impurity such as phosphorus is formed to fill each trench. By anisotropic etching of doped polysilicon layer, gate electrode layer 117 is formed to fill each trench with its upper end projecting from each trench. Gate electrode layers 117 filled in trenches 113b and 113c are formed integrally by conducting portion 117a to be electrically connected to each other. The conducting portion 117a is formed at the surface region sandwiched between trenches 113b and 113c with an insulating film interposed.

Thereafter, at a region between trenches 113a and 113b and at a portion between trenches 113c and 113d, $p^+$ contact regions 111 are formed to reduce contact resistance by selective impurity implantation of p type and diffusion, for example.

Figure 67:
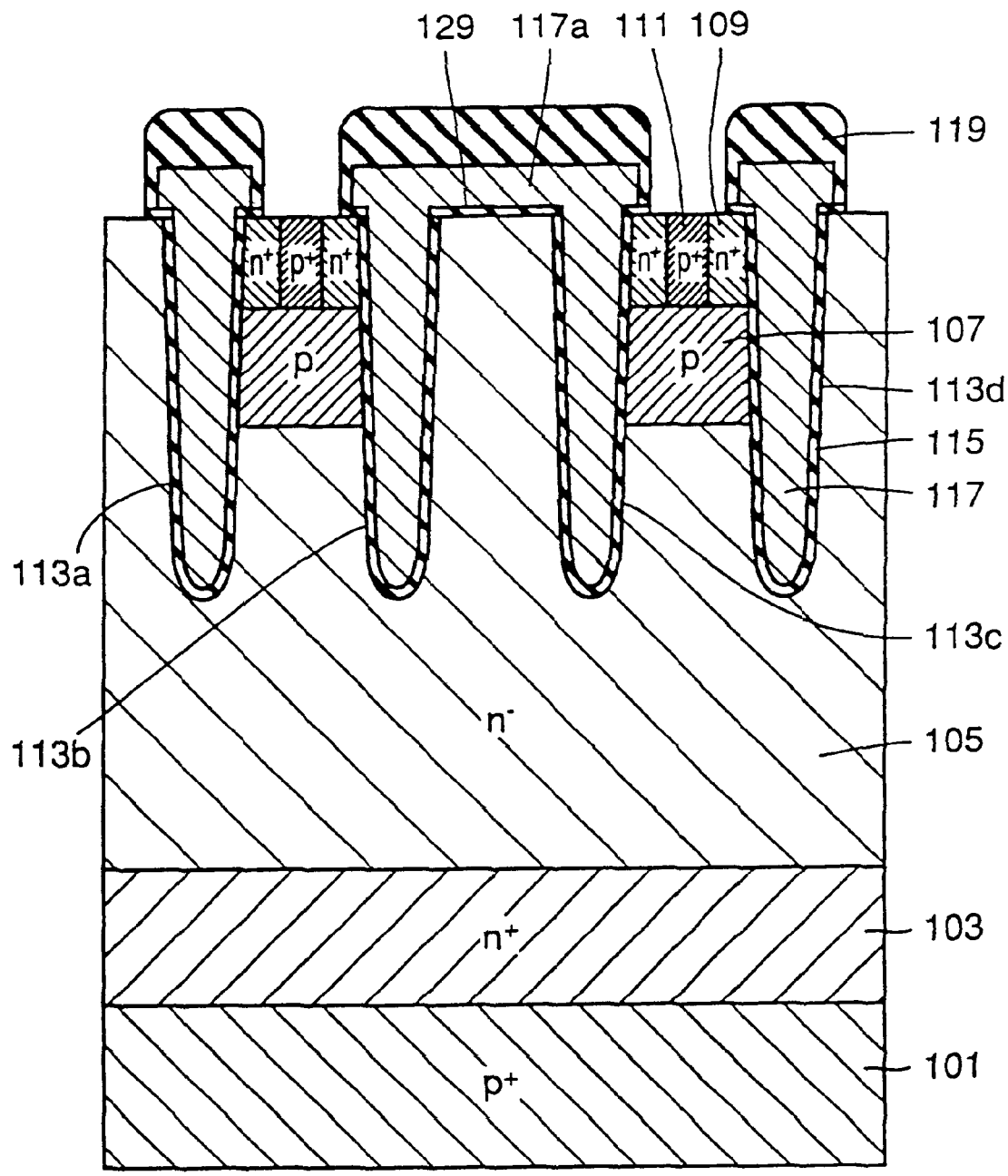

Referring to FIG. 67, an interlayer insulating layer 119 formed of a CVD oxide film such as BPSG is formed to cover the upper end of gate electrode layer 117 protruding from each trench.

Thereafter, cathode electrode 121 is formed to be electrically connected to $n^+$ emitter region 109 and $p^+$ contact region 111, and anode electrode 123 is formed to be electrically connected to $p^+$ collector region 101, and thus the semiconductor device shown in FIG. 63 is completed.

The method of controlling on and off states by gate electrode layer 117 in the present embodiment is approximately the same as the third prior art example shown in FIG. 98. Therefore, description thereof is not repeated.

Figure 68:
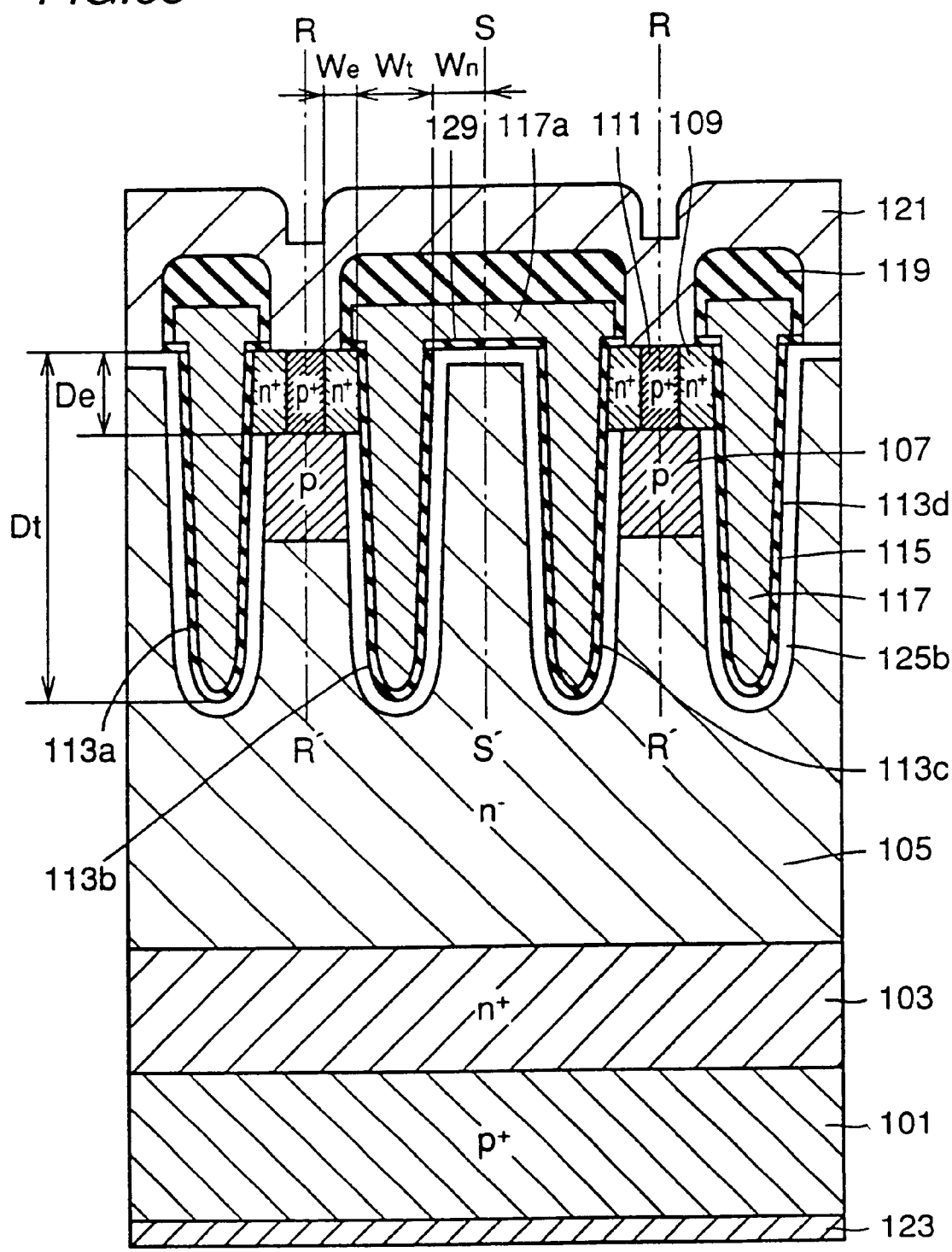
FIG. 68 is a schematic cross sectional view showing on-state of the semiconductor device in accordance with Embodiment 12 of the present invention.

However, when a positive voltage is applied to gate electrode layer 117 in on-state, there will be $n^+$ accumulation layer 125b generated as shown in FIG. 68.

In the semiconductor device in accordance with the present embodiment, the conducting portion 117a is electrically connected to gate electrode layers 117 filling trenches 113b and 113c, as shown in FIG. 63. Therefore, when a positive voltage is applied to gate electrode layer 117 in on-state, the positive voltage is also applied to conducting portion 117a. The conducting portion 117a opposes to $n^-$ region 105 sandwiched between trenches 113b and 113c, with insulating film 129 interposed. Therefore, when the positive voltage is applied to conductive layer 117a, there will be $n^+$ accumulation region 125b generated at the surface region sandwiched between trenches 113b and 113c, as shown in FIG. 68. Since it is possible to generate $n^+$ surface region 125b even at the surface region between trenches 113b and 113c, the effective cathode area in the unit cell can be enlarged from that of Embodiment 11. Therefore, efficiency in injecting electrons on the cathode side can further be improved and on-state voltage Vf can further be reduced. Further, the ratio Rn becomes higher than 0.4 and close to 1.

In the semiconductor device in accordance with the present embodiment, the control method by gate electrode layer 117 is of voltage controlled type. Therefore, in the semiconductor device in accordance with the present embodiment, as compared with the first and second prior art examples, the structure of the gate control circuit can be simplified, as already described. Accordingly, the whole system can be reduced in size and simplified and energy consumption can be reduced.

Further, since the depth of trench 113 is at least 5 μm, on-state voltage Vf can be made lower than the third prior art example, as already described with reference to Embodiment 11.

Embodiment 13

Figure 69:
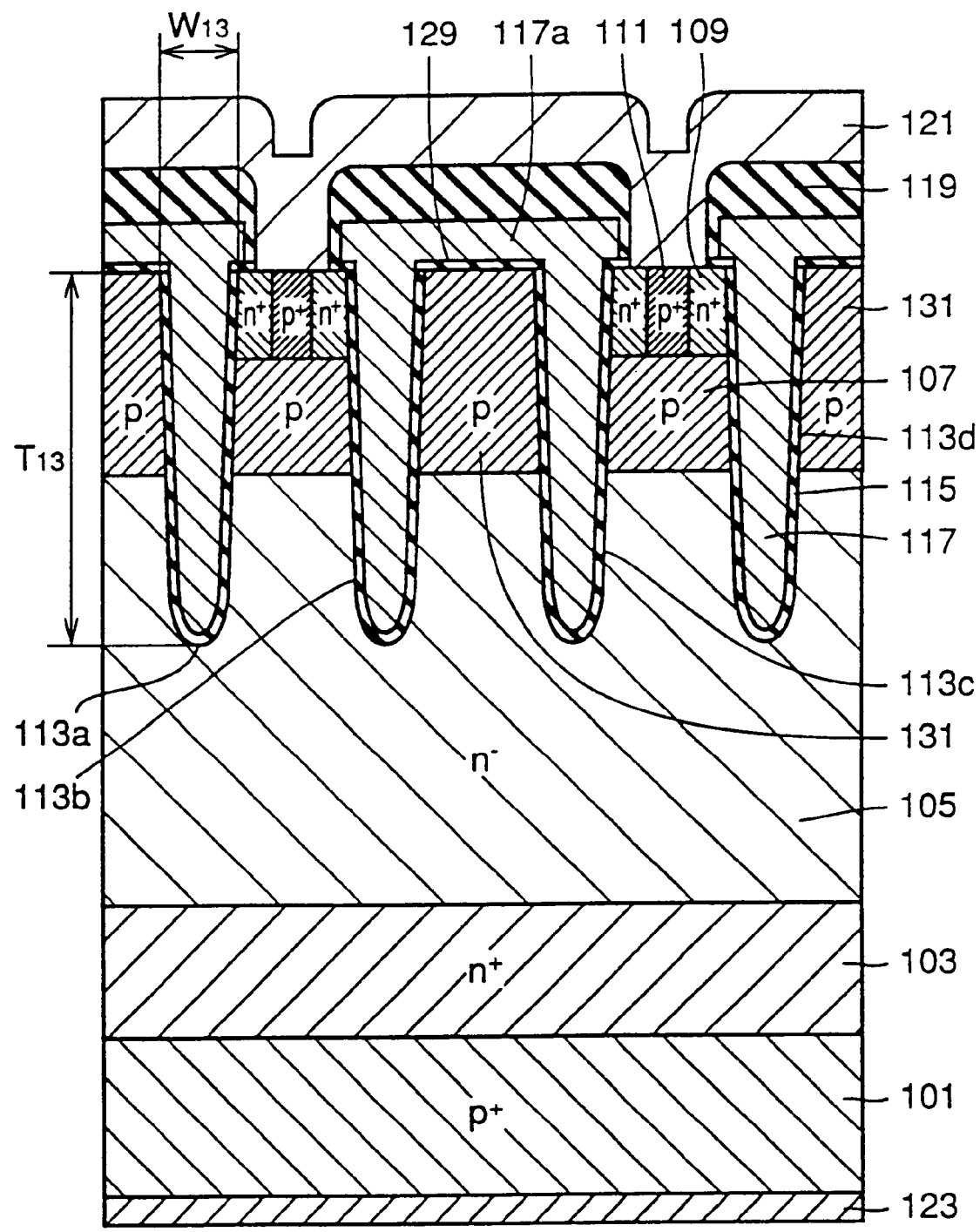
FIG. 69 is a cross sectional view schematically showing a structure of a the semiconductor device in accordance with Embodiment 13 of the present invention.

Referring to FIG. 69, the semiconductor device in accordance with the present embodiment differs from Embodiment 12 in that it has a second p type base region 131. The second p type base region 131 is formed, for example, at a surface region between trenches 113b and 113c. The second p type base region 131 is formed, for example, at every other region between the trenches. Further, the second p type base region 131 has lower impurity concentration than p type base region 107.

Other structures are approximately the same as those of Embodiment 12. Therefore, corresponding portions are denoted by the same reference characters and description thereof is not repeated.

The method of manufacturing a semiconductor device in accordance with the present embodiment will be described.

Figure 70:
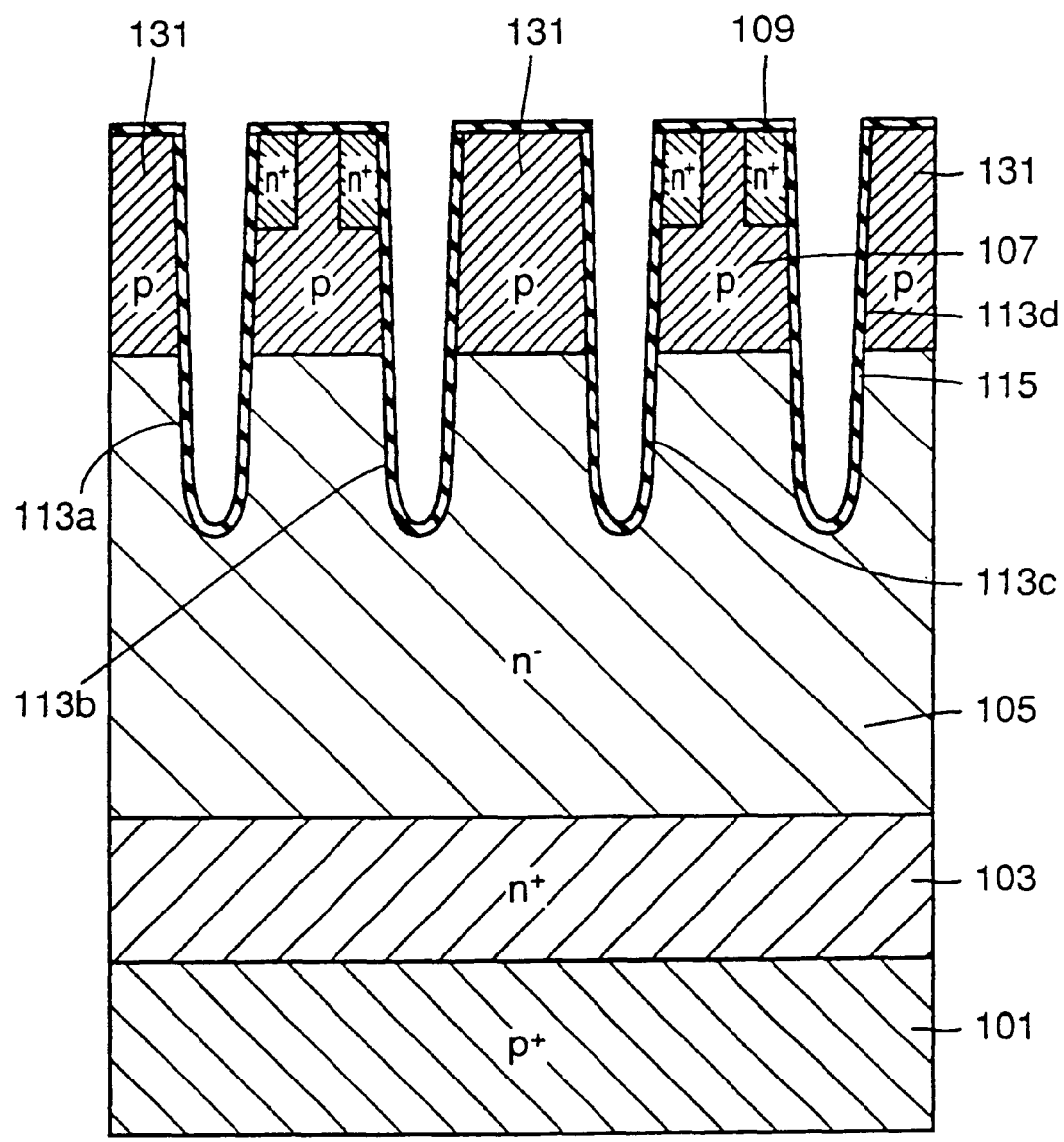
FIG. 70 shows a step of manufacturing the semiconductor device in accordance with Embodiment 13 of the present invention.

Referring to FIG. 70, $p^+$ collector region 101, $n^+$ buffer region 103 and $n^-$ region 105 are formed stacked successively. At the surface of $n^-$ region 105, p type base region 107, the second p type base region 131 and $n^+$ emitter region 109 are each formed by ion implantation and diffusion. Here, the second p type base region 131 is formed to have lower impurity concentration than p type base region 107.

Thereafter, by photolithography and etching (RIE), trenches 113a to 113d having its bottom region reaching $n^-$ region 105 through p type base region 107, $n^+$ emitter region 109 and second p type base region 131 are formed. Each trench is formed to have the width of 0.8 to 3.0 μm and the depth of 5 to 15 μm.

Thereafter, by thermal oxidation, for example, gate oxide film 115 of silicon oxide film is formed along the inner wall surface of each trench. Before formation of gate oxide film 115 and after the formation of each trench, isotropic plasma etching may be performed followed by the sacrificial oxidation to form silicon oxide film on the inner wall surface of each trench, so that MOS characteristics and characteristics of gate oxide film 115 can be improved.

Thereafter, similar steps as in Embodiment 12 shown in FIGS. 66 and 67 above are performed, and the semiconductor device shown in FIG. 69 is completed.

The method of controlling on and off states by gate electrode 117 of the present embodiment is approximately the same as described with reference to the third prior art example. Therefore, description thereof is not repeated.

Figure 71:
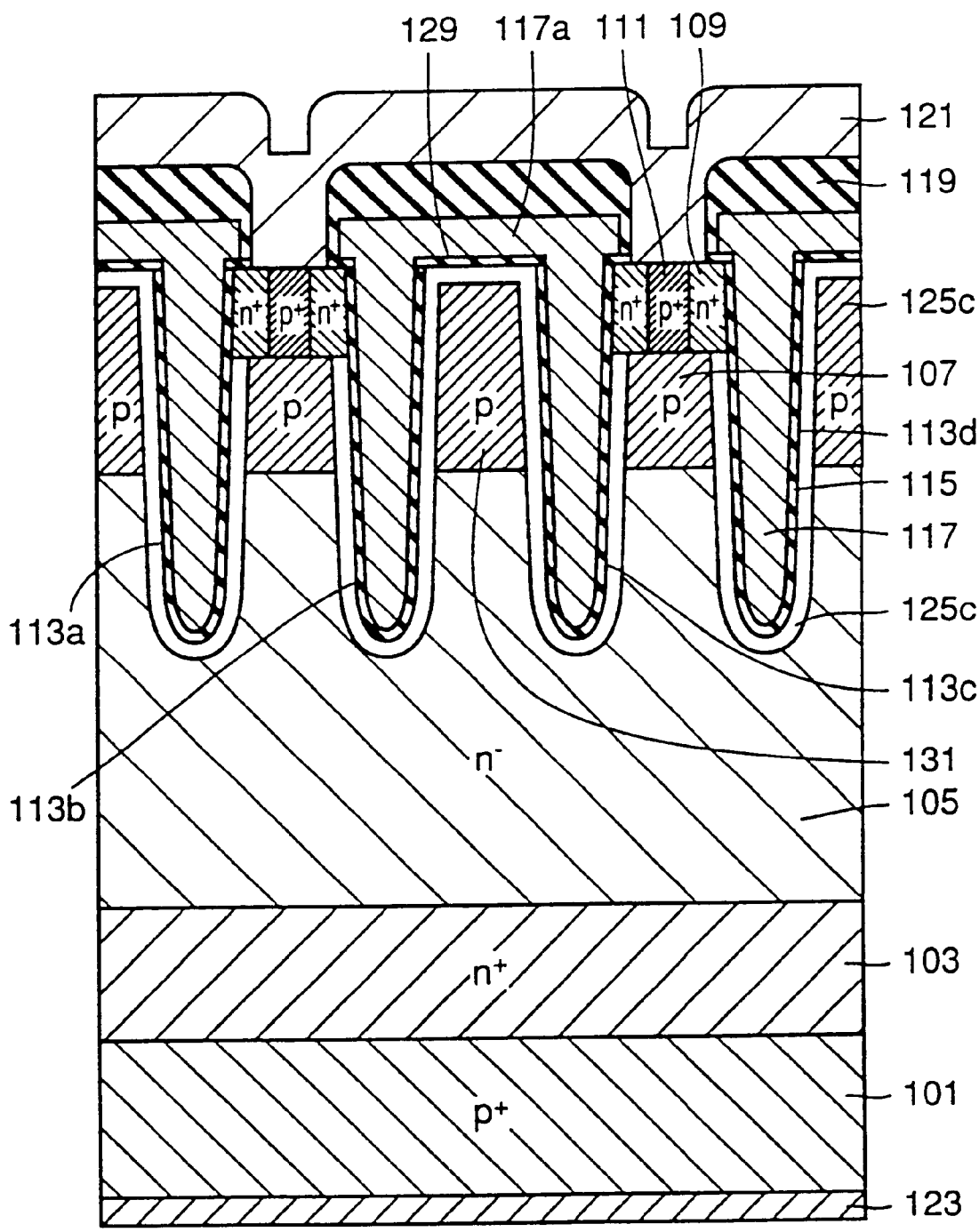
FIG. 71 is a schematic cross sectional view showing on-state of the semiconductor device in accordance with Embodiment 13 of the present invention.

However, when a positive voltage is applied to gate electrode layer 117 in on-state, there will be $n^+$ accumulation region 125c having high electron density as shown in FIG. 71. Further, thyristor operation occurs in the region between trenches 113b and 113c.

In the semiconductor device in accordance with the present embodiment, as in Embodiment 12, $n^+$ accumulation region 125c may be generated also at the surface region between trenches 113b and 113c, as shown in FIG. 71. Therefore, as in Embodiment 12, efficiency in injecting electrons of the cathode side can be enhanced, and on-state voltage Vf of the diode can be reduced. Consequently, ratio Rn becomes 0.4 or higher, closer to 1.

Further, since the second p type base region 131 has lower concentration than p type base region 107, thyristor operation occurs at the region sandwiched between trenches 113b and 113c. As a result, ON voltage can be decreased when rated current is conducted.

Further, at off-state, a negative voltage is applied to gate electrode layer 117. Therefore, at the portion along the sidewall of trenches 113b and 113c of the second p type base region 131 and at the surface region of the substrate, p⁺ inversion region s are formed. Therefore, as already described, holes which are carriers tend to be more easily extracted from p⁺ inversion region, making shorter than turn-off time and smaller the tail current. Since tail current at the time of turn off is reduced, turn off loss $E_{off}$ can also be reduced.

In the semiconductor device in accordance with the present embodiment, the control method by gate electrode layer 117 is of voltage controlled type. Therefore, in the semiconductor device in accordance with a present embodiment, the structure of the gate control circuit can be simplified as compared with the first and second prior art examples. Further, the whole system can be reduced in size, simplified and power consumption can be reduced.

In the semiconductor device in accordance with the present embodiment, as in Embodiment 11, the thickness $T_{13}$ of trenches 113a–113d is at least 5 µm. Therefore, As already described with reference to Embodiment 11, on-state voltage Vf can be lower than the third prior art example.

Embodiment 14

Figure 72:
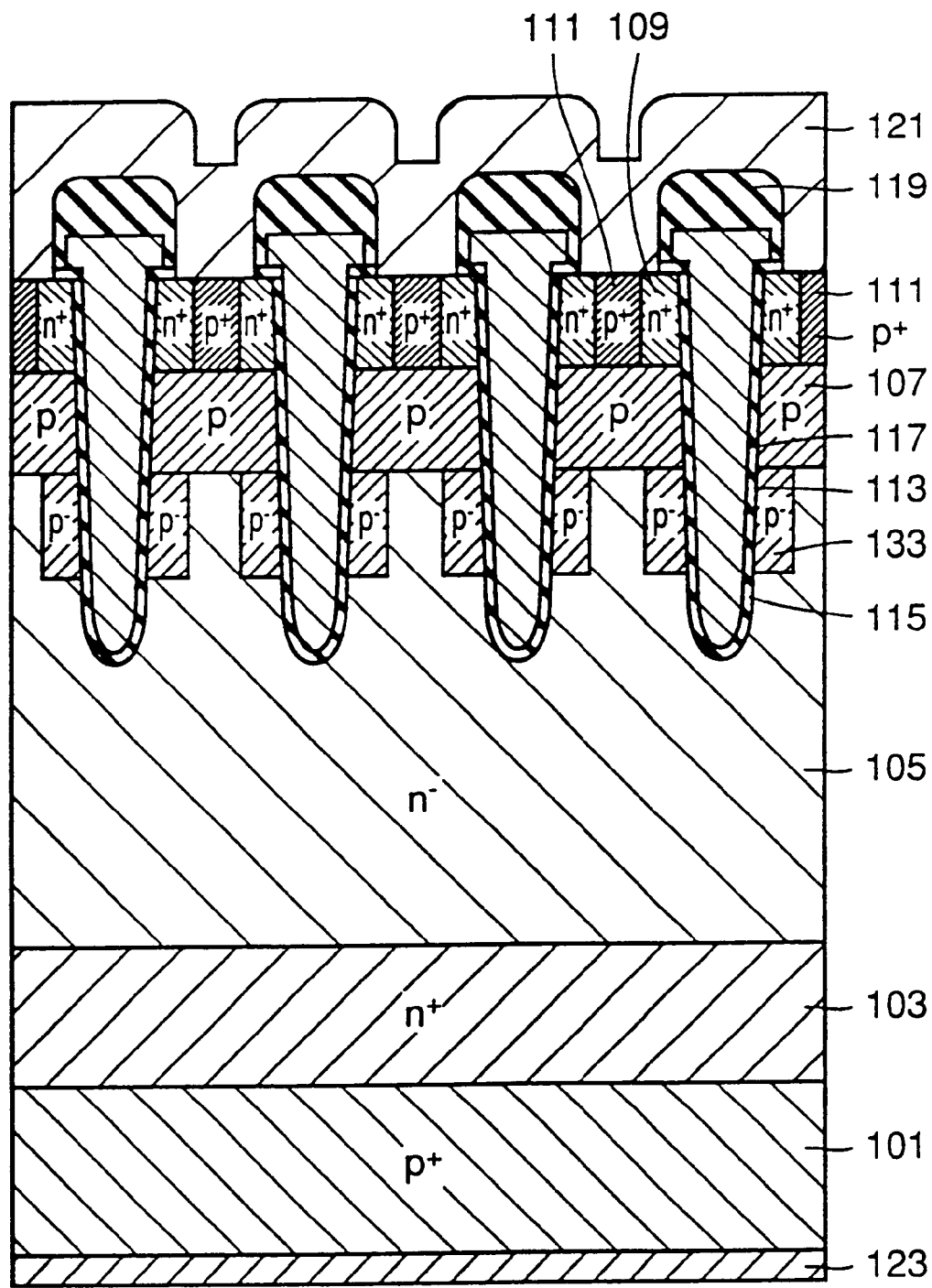
FIG. 72 is a cross sectional view schematically showing the structure of a semiconductor device in accordance with Embodiment 14 of the present invention.

Referring to FIG. 72, the structure of the semiconductor device in accordance with the present embodiment differs from the structure of Embodiment 11 in that p⁻ base region 133 is provided. The p⁻ base region 133 is positioned below p type base region 107 and arranged along the sidewall of trench 113. The p⁻ base region 133 has impurity concentration of $1 \times 10^{14}$ cm⁻³ to $1 \times 10^{16}$ cm⁻³.

Other structures are approximately the same as those of Embodiment 11. Therefore, corresponding portions are denoted by the same reference characters and description thereof is not repeated.

In the semiconductor device in accordance with the present embodiment, when a negative voltage is applied to gate electrode layer 117 at off-state, a p⁺ inversion layer is formed at a portion along trench 113 in p⁻ base region 133. Therefore, at the time of turn off of the device, extraction of the holes, which are carriers can be carried out smooth, resulting in improved switching characteristic.

When a positive voltage is applied to gate electrode layer 117 at on-state, an inversion n layer is formed at a portion along trench 113 in p base region 133. Therefore, the ratio Rn can be kept high.

Accordingly, while ratio Rn is kept high, the switching characteristic can be improved.

Further, in the semiconductor device in accordance with the present embodiment, the control method by gate electrode layer 117 is of voltage controlled type. Therefore, in the semiconductor device in accordance with the present embodiment, the structure of the gate control circuit can be simplified as compared with the first and second prior art examples, as already described above. Further, the whole system can be reduced in size and simplified, and energy consumption can be reduced.

Further, in a semiconductor device in accordance with the present embodiment, the depth of trench 113 is at least 5 µm, as in Embodiment 11.

Therefore, as in Embodiment 11, on-state voltage Vf can be made lower than the third prior art example.

Embodiment 15

Figure 73:
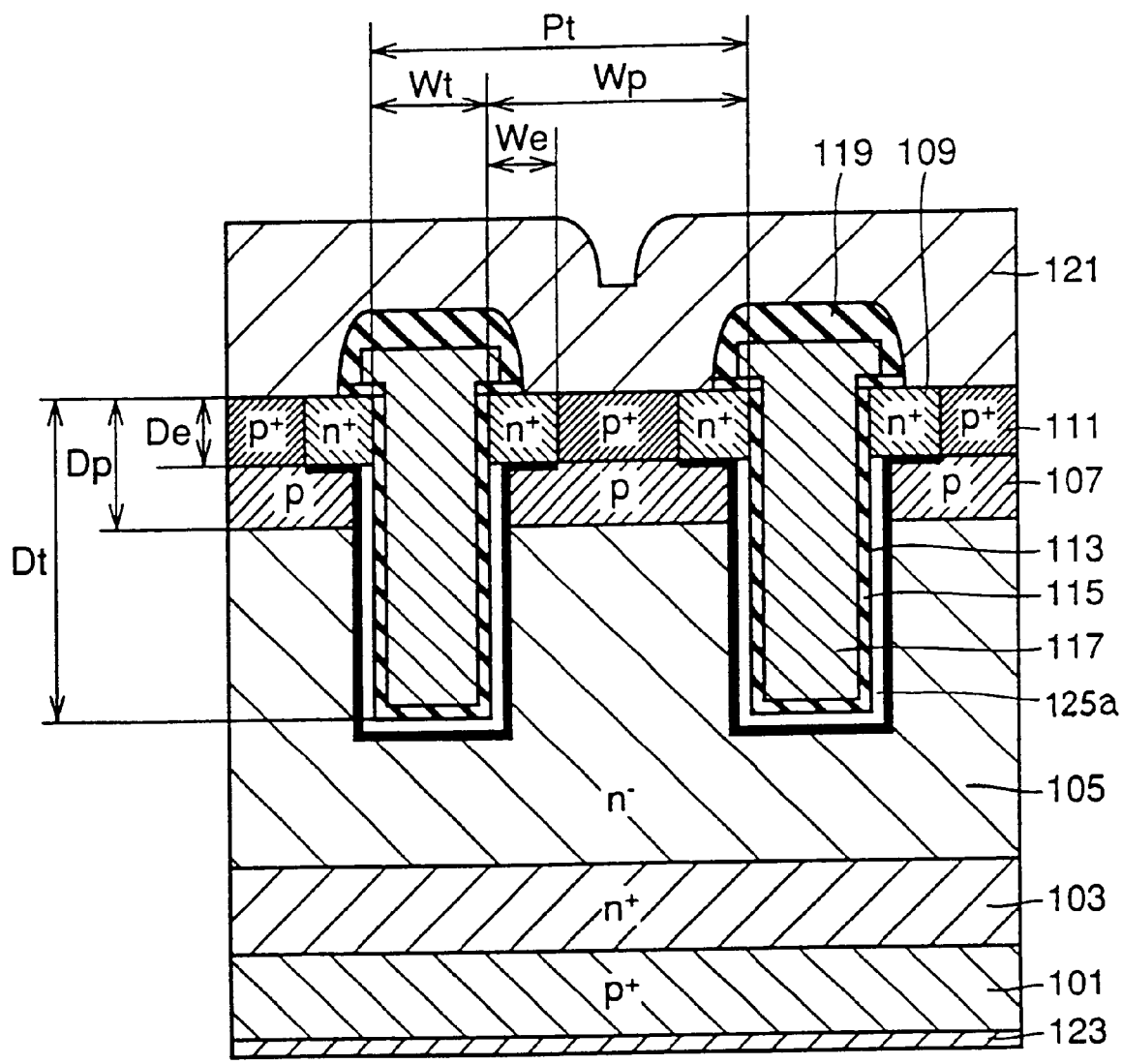
FIG. 73 is a partial cross sectional view schematically showing a structure of a semiconductor device in accordance with Embodiment 15 of the present invention.

FIG. 73 is a cross sectional view schematically showing a portion of the structure shown in FIG. 57.

Referring to FIG. 73, the inventors have found that the ratio Rn can be approximated using dimensions of respective portions of IGBT. The ratio Rn can be represented as Rn=n/(n+p), as already described with reference to Embodiment 3. Here, the term n represents the area of the portion denoted by the thick line in FIG. 73. More specifically, the area n is the sum of the area of contact of n⁺ accumulation region 125a, n⁻ region 105 and p type base region 107 and the area of the contact of n⁺emitter region 109 with p type base region 107, at on-state. Meanwhile, p represents the area of contact is between p type base region 107 and n⁻ region 105, as already described.

Here, the width of n⁺ accumulation region 125a is very small. Therefore, when the width of trench 113 is represented by Wt, depth of trench 113 from cathode surface (first main surface) is represented by Dt, the depth of n⁺ emitter region from cathode surface is represented by De, the width of n⁺ emitter region 109 in the direction from one trench 113 to another trench 113 is represented by We, the width of p type base region 107 from one trench 113 to another trench 113 is represented by Wp and the depth of p type region 107 from the cathode surface is represented by Dp, n and p can be given by the following equations.

$n=2(We+Dt-De)+Wt$ $p=Wp$

By substituting the above equations for the ratio Rn, the ratio Rn can be given by the following equations.

$$Rn = \frac{2(We + Dt - De) + Wt}{2(We + Dt - De) + Wt + Wp}$$

If we represent the pitch of trench 113 as Pt (FIG. 74), it holds that

Wt+Wp=Pt and therefore, ratio Rn can be transformed to $$Rn = \frac{2(We + Dt - De) + Wt}{2(We + Dt - De) + Pt}.$$

Here, when areas n and p are to be calculated, it is correct to use numerical values obtained by multiplying total length (=length L of trench×number of trenches) in the depth direction of FIG. 73. However, in a structure in which strip shaped trenches extend parallel to each other, the total length in the depth direction is equally multiplied by respective terms. Therefore, the value can be approximated by the above described expression, with the total length omitted.

Further, referring to FIG. 73, the bottom surface of trench 113 is assumed to be planer, for convenience of description. However, in actual devices, the bottom of trench 113 is generally rounded, to improve gate breakdown voltage, as shown in FIG. 57. Therefore, in calculating the ratio Rn, a coefficient larger than 1 is multiplied by the area Wt of the trench bottom. However, it is omitted for simplicity of description.

More specifically, if a deep trench gate is to be formed, when Pt=5.5 µm, Dt=15 µm, Wt=1 µm, De=1 µm, We=0.8 µm, the ratio Rn would be $Rn=[1+(0.8+15-1)\times 2]/[5.5+(0.8+15-1)\times 2]=15.8/20.3=0.78$ and hence large ratio Rn is obtained.

Embodiment 16

Figure 74:
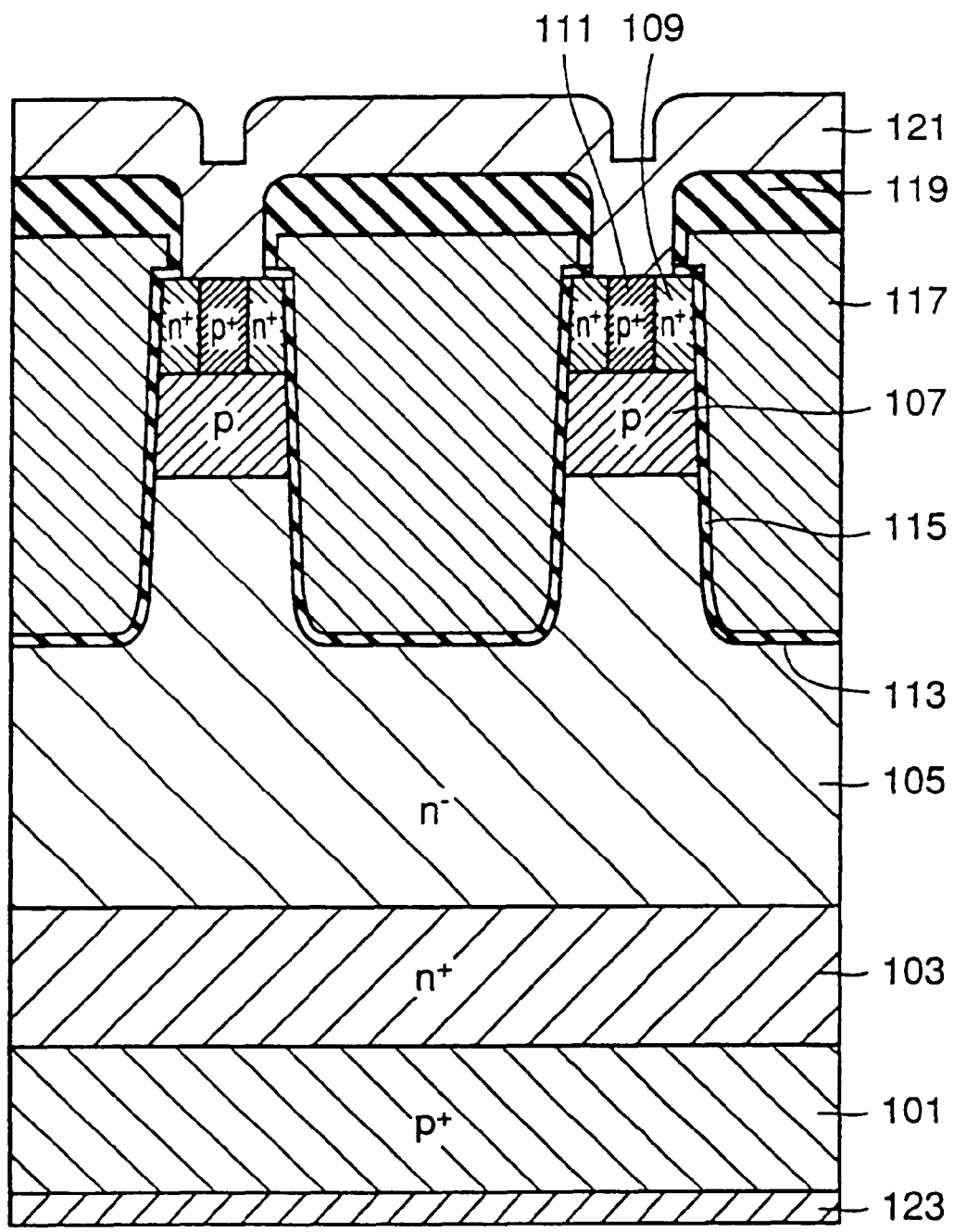
FIG. 74 is a cross sectional view schematically showing a structure of a semiconductor device in accordance with Embodiment 16 of the present invention.

Referring to FIG. 74, by the equation of Rn above, it can be understood that it is effective to increase the width Wt of trench 113 to increase the ratio Rn, even when the trench 113 is shallow, that is, the depth Dt of trench 113 is small.

More specifically, if Pt=9 μm, Dt=5 μm, Wt=6 μm, De=1 μm and We=0.8 μm, then $$Rn=6+[(0.8+5+1)\times 2]/[9+(0.8+5+1)\times 2]=19.6/22.6 \approx 0.87$$

and hence, large ratio Rn is obtained.

Embodiment 17

The structure of the semiconductor device in accordance with the present embodiment is approximately similar to the structure of Embodiment 12 shown in FIG. 63. The structure is relatively complicated as compared with Embodiment 15 above, variables to be optimized are increased and the steps of manufacturing becomes complicated. However, it is advantageous in that larger ratio Rn is obtained and it is effective to reduce on voltage.

The method of controlling on and off states by the gate electrode layer 117 in the present embodiment is approximately the same as in Embodiment 12 above. Therefore, description thereof is not repeated.

Especially a positive voltage is applied to gate electrode layer 117 at on-state, $n^+$ accumulation region 125b is generated, as shown in FIG. 68.

Here, if the structure between lines R–R' and S–S' is regarded as a unit cell, the area n will be $$n=2Dt-De+We+Wn+Wt.$$

As is apparent from this equation, in the semiconductor device in accordance with the present embodiment, $n^+$ accumulation region 125b is also generated at the surface region between trenches 113b and 113c, as shown in FIG. 68. Therefore, the effective cathode area in the unit cell can be enlarged than Embodiment 15. Therefore, injection efficiency of electron on-the cathode side can further be enhanced, and on-state voltage Vf can further be reduced. Therefore, the ratio Rn can be made 0.4 or higher, closer to 1.

The method of manufacturing the semiconductor device in accordance with the present embodiment will be described. The manufacturing method in accordance with the present embodiment will be described referring to an example in which the device having the breakdown voltage in the order of 4500 V is manufactured.

Figure 75:
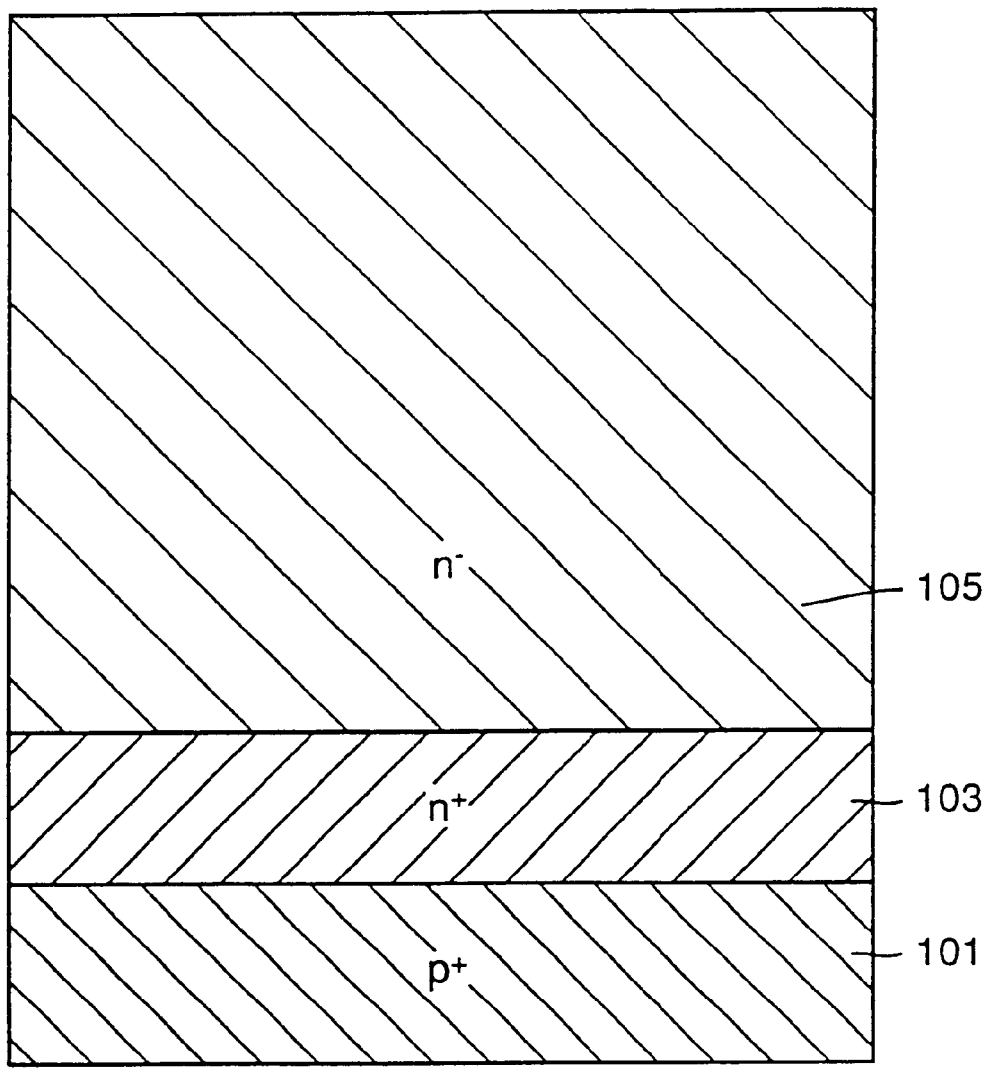
FIGS. 75 to 84 are schematic cross sectional views showing, in order, the steps of manufacturing the semiconductor device in accordance with Embodiment 17 of the present invention.

First, referring to FIG. 75, an $n^-$ silicon substrate 105 having high resistivity of about 200 to 400 Ωcm is formed by the FZ method. On the anode side, which will be the second main surface of $n^-$ silicon substrate 105, an $n^+$ buffer region 103 having the thickness of about 10 to 30 μm and having high impurity concentration of the first conductivity type, that is, n type, and a $p^+$ collector region ($p^+$ anode region) 101 having the thickness of about 3 to about 10 μm and having high impurity concentration of a second conductivity type, that is, p type, are formed.

According to one method of manufacturing $n^+$ buffer region 103, after ion implantation of phosphorous having large coefficient of diffusion, drive-in is performed for 20 to 30 hours at a high temperature of 1200 to 1250° C., so that peak concentration of $n^+$ buffer region 103 after the final step is within the range of about $1\times10^{16}$ to about $5\times10^{17}$ cm$^{-3}$ and the depth is from about 10 μm to about 30 μm. Alternatively, vapor phase deposition by a gas obtained by bubbling $PH_3$ gas or $POCl_3$ may be used instead of ion implantation of phosphorus.

In another method of manufacturing $n^+$ buffer region 103, a silicon crystal layer is formed having approximately the same n type impurity concentration as obtained by ion implantation by epitaxial growth.

The method of manufacturing $p^+$ collector region 101 includes the method performing drive-in after ion implantation or vapor phase deposition which is similar to the method of manufacturing $n^+$ buffer region 103, and a method of forming p type silicon crystal layer by epitaxial growth. However, in this case, boron or gallium is used as p type impurity. Therefore, the source gas for a vapor phase deposition is sublimated gas of, for example, boron glass ($B_2O_3$ or the like) generated by oxidation of BN (Boron Nitride) which is a solid source or $B_2H_6$ gas. The $p^+$ collector region 101 is formed such that it has the depth of 3 to 10 μm and it has peak concentration higher than the peak concentration of $n^+$ buffer region 103 after the final step.

Figure 76:
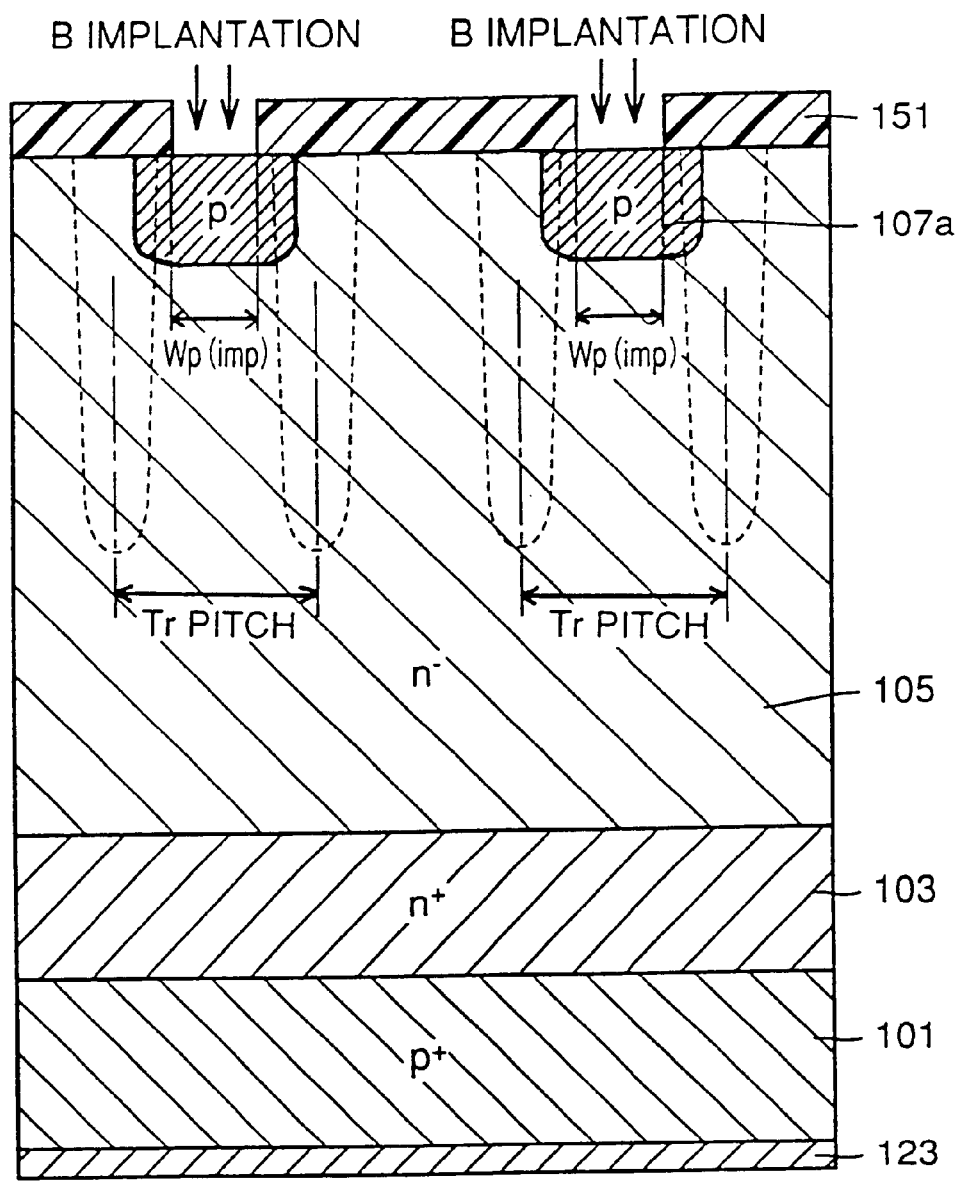

Referring to FIG. 76, in a region sandwiched by trenches (denoted by dotted lines in the figure) which will be formed in subsequent steps, boron ions are selectively implanted, using a resist pattern 151 as a mask. Consequently, p type base region 107a of the second conductivity type is formed at the first main surface of $n^-$ silicon substrate 105. When the trenches are to be formed in stripes with small repetition interval (pitch) of about 3 to about 5 μm, it is necessary to prevent invasion of p type base region 107a to such regions that do not constitute the IGBT structure, by performing long heat treatment (for example, 30 minutes to 7 hours at a relatively high temperature of 1100° C. to 1150° C.) for diffusing p type base region 107a. Therefore, it is necessary to introduce boron ions with p base implantation width Wp (imp) which is smaller than the repetition interval (Tr-pitch) of the trenches.

Referring to Rig. 77, a resist pattern 152 is formed on the first main surface by common photolithography. By using resist pattern 152 as a mask, n type impurity such as phosphorous, arsenic or antimony is introduced by ion implantation, and thus $n^+$ emitter region 109a of the first conductivity type is formed. Thereafter, resist pattern 152 is removed.

Figure 78:
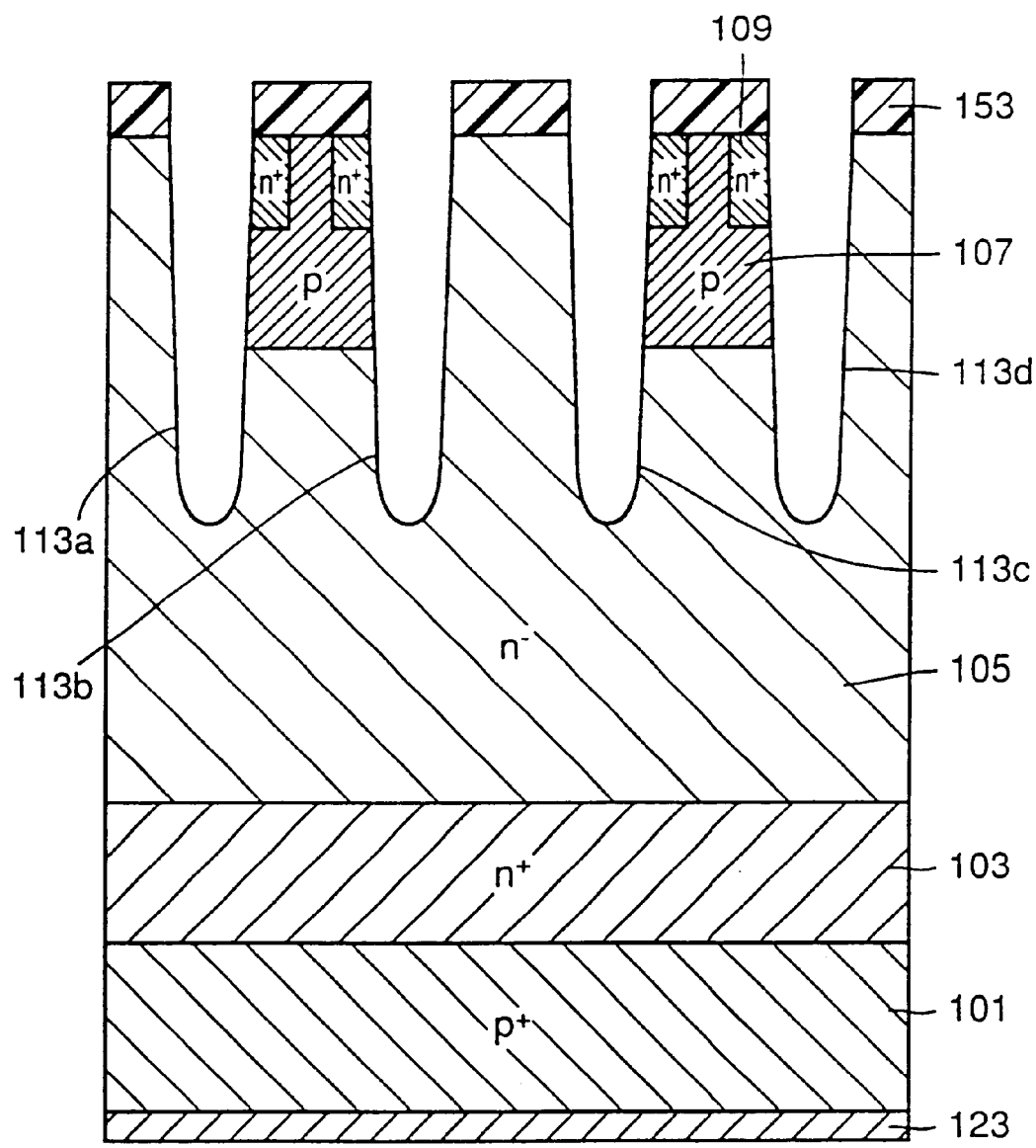

Referring to FIG. 78, by common photolithography, a resist pattern 153 is formed on the first main surface. By using resist pattern 153, trenches 113a to 113b are formed as stripes with prescribed pitch by RIE method or other silicon anisotropic etching. Thereafter, for diffusing p type base region 107 described above, relatively long heat treatment is performed for about 30 minutes to 7 hours at a relatively high temperature of 1100° C. to 1150° C. By this heat treatment, p type base region 107a and $n^+$ emitter region 109 are diffused. Thereafter, resist pattern 153 is removed.

The conditions for the above described heat treatment, such as temperature and time are determined such that the p type base region 107 can be formed-deep enough to meet the main breakdown voltage required of the manufactured device. More specifically, in the device having a breakdown voltage in the order of 4500 V, a p type base region 107 of at least 2 μm is necessary below $n^+$ emitter region 109. Therefore, the depth of diffusion of p type base region 107 from the substrate surface is, in this case, the depth of diffusion of $n^+$ emitter region 109 plus about 2 μm. This is the reason why such heat treatment for a long period of time at a high temperature is necessary.

In order to avoid such heat treatment at a high temperature for a long period of time, there is a method to implant ions deeper selectively, by using high energy ion implantation in the step of ion implantation shown in FIG. 76. In that case, resist pattern 151 used as the mask is adapted to have higher viscosity of about 300 to about 500 cp, higher than the normal viscosity (of several ten cp (centipoise; unit of viscosity)). The resist pattern 151 is formed to have a thickness of several μm, so that it can shield ions implanted with high energy of about 3 to about 5 MeV. The range of boron ions in silicon when ions are implanted with high energy of this level is about 2 to about 4 µm. Therefore, the desired depth of diffusion of P type base region 107*a* can be obtained, hardly performing heat treatment.

Figure 85:
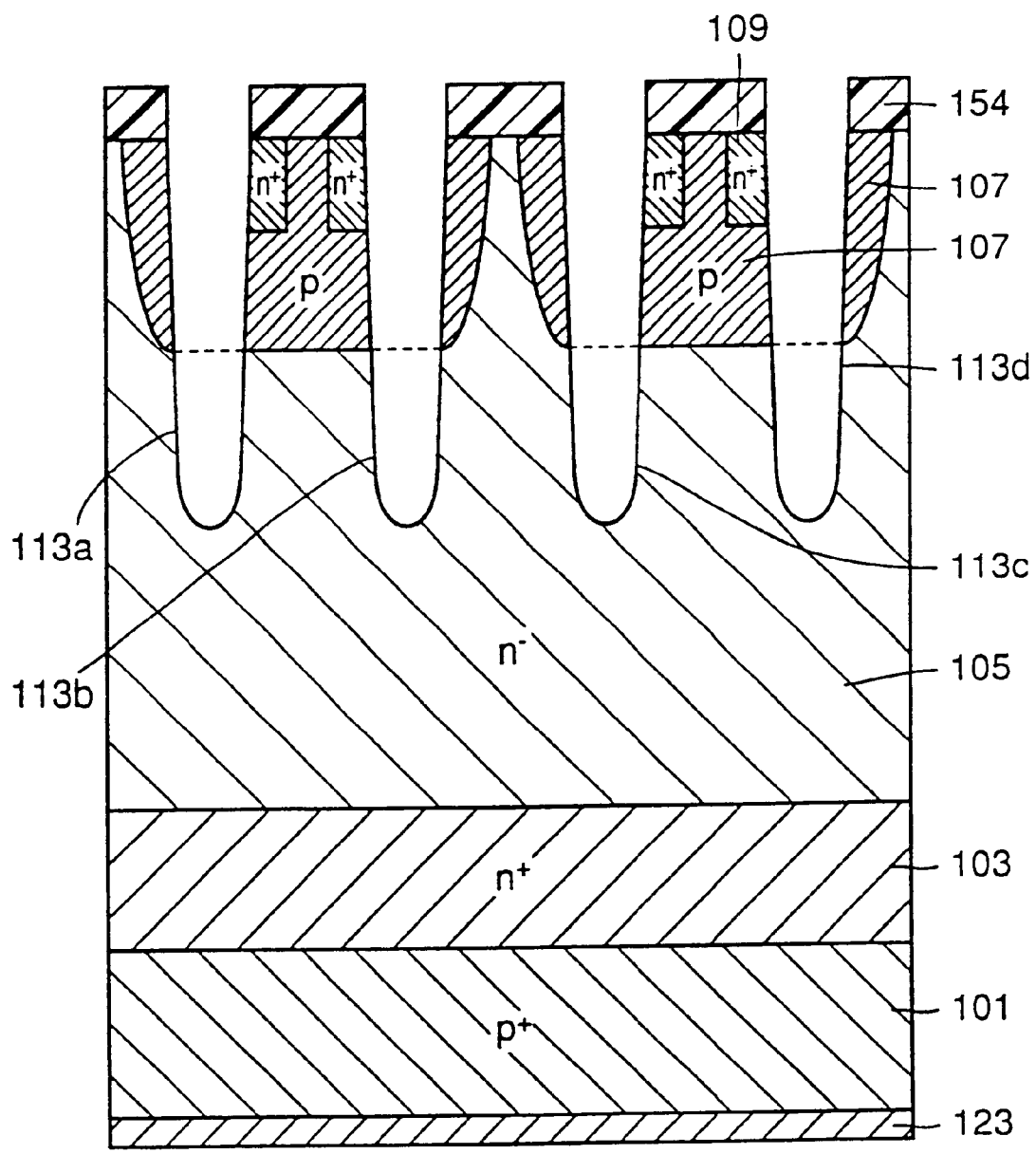
FIGS. 85 and 86 show manufacturing steps when p type base region is protruded.
Figure 86:
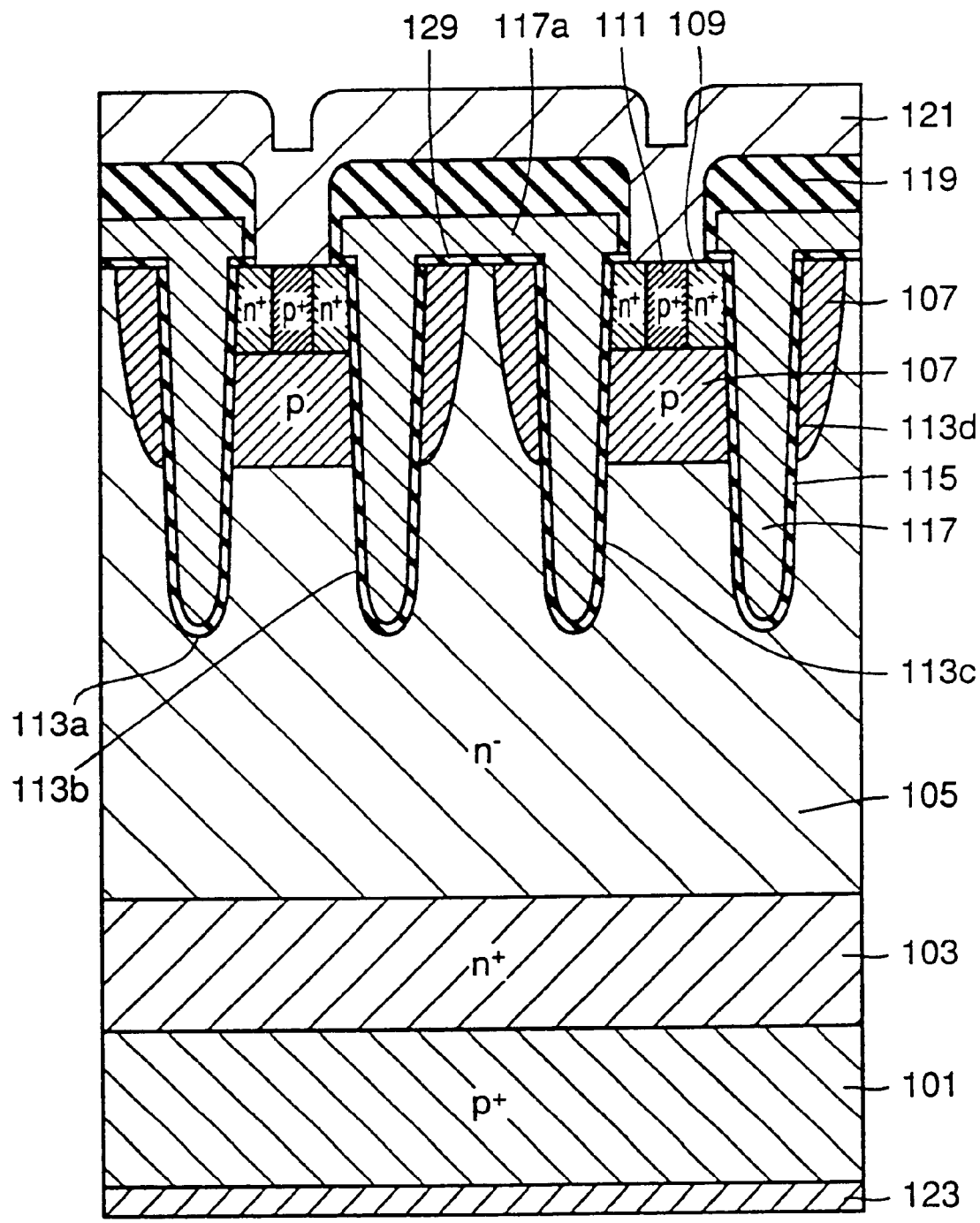

If heat treatment for diffusing p type base region 107 is excessive or if the hole pattern of resist for selective implantation (diffusion) is too large, p type base region 107 protrudes to such regions that do not inherently constitute IGBT structure, as shown in FIGS. 85 and 86. In such a case, the object of the present invention, that is, to improve the device characteristic by enlarging the ratio Rn cannot be attained.

Figure 87:
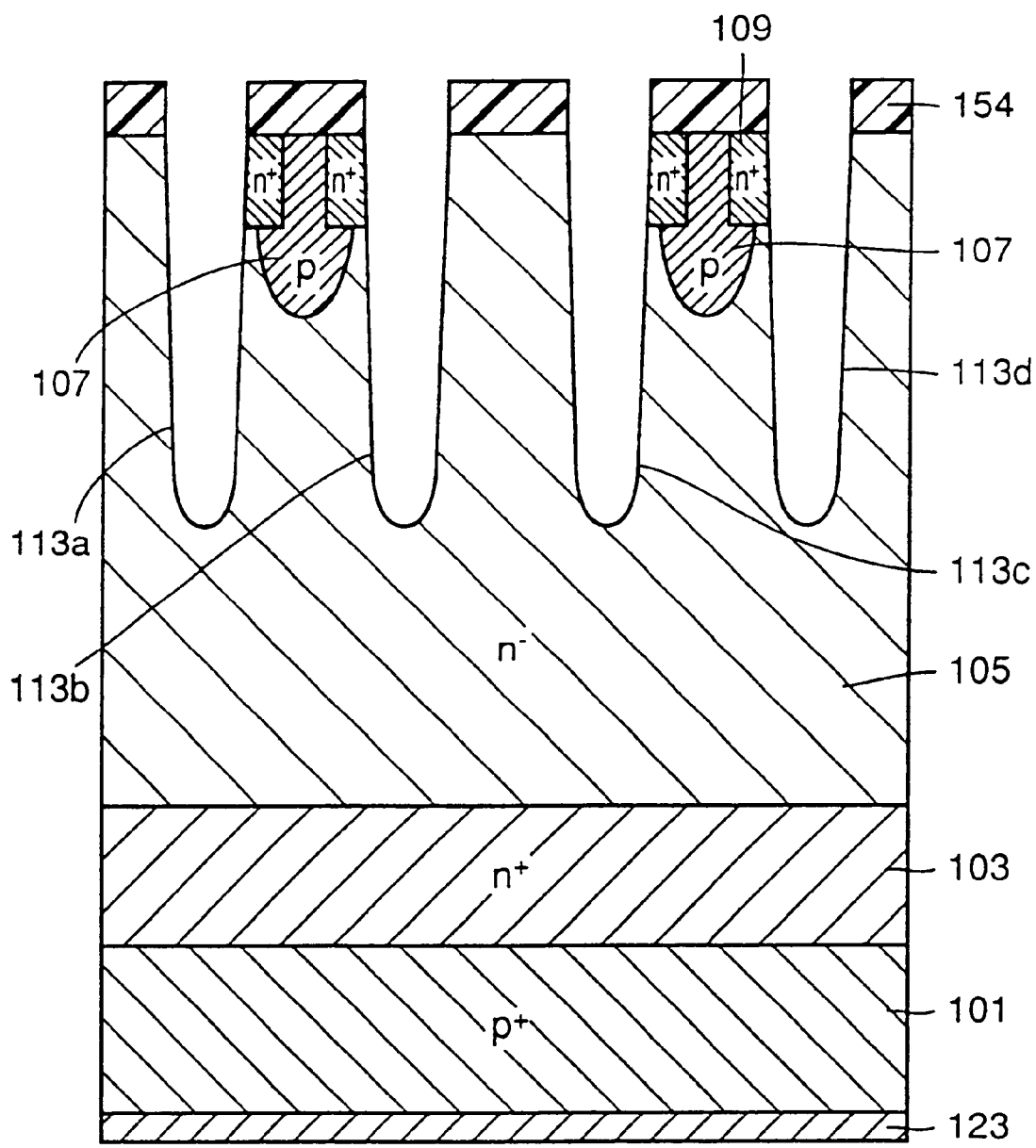
FIGS. 87 and 88 show manufacturing steps when p type base region is small.
Figure 88:
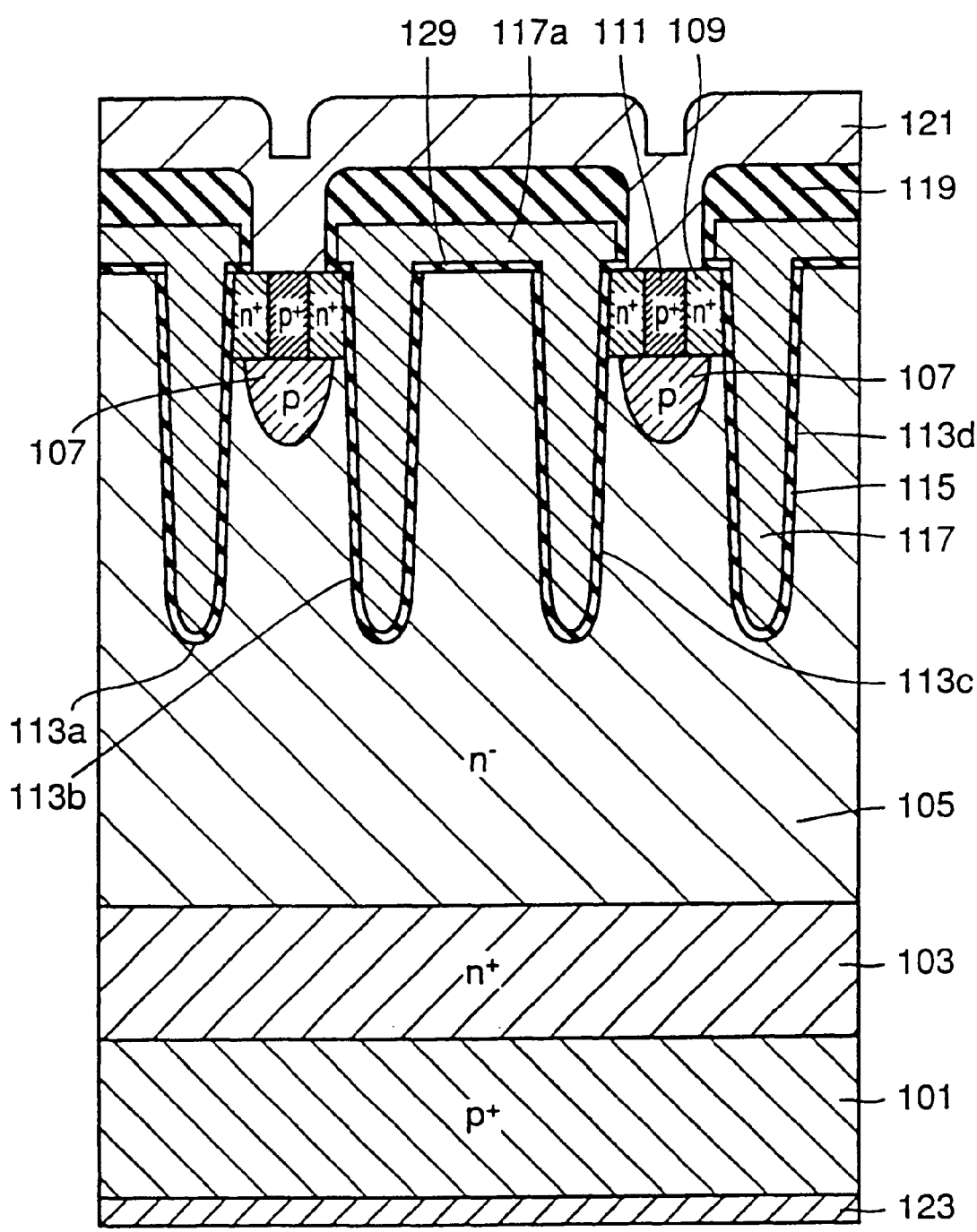
Figure 89:
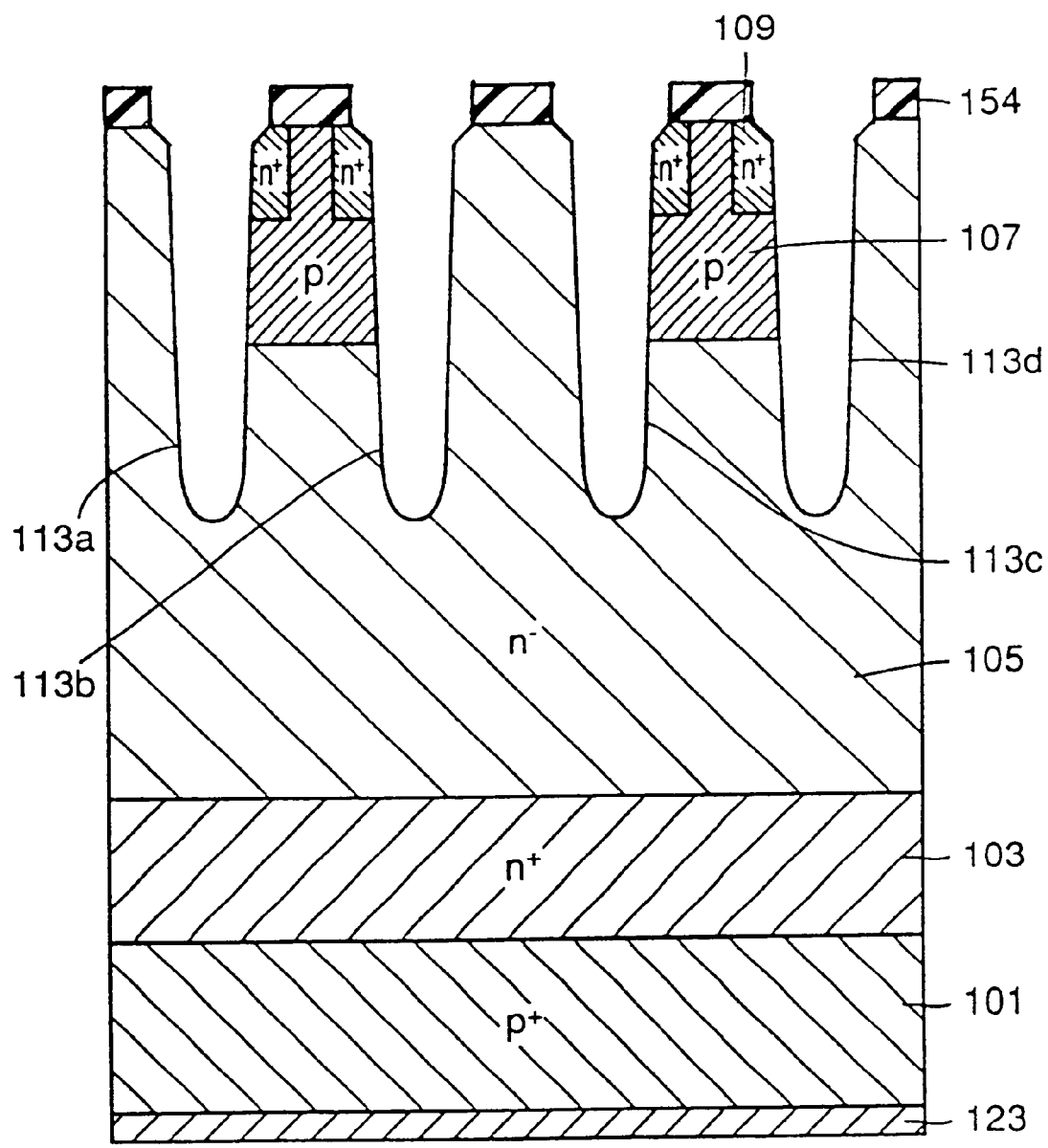
FIG. 89 shows a manufacturing step showing isotropic dry etching performed after the formation of a trench.

On the other hand, if heat treatment for diffusing p type base region 107 is not sufficient or if the hole pattern of the resist for selective implantation (diffusion) is too small, there will be a portion of n⁺ emitter region 109 not covered by p type base region 107 at the IGBT structure as shown in FIGS. 87 and 88, and in that case, main breakdown voltage cannot be maintained.

Figure 79:
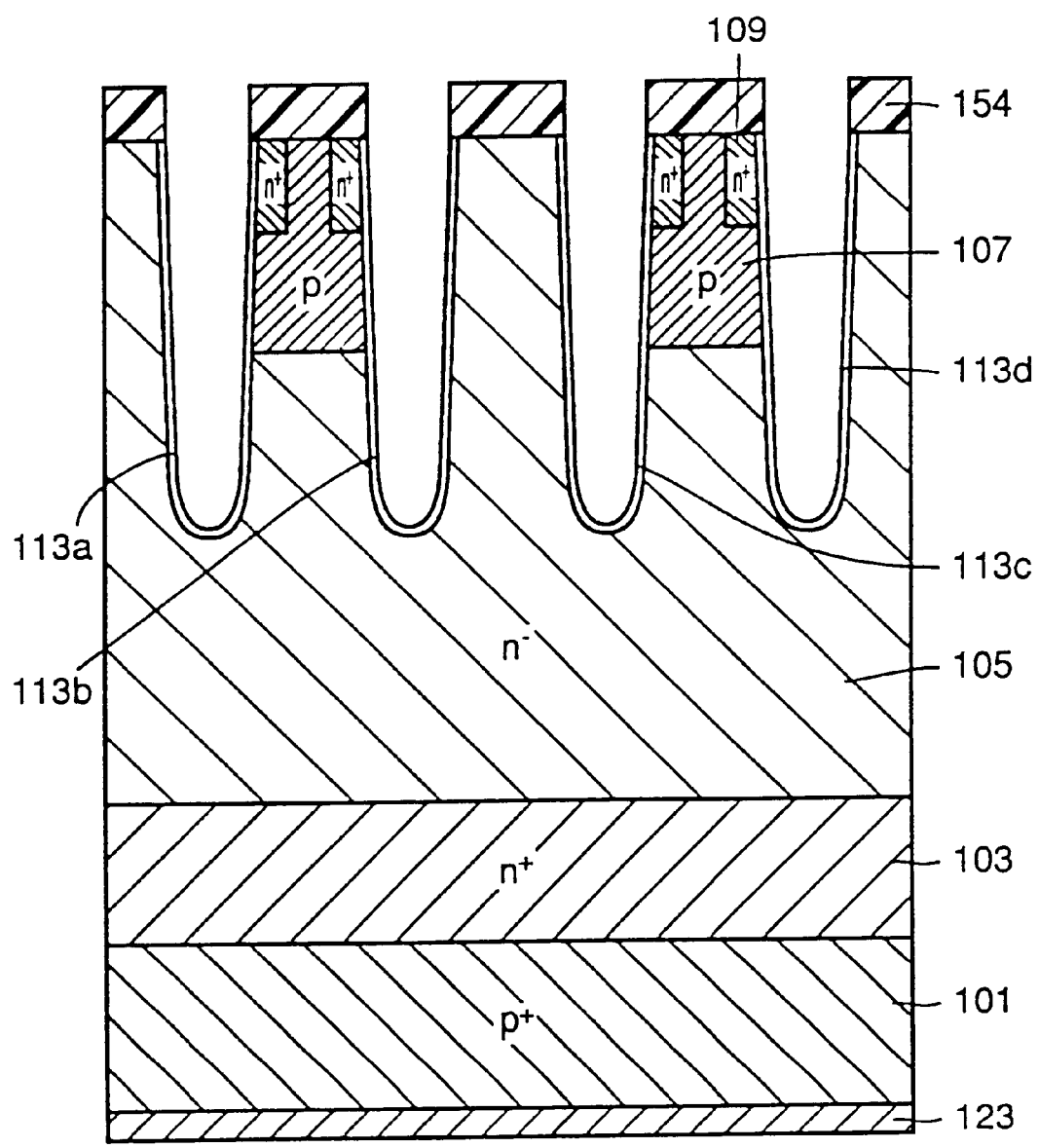
Figure 80:
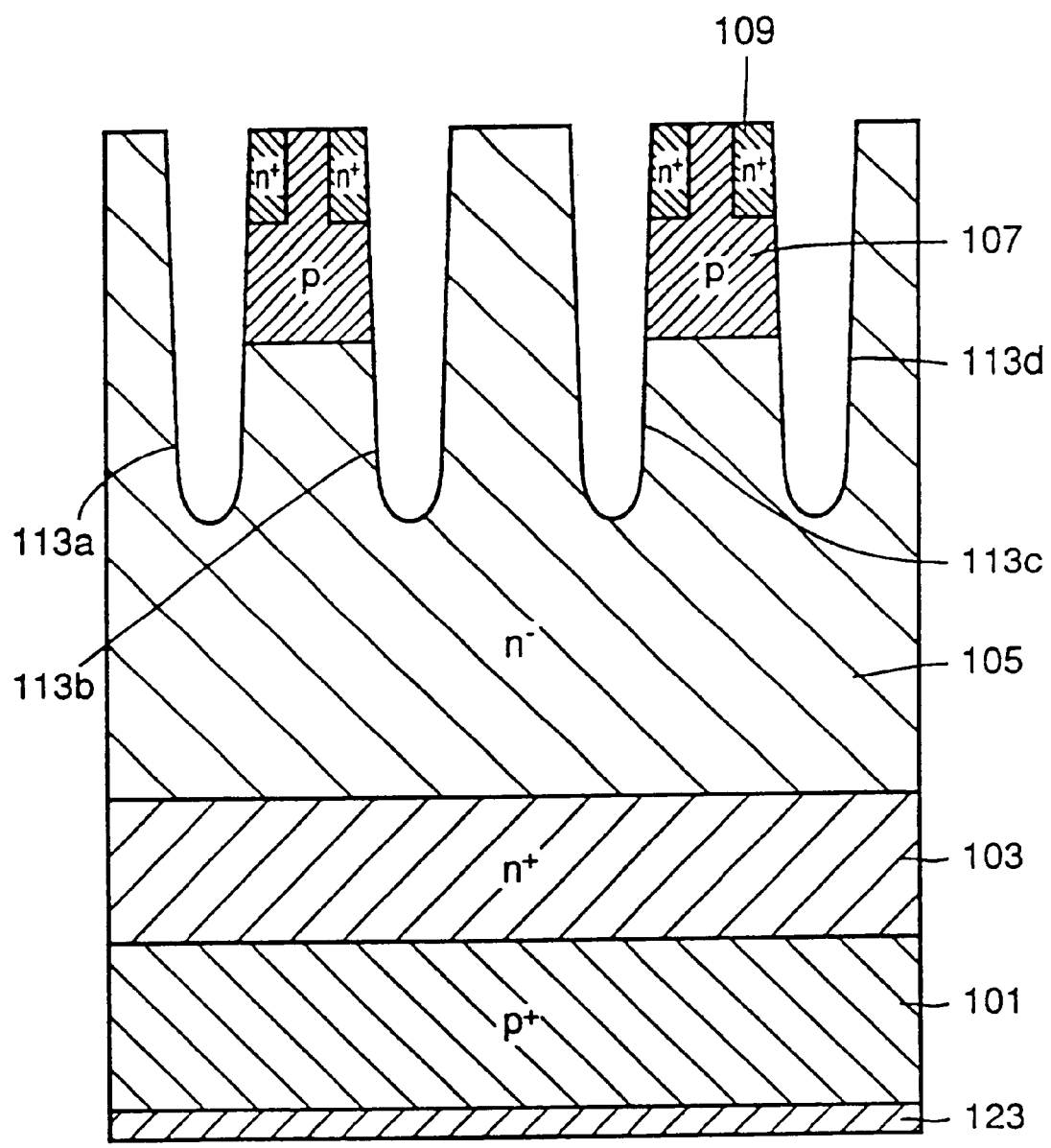

Referring to FIG. 79, by sacrificial oxidation, oxide film 115 is formed on inner walls of trenches 113*a* to 113*b*. Thereafter, wet etching is performed as shown in FIG. 80 and oxide film 115 is removed.

Figure 81:
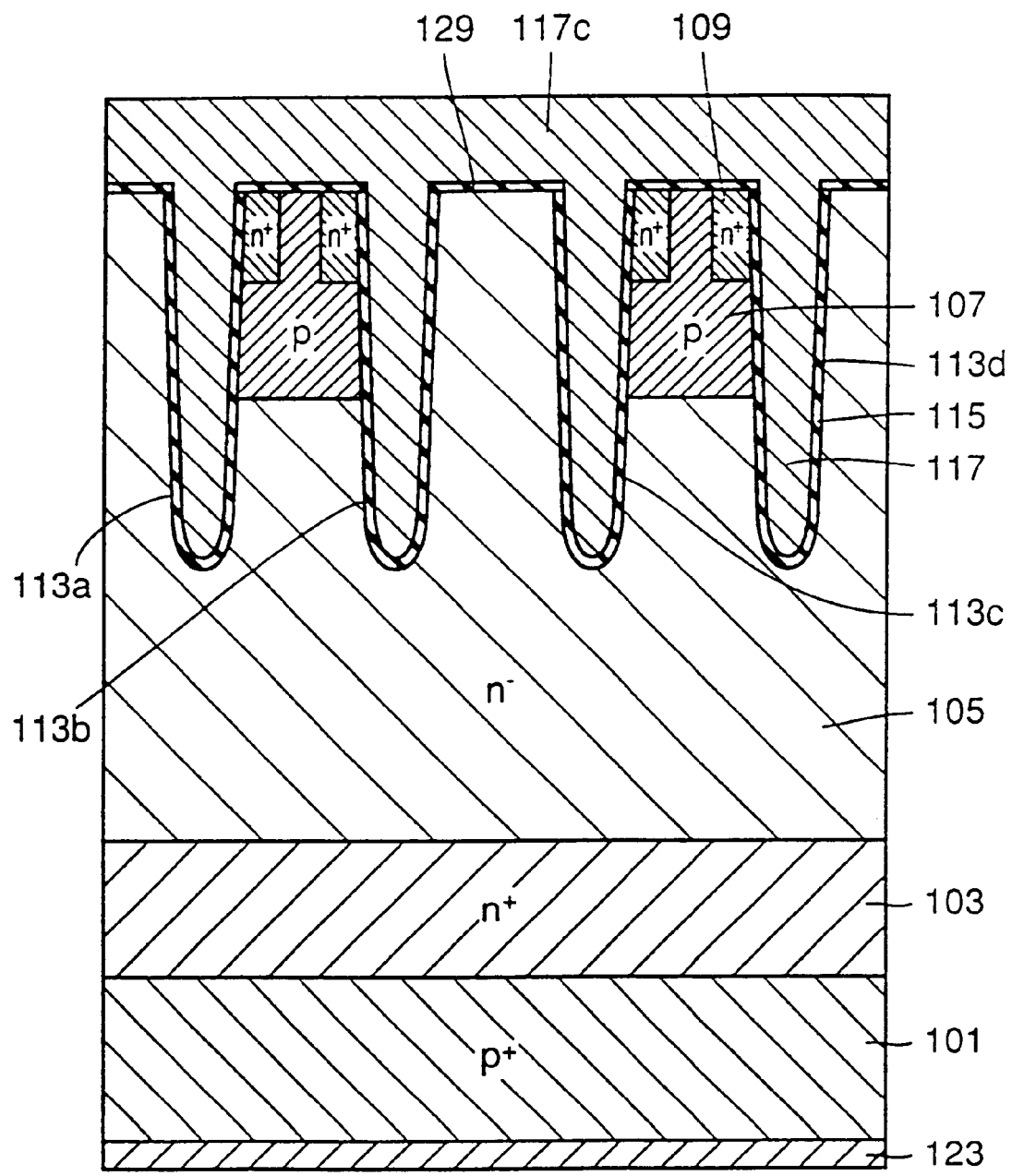

Referring to FIG. 81, by thermal oxidation, silicon oxide film 115 is formed on the inner walls of trenches 113*a* to 113*d* and on the first main surface. Silicon oxide film 115 is formed in accordance with gate breakdown voltage, gate input capacitance and gate threshold voltage required of the device.

A conductive film 117*c* of phosphorus doped polycrystalline silicon is formed on the first main surface to fill trenches 113*a* to 113*d*. The conductive film 117*c* has the thickness approximately similar to or larger than the opening width of trenches 113*a* to 113*d*, and is formed by using a reduced pressure CVD apparatus or the like. Thereafter, conductive film 117*c* is entirely etched (generally referred to as etch back) to have a relatively thin film thickness to facilitate processing in subsequent steps.

Thereafter, conductive film 117*c* is selectively improved by common photolithography and dry etching, so as to leave a connecting portion of the surface interconnection for the control electrodes (gates).

Figure 82:
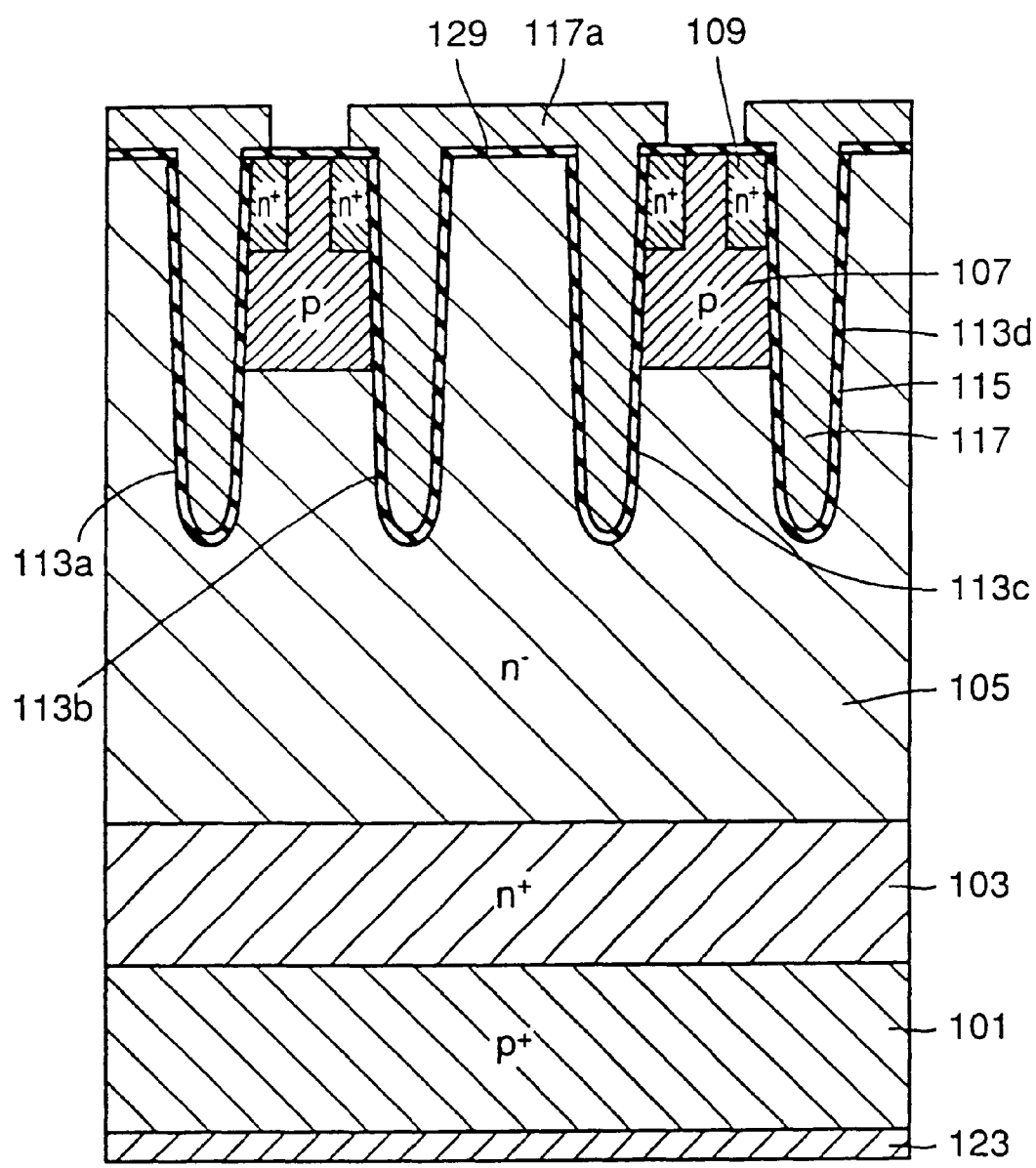

Referring to FIG. 82, by this selective removal, control electrode layers (gate electrode layers) 117 filling trenches 113*a* to 113*d* and have portion 117*a* extending on a region where IGBT structure is not formed with an insulating film 129 interposed are formed.

Figure 83:
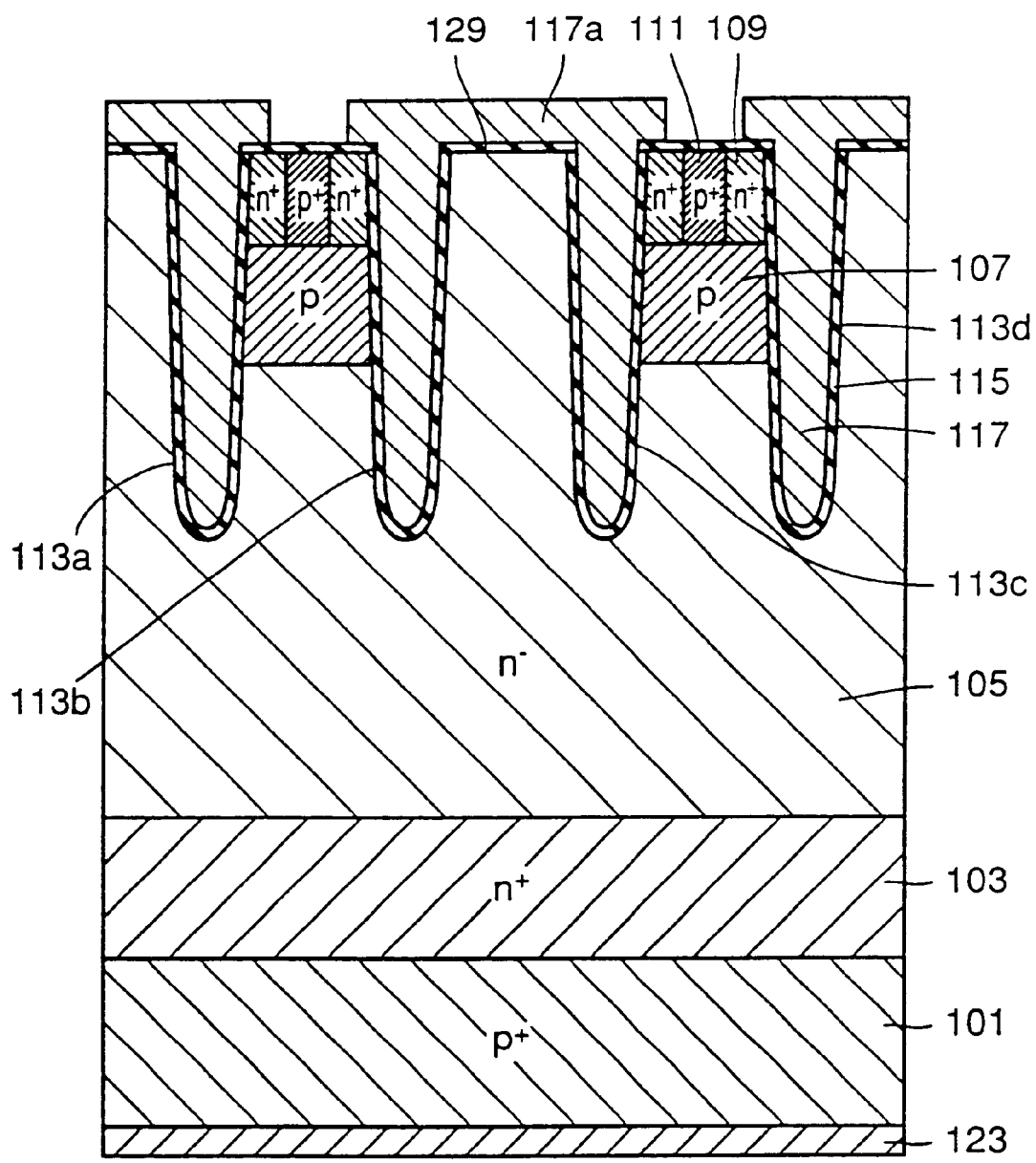

Referring to FIG. 83, by combining common photolithography and ion implantation technique of p type impurity such as boron, p⁺ contact region 111 of the second conductivity type is formed at the first main surface to be adjacent to n⁺ emitter region 109.

Figure 84:
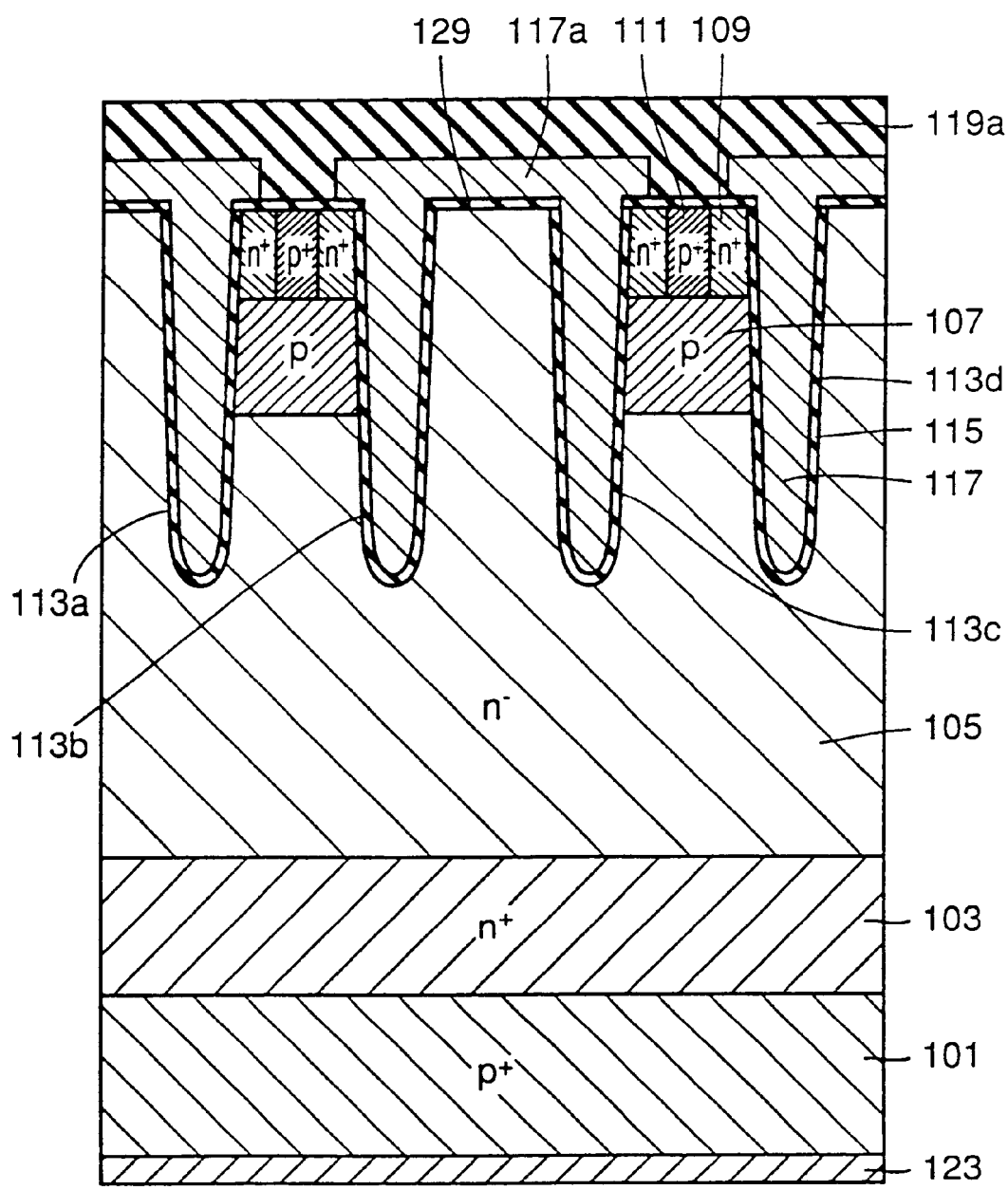

Referring to FIG. 84, a CVD silicon oxide film such as BPSG or a silicon nitride film are formed as interlayer insulating film 119*a* to cover gate electrode layer 117. A contact hole or a line-shaped contact portion is formed at interlayer insulating film 119*a*. Thereafter, metal interconnection such as aluminum is formed on the first main surface by sputtering, and thus the semiconductor device shown in FIG. 63 is completed.

Figure 77:
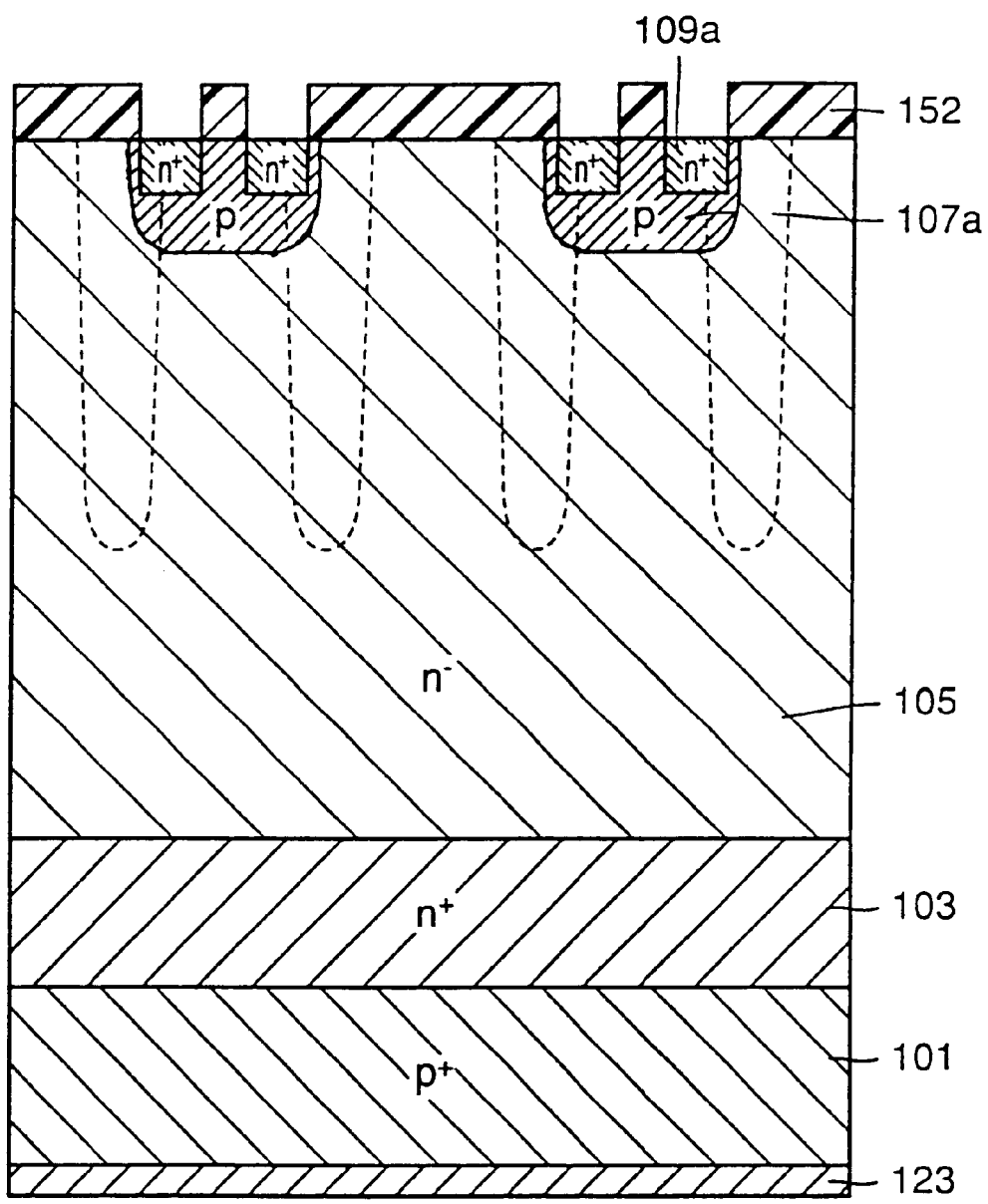

The n⁺ emitter region 109 may not be formed by the process shown in FIGS. 77 and 78. Alternatively, it may be formed after the control electrode layer 117 shown in FIG. 82 is formed. When n⁺ emitter region 109 is formed after the gate electrode layer 117 shown in FIG. 82 is formed, n⁺ emitter region 109 may be formed after the formation of p⁺ contact region 111 shown in FIG. 83.

Alternatively, after the trenches 113*a* to 113*d* are formed in the step of FIG. 78, isotropic plasma etching (chemical dry etching) may be performed as disclosed, for example, in Japanese Patent Laying-Open Nos. 6-012559 and 7-001347.

More specifically, trenches 113*a* to 113*d* are formed in the step of FIG. 78, then isotropic plasma etching is performed as shown in FIG. 9, corners at the openings of trenches 113*a* to 113*d* are removed, and bottoms of the trenches are rounded. Thereafter, the deposition film formed at the time of etching is removed by wet etching. Thereafter, oxide film 115 is formed on the inner walls of trenches 113*a* to 113*d* by sacrificial oxidation as shown in FIGS. 79 to 80, and oxide film 115 is removed by wet etching.

Consequently, the shapes in and at the opening portion of the trenches 113*a* to 113*d* are adjusted and at the same time, contaminated layer or damaged layer caused by anisotropic etching can be removed.

At least one of sacrificial oxidation shown in FIG. 79 and isotropic plasma etching of low damage may be performed.

The semiconductor device in accordance with the present embodiment includes complicated manufacturing steps as compared with Embodiment 15. However, it is not necessary to make trenches 113*a* to 113*d* extremely deep or extremely wide. Therefore, the step of etching itself for forming the trenches and the step of filling trenches by doped polysilicon film using CVD method do not require a long time. Therefore, burden on the manufacturing apparatus is released. Therefore, general cost efficiency is comparable with Embodiment 15.

Embodiment 18

Figure 90:
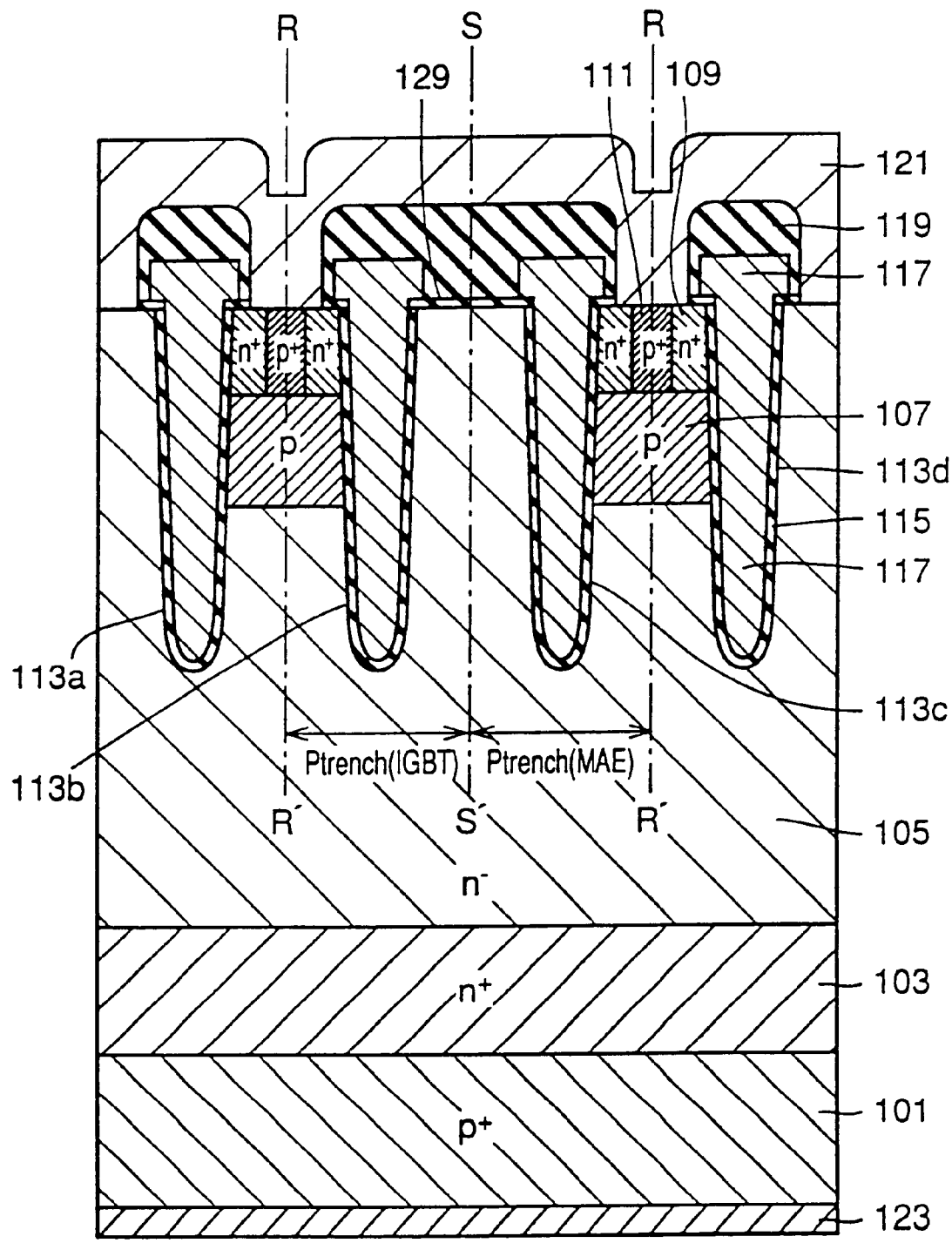
FIG. 90 is a cross sectional view schematically showing a structure of a semiconductor device in accordance with Embodiment 18 of the present invention.

Referring to FIG. 90, the structure of the present embodiment differs from the structure of Embodiments 12 and 17 shown in FIG. 63 in the structure of gate electrode layer 117. More specifically, the gate electrode layer 117 does not extend over the area where IGBT structure is not formed (hereinafter referred to as non-IGBT region). More specifically, on the non-IGBT region, cathode electrode 121 is formed only with the insulating layer (insulating layer 129 and interlayer insulating film 119) interposed.

Except this point, the structure is the same as those of Embodiments 12 and 17. Therefore, corresponding portions are denoted by the same reference characters and description thereof is not repeated.

The method of manufacturing a semiconductor device in accordance with the present embodiment will be described.

Figure 91:
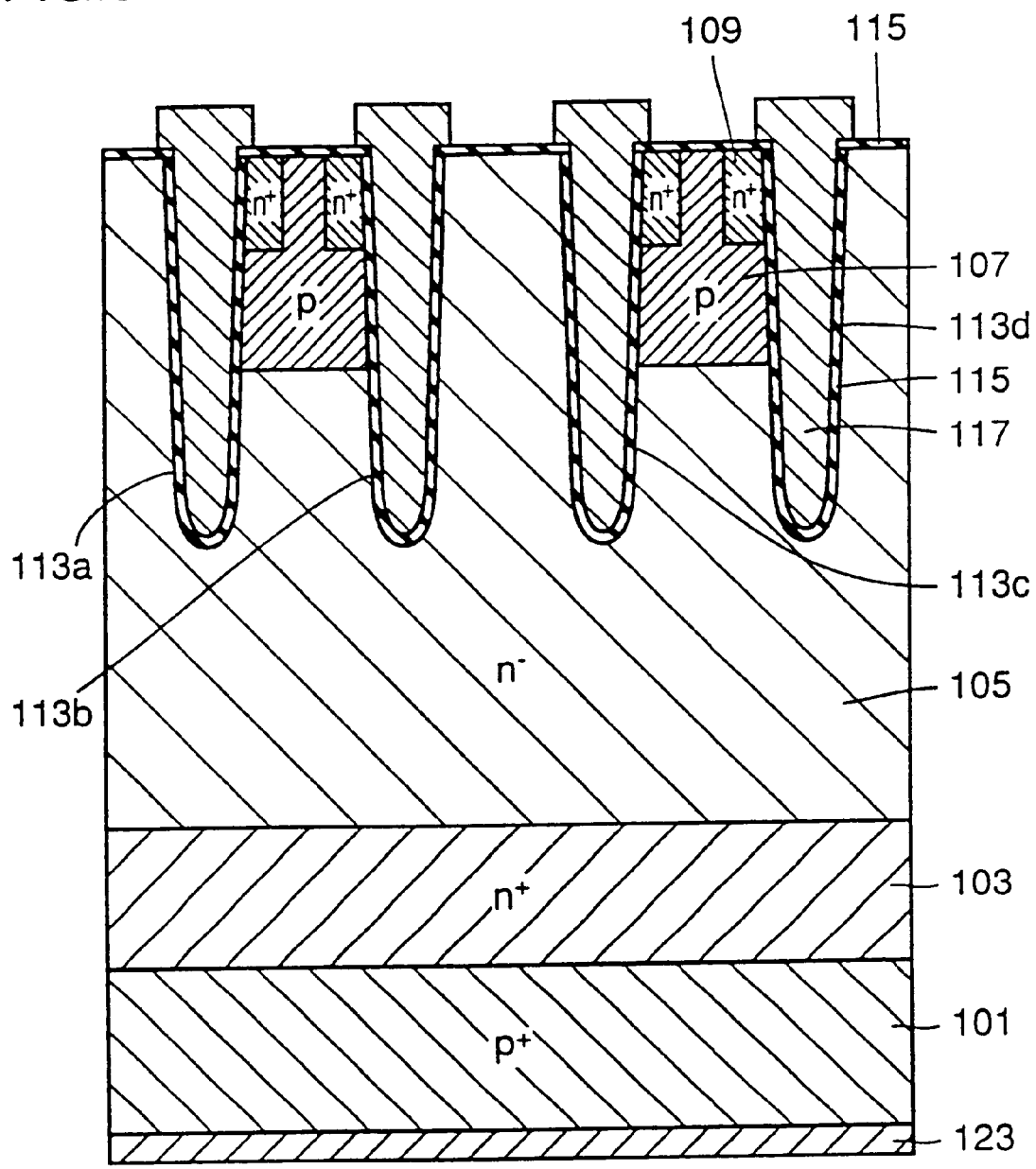
FIG. 91 shows a step of manufacturing the semiconductor device in accordance with Embodiment 18 of the present invention.

The method of manufacturing in accordance with the present embodiment first includes the same steps as Embodiment 17 shown in FIGS. 75 to 81. Thereafter, referring to FIG. 91, by common photolithography and dry etching, gate electrode layer is patterned so as not to extend over the non-IGBT region and to protrude over the first main surface.

Thereafter, the same steps as in Embodiment 17 are performed, and the semiconductor device shown in FIG. 90 is completed.

If gate electrode layer 117 is adapted not to extend over the non-IGBT region, the simplicity of the manufacturing steps is comparable to Embodiment 17 in which gate electrode layer extends over the non-IGBT region.

As compared with Embodiment 17, in the semiconductor device in accordance with the present embodiment, gate electrode layer is not extended over the non-IGBT region. In the on state, n⁺ emitter region (accumulation region) extended over the first main surface of the non-IGBT region is not formed, and hence the ratio Rn in the on state becomes smaller. However, by making smaller the pitch of trenches sandwiching the non-IGBT region as compared with the pitch of the trenches sandwiching IGBT region, the ratio of the enlarged n⁺ emitter region (accumulation region) in the ratio Rn becomes smaller. Therefore, approximately the same ratio Rn as in Embodiment 17 can be obtained.

Further, at a portion where the gate electrode layer extends over the first main surface, interlayer insulating film 119 has thinner film thickness. This leads to defective breakdown voltage between gate electrode layer 117 and emitter electrode 121, resulting in decreased production yield. In view of the production yield, it is preferable that the gate electrode extends as small as possible over the first main surface. Therefore, the semiconductor device in accordance with the present embodiment is effective in industrial application as compared with the structure of Embodiment 17.

Embodiment 19

Figure 92:
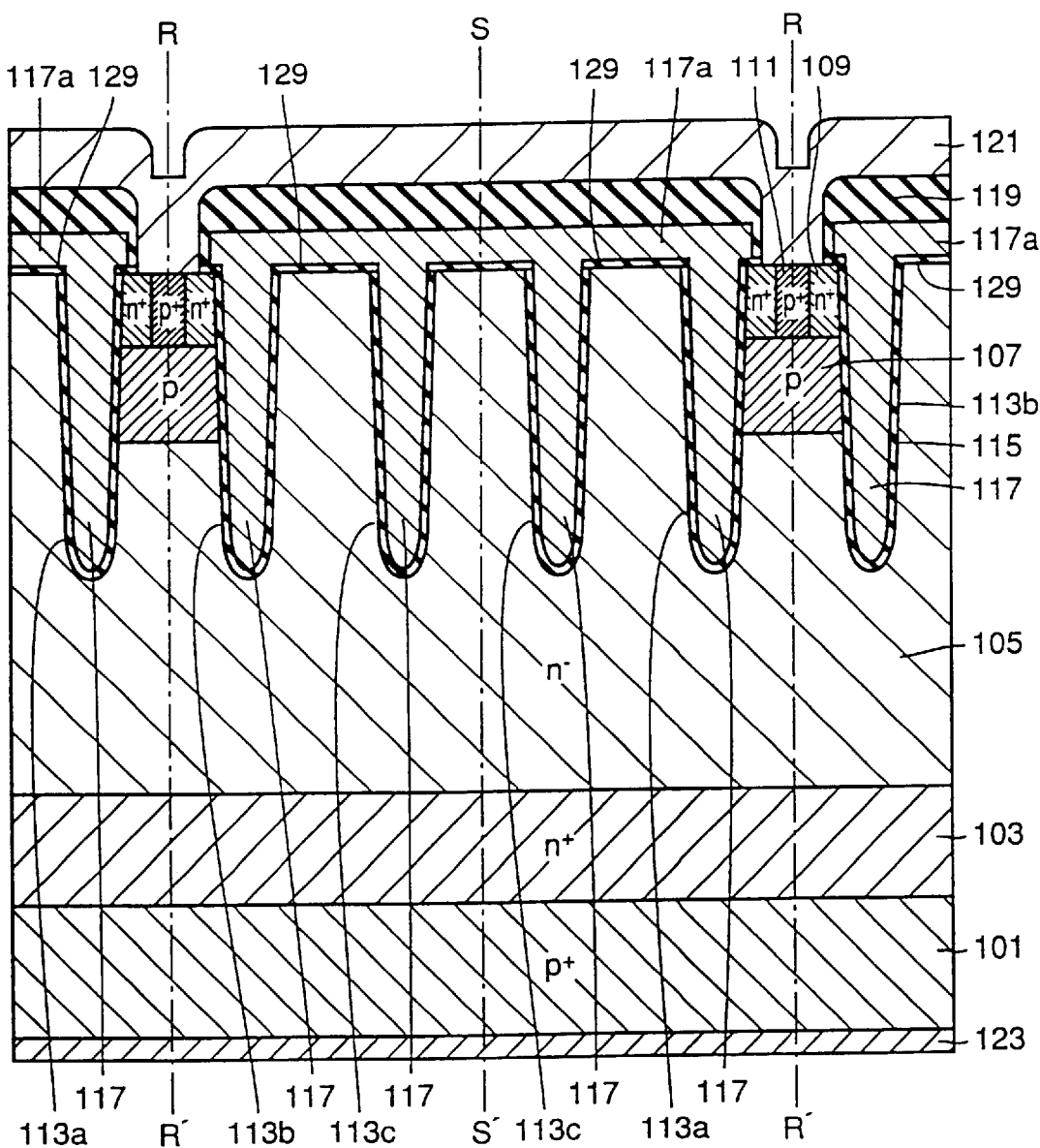
FIG. 92 is a cross sectional view schematically showing a structure of a semiconductor device in accordance with Embodiment 19 of the present invention.

Referring to FIG. 92, in the present embodiment, as compared with Embodiments 12 and 17 shown in FIG. 63, a plurality of non-IGBT regions are arranged in a region between two IGBT forming regions.

Referring to FIG. 92, the structure of the present embodiment is in line symmetry with respect to lines R–R' and S–S'. Therefore, a structure between lines R–R' and S–S' may be regarded as a unit cell, or the structure between one line R–R' and another R–R' may be considered as the unit cell. Here, the latter structure, that is, the structure between one R–R' line another R–R' line is regarded as a unit cell. Therefore, in the unit cell, the number of non-IGBTd regions sandwiched between two IGBT forming regions is 3. In other words, between two IGBT forming regions, there are four trenches 115 sandwiching non-IGBT regions.

The larger the number of non-IGBT regions between two IGBT forming regions, the closer the ratio Rn to 1. However, though it depends to some extent on the pitch between trenches and depth of the trench, if the number of non-IGBT regions between two IGBT forming regions is out on the range of 2 to 4, the ratio Rn begins to saturate. Further, the n⁺ emitter region (n⁺ accumulation region) extended in the on state is formed only in the close vicinity at the interface between silicon substrate and gate oxide film (in the range of up to about 100 Å). Therefore, if the extended n⁺ emitter region (accumulation region) becomes too long, the resistance of the accumulation region will also be increased to a inneglible level. Therefore, the number of non-IGBT region between two IGBT forming regions should preferably be at most 4. In other words, the number of trenches 115 positioned between two IGBT forming regions should preferably be at most 5.

The semiconductor device in accordance with the present embodiment can be manufactured through approximately the same steps as Embodiment 17.

Embodiment 20

Figure 93:
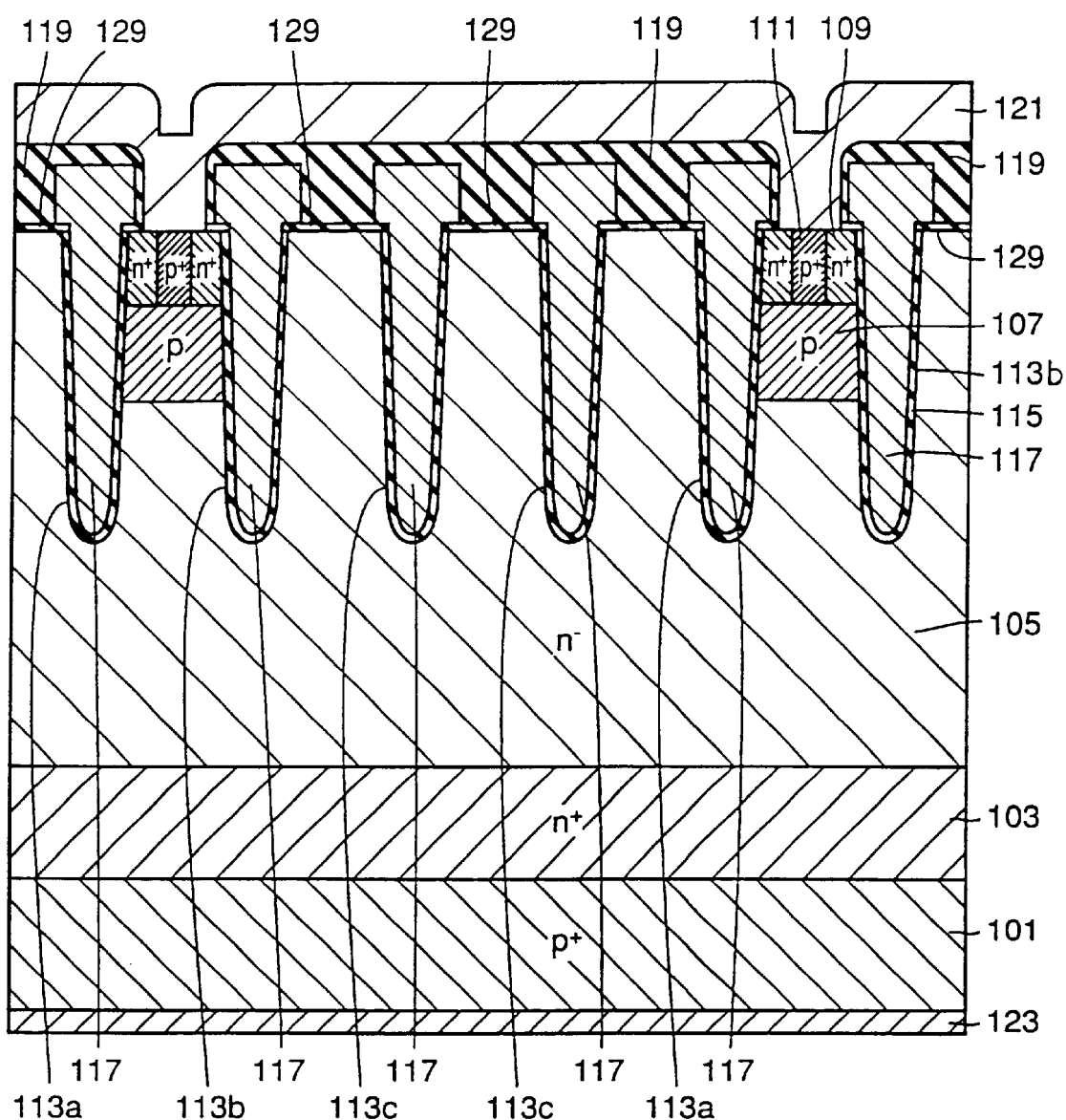
FIG. 93 is a cross sectional view schematically showing a structure of a semiconductor device in accordance with Embodiment 20 of the present invention.

Referring to FIG. 93, the present embodiment differs from Embodiment 19 shown in FIG. 92 in the structure of gate electrode layer 117. In the present embodiment, gate electrode layer 117 cannot extend to the non-IGBT region.

Other structures are approximately the same as those of Embodiment 19. Therefore, corresponding portions are denoted by the same reference characters and description thereof is not repeated.

The semiconductor device of the present embodiment can be manufactured through approximately the same steps as Embodiment 18.

In the semiconductor device of the present embodiment, gate electrode layer 117 does not extend over the non-IGBT region. Therefore, the ratio Rn in the on state becomes smaller. However, by making the pitch of trenches sandwiching the non-IGBT region than the pitch of trenches sandwiching IGBT forming region, the ratio of enlarged n⁺ emitter region (n⁺ accumulation region) with respect to ratio Rn becomes smaller, and hence approximately the same ratio Rn as in Embodiment 19 can be obtained.

Meanwhile, at a portion where gate electrode layer 117 extends over the first main surface, interlayer insulating film 119 on gate electrode layer becomes thinner. Therefore, the larger the portion of gate electrode layer 117 extending over the first main surface, the more likely defective breakdown voltage between gate electrode layer 117 and emitter region 121, degrading production yield. Therefore, in view of production yield, it is desirable that gate electrode layer 117 does not extend over the non-IGBT region, and the portion extending over the first main surface should be as small as possible. Therefore, the present embodiment is more effective in industrial application as compared with Embodiment 19.

Embodiment 21

Figure 94:
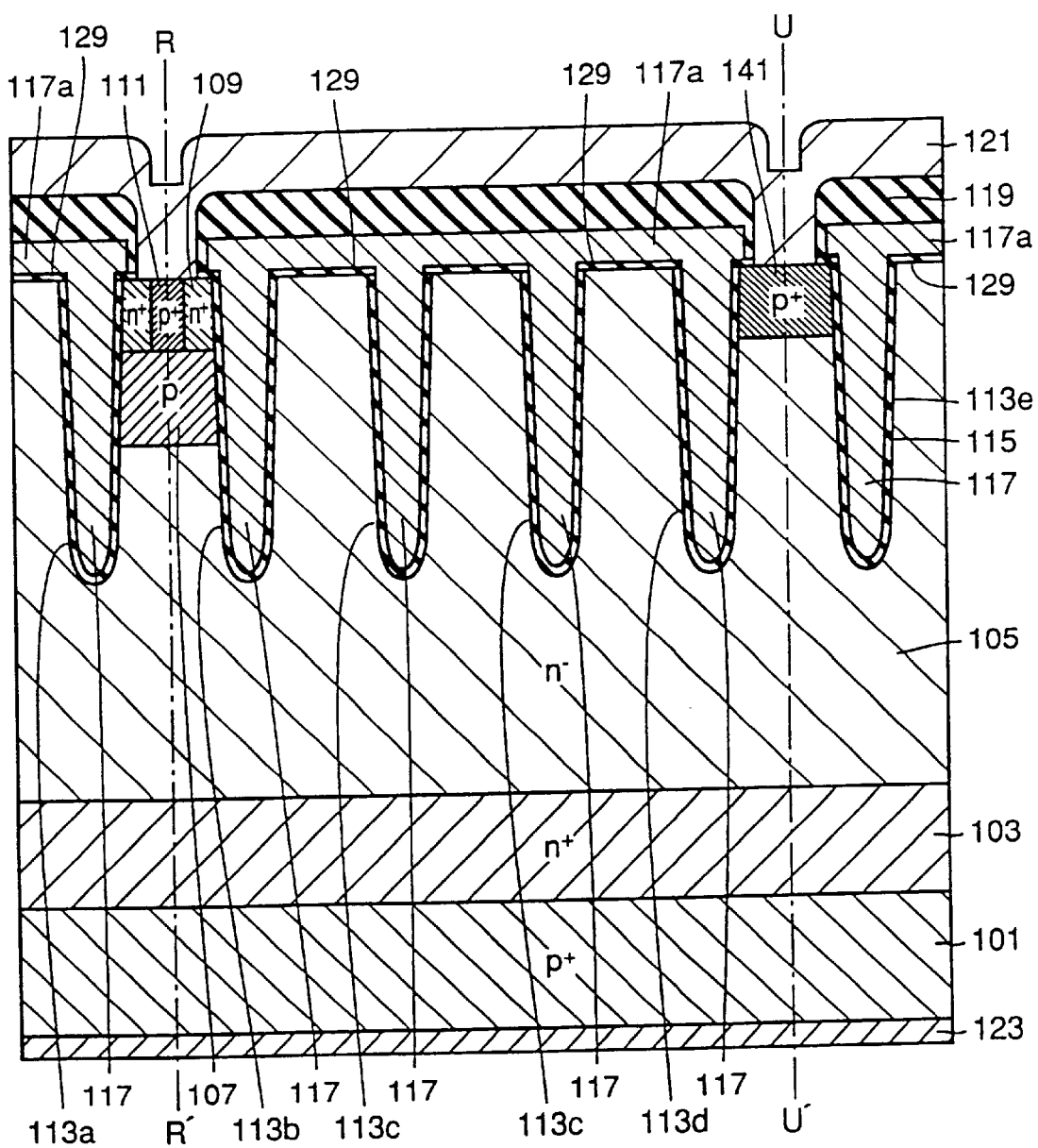
FIG. 94 is a cross sectional view schematically showing a structure of a semiconductor device in accordance with Embodiment 21 of the present invention.

Referring to FIG. 94, as compared with Embodiment 19 shown in FIG. 92, the present embodiment differs in that a p⁺ diverter structure 141 is provided on the first main surface. Between p⁺ diverter region 141 and IGBT forming region, there are a plurality of non-IGBT regions.

The structure of the present embodiment is in line-symmetry with respect to lines R–R' and U–U' of FIG. 94. Therefore, the structure between the lines R–R' and U–U' may be regarded as a unit cell, or, alternatively, a structure between one R–R' line and another R–R' line may be regarded as a unit cell. Here, the latter structure, that is, the structure between one R–R' line and another R–R' line is regarded as the unit cell. Therefore, in a region sandwiched by p⁺ diverter region 141 and IGBT forming region, there are three non-IGBT regions, for example. In other words, there are four trenches 117 between p⁺ diverter region 141 and IGBT forming region.

As in Embodiment 19, the larger the number of non-IGBT region between p⁺ diverter region 141 and IGBT forming region, the closer to 1 the ratio Rn. However, though it depends to some extent on the pitch of trenches and the depth of the trench, if the number of non-IGBT region between p⁺ diverter region 141 and IGBT region exceeds the range of 2 to 4, the ratio Rn begins to saturate.

Further, the n⁺ emitter region (n⁺ accumulation region) extended in the on state is formed only at a close vicinity (in the range of about 100 Å) of the interface between gate oxide film 115 and silicon substrate 105, which is the n⁻ region. Therefore, if the extended n⁺ emitter region (n⁺ accumulation region) becomes too long, the resistance of accumulation region becomes too large to neglect. Therefore, the practical number of non-IGBT region sandwiched between p⁺ diverter region 141 and IGBT region is at most 4. In other words, the number of trenches 117 between p⁺ diverter region 141 and IGBT forming region is at most 5.

In the semiconductor device in accordance with the present embodiment, p⁺ diverter region 141 is provided to assist turn off function when there are a large number of trenches between IGBT forming regions and there are a large number of non-IGBT regions. A p⁺ diverter region 141 has a function of transferring part of the main current at the time of turn off from the IGBT structure portion.

Generally, at the time of turn off of the IGBT, first, the n channel disappears at a gate negative bias state as described above, and finally, hole current is extracted as collector current of pnp transistor, from p+ contact region 111. At this time, if n+ emitter region is enlarged significantly by the MAE structure, the ratio of p+ contact region 111 included in IGBT structure on the cathode side with respect to the unit cell becomes smaller. Therefore, holes are concentrated at p+ collector region 111 at the time of turn off. Therefore, holes are not entirely extracted out from p+ collector region 111, making longer the turn-off time.

The p+ diverter region 141 is provided in order to increase the ratio of p type region occupying the unit cell. More specifically, by the provision of p+ diverter region 141, hole current is extracted as collector current of pnp transistor not only from p+ collector region 111 but also from p+ diverter region 141 at the time of turn off. Therefore, concentration of holes at the p+ collector region 111 can be prevented, and hence the problem of longer turn-off time can be solved.

Further, p+ diverter region 141 also has a function of reducing radiation of current at off state. Therefore, it is more effective to form p+ diverter region 141 at a portion relatively distant from IGBT forming region.

Embodiment 22

Figure 95:
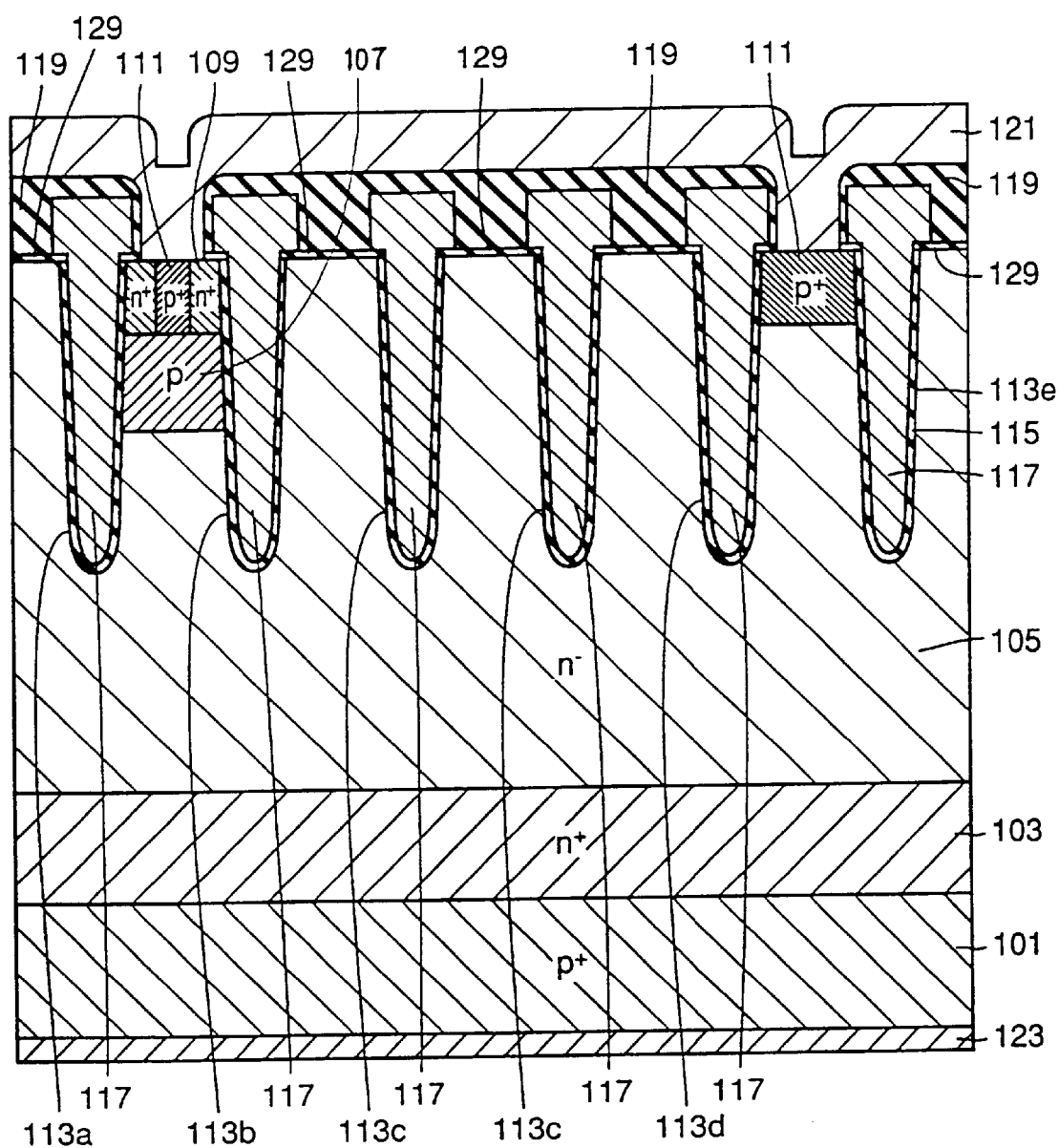
FIG. 95 is a cross sectional view schematically showing a structure of a semiconductor device in accordance with Embodiment 22 of the present invention.
Figure 96:
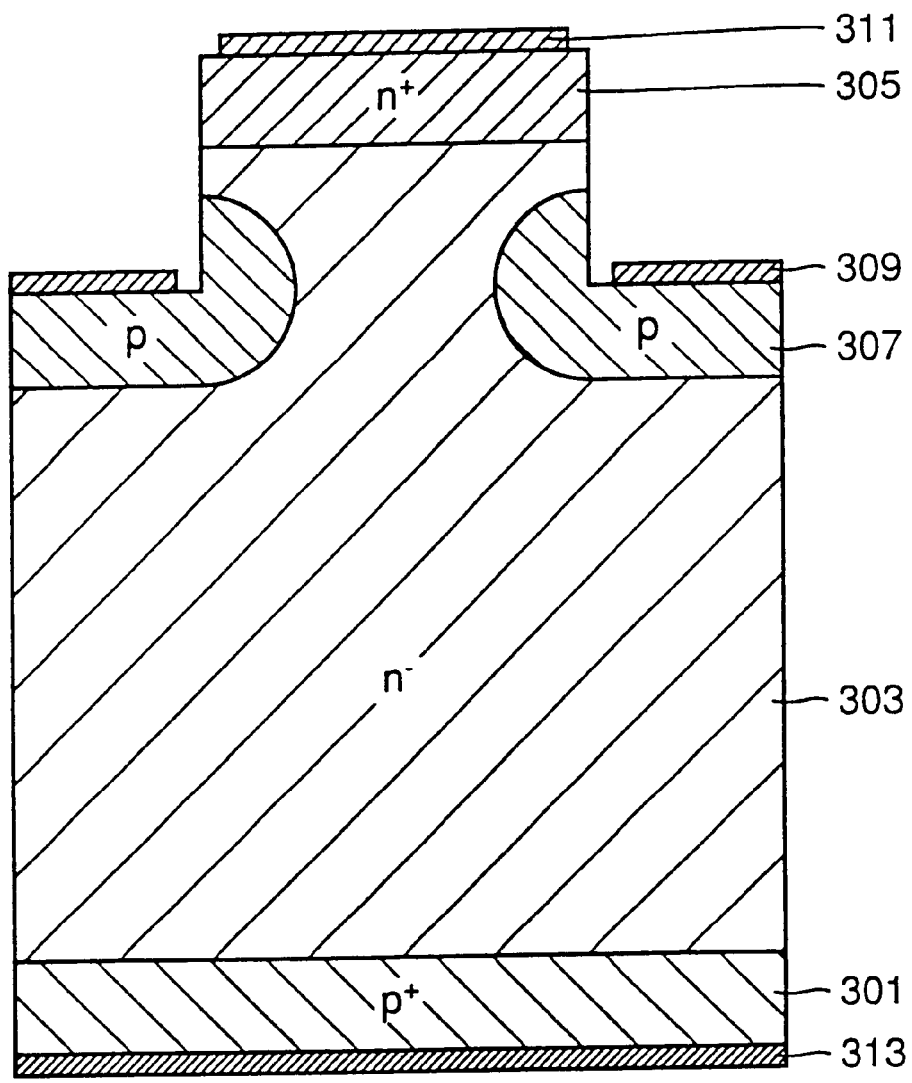
FIG. 96 is a schematic cross sectional view showing a structure of a semiconductor device in accordance with a first prior art example.
Figure 97:
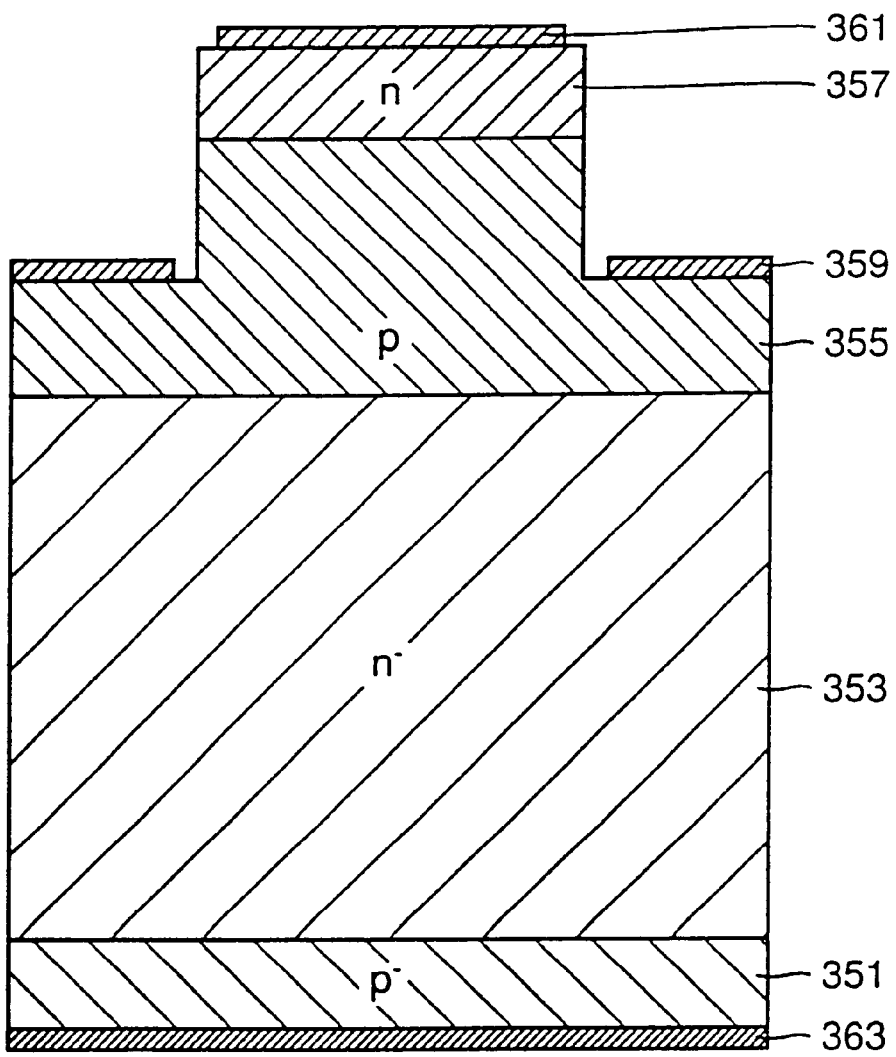
FIG. 97 is a schematic cross sectional view showing a structure of a semiconductor device in accordance with a second prior art example.

Referring to FIG. 95, the structure of the present embodiment differs from the structure of Embodiment 21 shown in FIG. 94 in that gate electrode layer 117 does not extend over non-IGBT region.

Other structures are approximately the same as those of Embodiment 21. Therefore, corresponding portions are denoted by the same reference characters and description thereof is not repeated.

In the semiconductor device in accordance with the present embodiment, as compared with Embodiment 21, the gate electrode layer 117 does not extend over non-IGBT region. Therefore, in the on state, there is not an enlarged n+ emitter region (n+ accumulation region), and hence ratio Rn in the on state becomes smaller. However, by making smaller the pitch of trains sandwiching the non-IGBT region than the pitch of trenches sandwiching IGBT forming region, the ratio of enlarged n+ emitter region (n+ accumulation region) occupying the ratio Rn becomes smaller, and hence approximately the same ratio Rn as in Embodiment 21 can be obtained.

Meanwhile, at a portion where gate electrode layer 117 extends over the first main surface, interlayer insulating film 119 becomes thinner. Therefore, if there is gate electrode layer 117 extending over the non-IGBT region and the ratio of gate electrode layer 117 extending over the first main surface is large, defective breakdown voltage is likely between gate electrode layer 117 and emitter electrode 121, resulting in decreased production yield. Therefore, in view of the production yield, it is preferable that the portion of gate electrode layer 117 covering the first main surface is as small as possible. Therefore, the structure of the present embodiment is more effective in industrial application as compared with the structure of Embodiment 21.

In Embodiments 11 to 22 described above, if the ratio of n+ emitter region 109 is increased, the ratio Rn can be increased, as already described with reference to FIG. 22. Therefore, the on-state voltage Vf at on-state can be reduced. Meanwhile, by increasing the ratio of p+ contact region 111, the tail current at the time of turn off can be reduced, and hence turn off loss Eoff can be reduced.

In Embodiments 11 to 22 above, the width of n+ emitter region 109 is formed to be approximately the same as the width of p+ contact region 111. However, the n+ emitter region 109 and p+ contact region 111 may have different widths in accordance with the requirement of on-state voltage Vf and turn off loss Eoff.

Further, in Embodiments 11 to 22, n+ emitter region 109 and p+ contact region 111 are arranged linearly and alternately. However, as already described with reference to FIGS. 54 to 56, these may be arranged concentrically. When p+ contact region 111 is appropriately arranged concentrically, it becomes possible to extract minority carriers with high uniformity, and hence more quick and stable turn off becomes possible.

In all the embodiments above, the conductivity types, that is, p an n types may be reversed.

In all the embodiments above, n type buffer region 3 and 103 are formed. However, dependent on the rate or desired function of the device, n type buffer region 3 or 103 may be omitted. Further, by changing thickness and impurity concentration of n type buffer region 3, 103, necessary main breakdown voltage, on switching property or the like of the device can be obtained.

Further, in the embodiment described above, an example in which entire surface of p+ collector region 1, 101 is in contact with anode electrode 19, 123 has been described. However, an n type high concentration region may be electrically connected so as to cause short circuit of a portion of semiconductor substrate 5 or n− region 105 with a portion of anode electrode 19, 123. As the n type region is connected to anode region 19 and 123, electrical characteristic of the diode can be varied.

Though the cross sectional shape at the bottom of trench 9 is flat in Embodiments 1 to 9, the cross sectional shape of the bottom of the trench may be rounded, as shown in Embodiments 11 to 14. Alternatively, the cross sectional shape of the bottom of trench 113 or the like shown in Embodiments 11 to 22 may be flat as shown in Embodiments 1 to 10.

In Embodiments 1 to 10 also, semiconductor device superior in on-state voltage Vf can be obtained by making the depth of trench 9 to be within the range of 5 $\mu$m to 15 $\mu$m as in Embodiments 11 to 14.

In each embodiment, if the depth of trench 9 or 113 is at least 10 $\mu$m, the on-state voltage Vf can further be reduced.

For all the embodiments described above, gate electrode layers 13 and 117 are electrically connected to each other at a region not shown.

In each embodiment, gate electrode layer 13, 117 is formed to project upward from the first main surface (cathode surface) of the semiconductor substrate.

This facilitates control of etching to form the gate electrode layer, and it also ensures stable device operation. This point will be described in greater details in the following.

Figure 100:
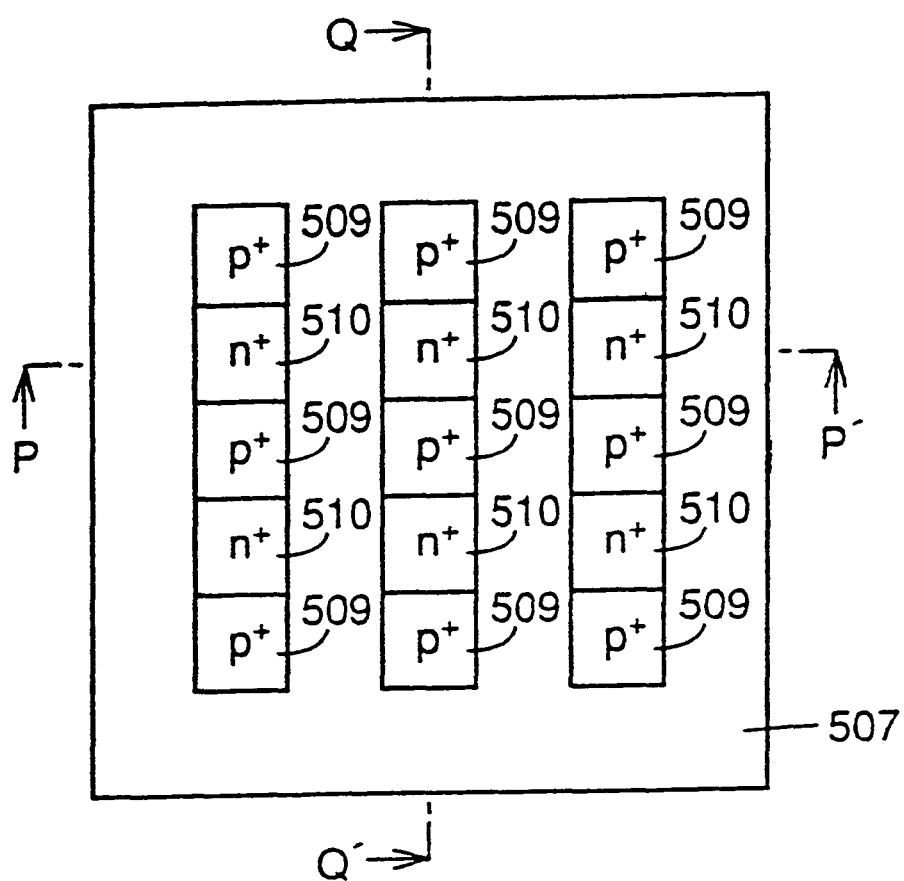
FIG. 100 is a plan view schematically showing a structure of a semiconductor device in accordance with a fourth prior art example.
Figure 101:
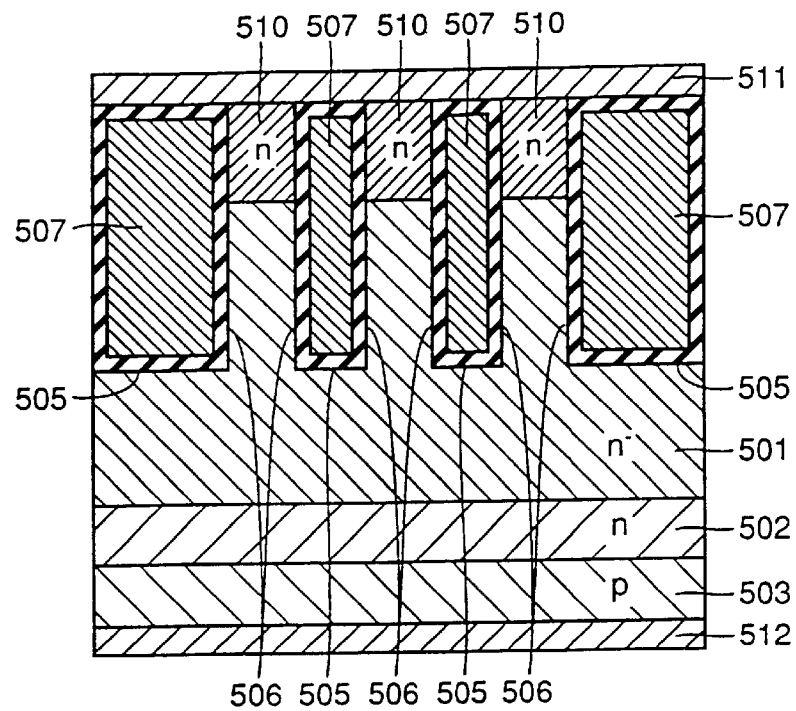
FIG. 101 is a schematic cross sectional view taken along the line P–P' of FIG. 100.
Figure 102:
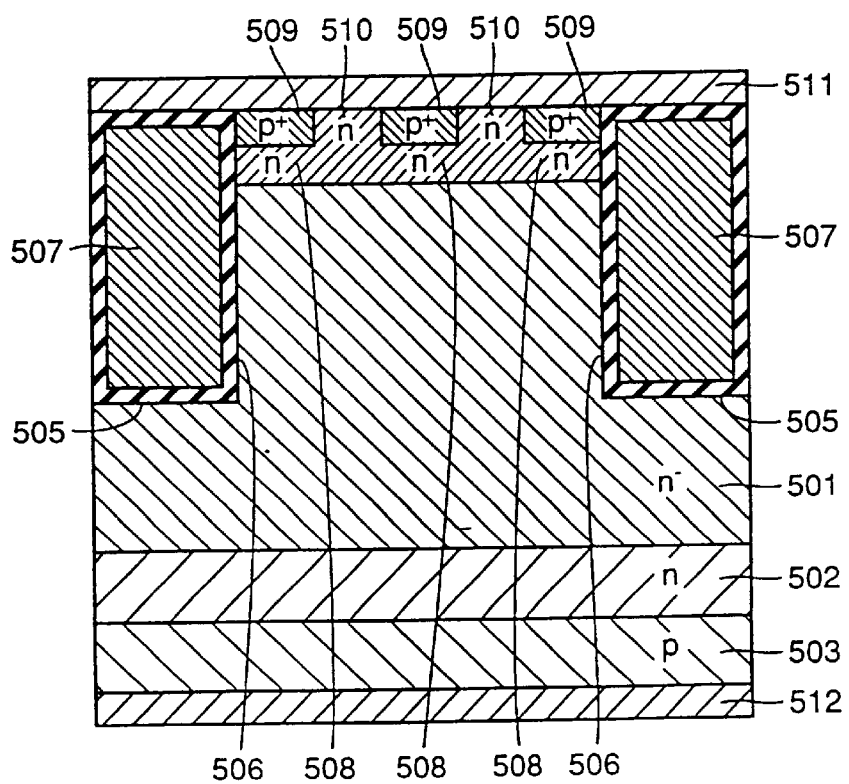
FIG. 102 is a schematic cross sectional view taken along the line Q–Q' of FIG. 100.

In the device structure shown in FIGS. 100 to 102, gate electrode layer 507 is filled in trench 505. In this case, gate electrode layer 507 is completed by once forming conductive layer entirely over the first main surface of the semiconductor substrate to fill the trench 505 and by performing etch back on the entire surface of the conductive layer. However, if the amount of etching is excessive, gate electrode layer 507 comes not to oppose to a part of or whole n type turn off channel layer 508. In such a case, channel is not generated at n type turn off channel layer 508 even when a voltage is applied to gate electrode layer 507, and hence device does not operate.

Meanwhile, in each embodiment, gate electrode 13, 117 have only to be formed to project upward from the first main surface of the semiconductor substrate. This facilitates control of etching. In this case, gate electrode layer 13, 117 completely fills the trench. Therefore, instable operation caused by insufficient generation of the channel can be prevented.

The semiconductor device in the first aspect of the present invention is a device of voltage controlled type in which control electrode layer is arranged opposing to a first impurity region and a low impurity concentration region of the semiconductor substrate with an insulating film interposed. Therefore, as compared with the conventional current control type device, the gate control circuit can be simplified.

Further, the device including a diode structure in accordance with the present invention is a bipolar device, and hence it has low steady loss.

Further, gate electrode layer provides $n^+$ accumulation layer when a positive bias is applied, so that defective cathode area is increased, and hence on-state voltage Vf of the diode can be reduced.

Further, only the first impurity region is formed at the first main surface of the semiconductor substrate between trenches, good on characteristic can be obtained.

Preferably, in the above described aspect, a third impurity region having different conductivity type from the first impurity region is formed at the first main surface of the semiconductor substrate, adjacent to the first impurity region with a trench interposed. This includes turn off speed, reduces turn off loss, and improves switching tolerance and short-circuit tolerance.

By adjusting the ratio of existence of the first and third impurity regions, desired turn off speed and desired on-state voltage Vf can be selected.

In the semiconductor device in accordance with another aspect of the present invention, the gate control type is of voltage controlled type as already described with reference to the first aspect above. Therefore, gate control circuit can be simplified.

Further, since the device is a bipolar device, low steady loss is obtained.

As already described with reference to the first aspect above, an $n^+$ inversion layer can be formed in a p type region and $n^+$ accumulation layer can be formed in the $n^-$ region by applying the positive bias to the control electrode layer. Therefore, the effective cathode area is increased and on-state voltage Vf of the diode can be reduced.

Further, at the main surface of the semiconductor substrate, a fourth impurity region of a different conductivity type from the first impurity region is provided adjacent to the first impurity region with a trench interposed. Therefore, turn off speed can be improved and turn off loss can be reduced.

By adjusting the ratio of existence of the first impurity region and the fourth impurity region, desired turn off speed and desired on-state voltage can be selected.

In the semiconductor device in accordance with a still further aspect, the gate control is of voltage controlled type. Therefore, gate control circuit can be simplified.

Further, since the device is bipolar device, low steady loss can be obtained.

Further, as already described, it is possible to increase effective cathode area by the gate potential to reduce the on-state voltage of the diode.

Further, the third impurity region together with the first impurity region are regarded as effective cathode region.

Therefore, cathode area at on-state can further be increased, and on-state voltage of the diode can further be reduced.

In the above described aspect, preferably, an isolating impurity region is provided to surround the diode or thyristor forming region. Therefore, the capability of electrically isolating the diode or the thyristor from other regions can be improved, and breakdown voltage of the device and stability of the device can be improved.

In the above described aspect, since the depth of the trench from the first main surface is from 5 $\mu$m to 15 $\mu$m, the on-state voltage Vf can further be reduced, and the trench can be readily made by presently used apparatus.

In the semiconductor device in accordance with a still further aspect of the present invention, the ratio Rn is as high as 0.4 to 1.0. Therefore, efficiency in injecting electrons on the cathode side is improved as compared with the prior art, and on-state voltage Vf can be reduced.

In the above described aspect, the depth of the trench is preferably from 5 $\mu$m to 15 $\mu$m, on-state voltage Vf can further be reduced, and the trench can be readily made by presently used apparatuses.

In the above described aspect, preferably, the conductive layer is electrically connected to the control electrode layer, and the control electrode layer opposes to the region of the semiconductor substrate surface between the second and third trenches. Therefore, it becomes possible to increase the effective cathode area, and hence on-state voltage of the diode can further be reduced.

In the above described aspect, preferably, the second ion impurity region of lower concentration is formed at the semiconductor substrate surface between the second and third trenches. Therefore, thyristor operation occurs when the device operates, and hence on voltage is lower when a rated current is conducted.

In the above described aspect, preferably, the fourth impurity region formed below the first impurity region has lower concentration than the first impurity region. Therefore, when a negative voltage is applied to the control electrode layer at the time at off-state, a $p^+$ inversion layer is formed along the side walls of the trench, facilitating extraction of holes. Therefore, switching characteristics, switching withstanding amount and short circuit withstanding amount can be improved.

In the semiconductor device in accordance with a still further aspect of the present invention, the ratio Rn can be approximated by dimensions of various portions. Further, since the approximated ratio Rn can be made to 0.4 or higher, efficiency in injection of electrons on the cathode side can be improved from the prior art example, and on-state voltage Vf can be reduced.

In the method of manufacturing a semiconductor device in accordance with a present invention, at the semiconductor substrate between the second and third trenches, only a low concentration region of the semiconductor substrate is positioned, and the first impurity region is not formed. Therefore, the object of improving device characteristic by increasing the ratio Rn can be attained, and main breakdown voltage can be maintained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a diode structure in which main current flows between first and second main surfaces sandwiching an intrinsic or a first conductivity type semiconductor substrate, comprising:
- a first impurity region of a first conductivity type formed at said first main surface of said semiconductor substrate and having a higher impurity concentration than that of said semiconductor substrate;
- a second impurity region of a second conductivity type formed at said second main surface of said semiconductor substrate, sandwiching with said first impurity region, a low impurity concentration region of said semiconductor substrate; wherein
- said semiconductor substrate has a plurality of trenches extending parallel to each other at said first main surface, each said trench being formed to reach said low impurity concentration region of said semiconductor substrate from said first main surface through said first impurity region; and
- said first impurity region is formed throughout a planar region at said first main surface of said semiconductor substrate between said trenches extending parallel to each other, said planar region encompassing an entire area formed between opposed parallel trenches of said plurality of trenches;

said device further comprising:
- a control electrode layer formed in said trench to be opposed to said first impurity region and said low impurity concentration region of said semiconductor substrate with an insulating film interposed;
- a first electrode layer formed on said first main surface of said semiconductor substrate and electrically connected to said first impurity region; and
- a second electrode layer formed on said second main surface of said semiconductor substrate and electrically connected to said second impurity region.

2. The semiconductor device according to claim 1, wherein
depth of said trench from said first main surface is from 5 $\mu$m to 15 $\mu$m.

3. The semiconductor device according to claim 1, wherein
- said plurality of trenches includes first, second and third trenches extending parallel to each other;
- said first impurity region being formed entirely at said first main surface of said semiconductor substrate between said first and second trenches;
- a third impurity region of the second conductivity type is formed at said first main surface of said semiconductor substrate between said second and third trenches; and
- said third impurity region being made shallower than said trench and electrically connected to said first electrode layer.

4. The semiconductor device according to claim 1, further comprising
an isolation impurity region of the second conductivity type formed at said first main surface of said semiconductor substrate, wherein
at one side of outermost one of said plurality of trenches extending parallel to each other, another one of said trenches is positioned, and at the other side, said isolation impurity region is formed in contact with the outermost trench and deeper than said trench, said isolated impurity region is not directly connected to said first electrode layer.

* * * * *